(12) United States Patent
Yang et al.

(10) Patent No.: US 11,201,691 B2
(45) Date of Patent: Dec. 14, 2021

(54) MUTUAL-INFORMATION BASED RECURSIVE POLAR CODE CONSTRUCTION

(71) Applicant: Qualcomm Incorporated, San Diego, CA (US)

(72) Inventors: Yang Yang, San Diego, CA (US); Jing Jiang, San Diego, CA (US); Gabi Sarkis, San Diego, CA (US); Chao Wei, Beijing (CN); Jian Li, Beijing (CN); Hari Sankar, San Diego, CA (US); Changlong Xu, Beijing (CN); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 16/478,759

(22) PCT Filed: Feb. 22, 2018

(86) PCT No.: PCT/CN2018/076970
§ 371 (c)(1),
(2) Date: Jul. 17, 2019

(87) PCT Pub. No.: WO2018/153343
PCT Pub. Date: Aug. 30, 2018

(65) Prior Publication Data
US 2020/0036476 A1 Jan. 30, 2020

(30) Foreign Application Priority Data

Feb. 22, 2017 (WO) ................ PCT/CN2017/074381

(51) Int. Cl.
*H04L 1/00* (2006.01)
*H04L 5/00* (2006.01)

(52) U.S. Cl.
CPC .......... *H04L 1/0047* (2013.01); *H04L 1/0014* (2013.01); *H04L 1/0057* (2013.01); *H04L 1/0068* (2013.01); *H04L 5/0053* (2013.01)

(58) Field of Classification Search
None
See application file for complete search history.

(56) References Cited

U.S. PATENT DOCUMENTS 9,007,241 B2   4/2015  Alhussien et al.
9,209,832 B2   12/2015 Alhussien et al.
(Continued)

FOREIGN PATENT DOCUMENTS

CN           105493424 A        4/2016

OTHER PUBLICATIONS

Balatsoukas-Stimming A., et al., "Enabling Complexity-Performance Trade-Offs for Successive Cancellation Decoding of Polar Codes", 2014 IEEE International Symposium on Information Theory, IEEE, Jun. 29, 2014, XP032635343, DOI: 10.1109/ISIT.2014.6875380 [retrieved on Aug. 8, 2014], pp. 2977-2981,section III.B.

(Continued)

*Primary Examiner* — Saba Tsegaye
(74) *Attorney, Agent, or Firm* — Holland & Hart LLP

(57) ABSTRACT

Methods, systems, and devices for wireless communication are described. To encode a vector of bits using a polar code, an encoder may allocate information bits of the vector to polarized bit-channels associated with a channel (e.g., a set of unpolarized bit-channels) used for a transmission. In some cases, the polarized bit-channels may be partitioned into groups associated with different values of some associated reliability metric (s). The information bits may be allocated to the polarized bit-channels based on the reliability metrics of the different polarized bit-channels and the (Continued)

overall capacity of a transmission. That is, the bit locations of a transmission may depend on the reliability metrics of different polarized bit-channels and the overall capacity of the transmission. To facilitate puncturing, the overall capacity of the transmission may be adjusted and the unpolarized bit-channels may be partitioned into polarized bit-channels based on the adjusted capacity.

76 Claims, 26 Drawing Sheets

(56) References Cited

U.S. PATENT DOCUMENTS

| | | | | |
|---|---|---|---|---|
| 2014/0108748 | A1* | 4/2014 | Lee | H03M 13/6362 |
| | | | | 711/154 |
| 2015/0333769 | A1 | 11/2015 | Jeong et al. | |
| 2016/0285479 | A1* | 9/2016 | El-Khamy | H03M 13/616 |
| 2017/0181104 | A1* | 6/2017 | Jang | H04L 43/16 |

OTHER PUBLICATIONS

Huawei et al., "Analysis of the Sequence of Polar Codes" 3GPP Draft, R1-1708157, 3GPP TSG-RAN WG1 Meeting #89, Analysis of the Sequence for Polar Codes, 3RD Generation Partnership Project (3GPP), Mobile Competence Centre, 650, Route Des Lucioles, F-06921 Sophia-Antipolis Cedex, France, vol. RAN WG1, No. Hangzhou, China, 20170515-20170519, May 14, 2017 (May 14, 2017), 9 Pages, XP051273353, Retrieved from the Internet: URL: http://www.3gpp.org/ftp/Meetings_3GPP_SYNC/RAN1/Docs/[retrieved on May 14, 2017], Section 2. 3.

Niu K., et al., "Polar Codes: Primary Concepts and Practical Decoding Algorithms", IEEE Communications Magazine, IEEE Service Center, Piscataway, US, vol. 52, No. 7, Jul. 2014, pp. 192-203, XP011553413, ISSN: 0163-6804, DOI: 10.1109/MCOM.2014.6852102 [retrieved on Jul. 10, 2014], sections "channel polarization", "channel selection" and figure 1.

Qualcomm Incorporated: "Frank Polar Construction for NR Control Channel and Performance Comparison", 3GPP TSG-RAN WG1 #89, 3GPP Draft; R1-1709178 Frank Polar Construction for NR Control Channel and Performance Comparison, 3rd Generation Partnership Project (3GPP), Mobile Competence Centre; 650, Route Des Lucioles; F-069, vol. RAN WG1, No. Hangzhou; 20170515-20170519, May 17, 2017, 27 Pages, XP051285058, Retrieved from the Internet: URL: http://www.3gpp.org/ftp/tsg_ran/WG1_RL1/TSGR1_89/Docs/ [retrieved on May 17, 2017].

Samsung: "Discussion on Flexible Polar Codes", 3GPP Draft; R1-166773, 3GPP TSG RAN WG1 #86,Discussion_on_Flexible_Polar_Codes, 3rd Generation Partnership Project (3GPP), Mobile Competence Centre; 650, Route Des Lucioles; F-06921 Sophia-Antipolis Cedex; France, vol. RAN WG1, No. Gothenbourg, Sweden; 20160822-20160826 Aug. 13, 2016, XP051142464, Retrieved from the Internet: URL:http://www.3gpp.org/ftp/tsg_ran/WG1_RL1/TSGR1_86/Docs/ [retrieved on Aug. 13, 2016], 4 pages,section "on-the-fly code construction"; p. 2.

Supplementary European Search Report—EP18757463—Search Authority—Munich—dated Oct. 29, 2020.

He G., et al., "β-expansion: A Theoretical Framework for Fast and Recursive Construction of Polar Codes", IEEE Global Communications Conference on Information Theory, Apr. 19, 2017, 7 Pages.

International Search Report and Written Opinion—PCT/CN2017/074381—ISA/EPO—dated Nov. 14, 2017.

International Search Report and Written Opinion—PCT/CN2018/076970—ISA/EPO—dated May 11, 2018.

Mori R., et al., "Performance and Construction of Polar Codes on Symmetric Binary-Input Memoryless Channels", IEEE International Symposium on Information Theory, URL: http://www.arxiv.org/, Cornell University Library. 201, Olin Library Cornell University Ithaca, NY 14853, May 23, 2009, 5 Pages, XP080357263, DOI: 10.1109/ISIT.2009.5205857, Section III.

Tal I., et al., "How to Construct Polar Codes", IEEE Transactions on Information Theory, Apr. 10, 2013, pp. 1-21.

Tal I., et al., "List Decoding of Polar Codes", IEEE Transactions on Information Theory, May 31, 2012, pp. 1-11.

Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.

Qualcomm Incorporated: "Frank Polar Construction: Nested Extension Design of Polar Codes Based on Mutual Information", 3GPP TSG-RAN WG1 #88b, 3GPP Draft, R1-1706130 Frank Polar Construction Nested Extension Design of Polar Codes Based on Mutual Information , 3rd Generation Partnership Project (3GPP), Mobile Competence Centre, 650, Route Des, vol. Ran WG1, No. Spokane, USA, 20170403-20170407, Mar. 30, 2017 (Mar. 30, 2017), 24 Pages, XP051252420, Retrieved from the Internet: URL: http://www.3gpp.org/ftp/tsg_ran/WG1_RL1/TSGR1_88b/Docs/ [retrieved on Mar. 30, 2017], Section 3.3, Appendix A, Appendix B.

Taiwan Search Report—TW107105939—TIPO—dated Jul. 28, 2021.

\* cited by examiner

MUTUAL-INFORMATION BASED RECURSIVE POLAR CODE CONSTRUCTION

CROSS REFERENCES

The present application is a 371 national phase filing of International Application No. PCT/CN2018/076970 to Yang et al., entitled "MUTUAL-INFORMATION BASED RECURSIVE POLAR CODE CONSTRUCTION", filed Feb. 22, 2018, which claims priority to International Patent Application No. PCT/CN2017/074381 to Yang et al., entitled "MUTUAL-INFORMATION BASED RECURSIVE POLAR CODE CONSTRUCTION", filed Feb. 22, 2017, each of which is assigned to the assignee hereof and incorporated by reference herein in its entirety.

BACKGROUND

The following relates generally to wireless communication and more specifically to mutual-information based recursive polar code construction.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. Some coding techniques, such as polar coding, use reliability metrics during encoding and decoding such that information bits may be loaded on channel instances (of the encoder or decoder) that are associated with favorable (e.g., high) reliability metrics. Selection of channel instances used for information bits may present challenges when implemented in a system where a flexible bit rate for processing bits for a transmission is desired.

SUMMARY

In some cases, a codeword encoded using a polar code may be punctured. For example, to achieve a given code rate with an encoder having lengths determined by a power function (e.g., $2^N$), more bits may be generated from encoding than are transmitted for the given code rate. A punctured bit may be a bit for which no information is transmitted (e.g., the bit is skipped), or a bit that is used for another purpose (e.g., transmission of a reference signal, etc.). Puncturing may include, for example, shortening puncturing (or known bit puncturing), in which a set of most significant bits (MSBs) or later-generated bits of a codeword are punctured, and block puncturing (or unknown bit puncturing), in which a set of least significant bits (LSBs) or earlier-generated bits of a codeword are punctured. The present disclosure describes techniques for encoding and decoding a codeword using a polar code when one or more bits are punctured.

A method for wireless communication is described. The method may include receiving a codeword over a wireless channel, the codeword being encoded using a polar code, identifying a set of punctured bit locations in the received codeword, identifying a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and decoding the received codeword according to the polar code to obtain an information bit vector at the set of bit locations.

An apparatus for wireless communication is described. The apparatus may include means for receiving a codeword over a wireless channel, the codeword being encoded using a polar code, means for identifying a set of punctured bit locations in the received codeword, means for identifying a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, the codeword being encoded using a polar code, identify a set of punctured bit locations in the received codeword, identify a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and decode the received codeword according to the polar code to obtain an information bit vector at the set of bit locations.

A non-transitory computer readable medium for wireless communication is described. The non-transitory computer-readable medium may include instructions operable to cause a processor to receive a codeword over a wireless channel, the codeword being encoded using a polar code, identify a set of punctured bit locations in the received codeword, identify a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and decode the received codeword according to the polar code to obtain an information bit vector at the set of bit locations.

In some examples of the method, apparatus, and non-transitory computer-readable medium described above, the set of bit locations of the polar code used for information bits for the encoding is identified based on a table that indicates information bit allocations for different numbers of coded bits, different numbers of information bits, different numbers of punctured bits, different types of puncturing, or a combination thereof. In some examples of the method, apparatus, and non-transitory computer-readable medium described above, the information bits assigned to the bit-channel partitions are assigned to bit-channels of the bit-channel partitions in a predetermined order. In some examples of the method, apparatus, and non-transitory computer-readable medium described above, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

In some examples of the method, apparatus, and non-transitory computer-readable medium described above, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof. In some examples of the method, apparatus, and non-transitory computer-readable medium described above, the information bits assigned to different bit-channel partitions are assigned to bit-channels of the different bit-channel partitions in a same order.

In some examples of the method, apparatus, and non-transitory computer-readable medium described above, the information bits assigned to different bit-channel partitions are assigned to bit-channels of the different bit-channel partitions in a different order. In some examples of the method, apparatus, and non-transitory computer-readable medium described above, the information bits assigned to different bit-channel partitions are assigned to bit-channels of the different bit-channel partitions based on a reliability order of bit-channels in each of the bit-channel partitions. In some examples of the method, apparatus, and non-transitory computer-readable medium described above, the reliability order of the bit-channels in each of the bit-channel partitions is derived from a reliability order of all bit-channels in the bit-channel partitions.

In some examples of the method, apparatus, and non-transitory computer-readable medium described above, the target mutual information may be determined as the number of the information bits divided by the number of un-punctured bit locations in the received codeword. In some examples of the method, apparatus, and non-transitory computer-readable medium described above, the set of punctured bit locations corresponds to non-shortening based puncturing of the received codeword. In some examples of the method, apparatus, and non-transitory computer-readable medium described above, for the first polarization stage, a capacity of each corresponding bit-channel of the set of punctured bit locations may be set to zero. In some examples of the method, apparatus, and non-transitory computer-readable medium described above, the non-shortening based puncturing includes block puncturing.

In some examples of the method, apparatus, and non-transitory computer-readable medium described above, for the at least one stage of polarization, a capacity of each bit-channel of each of the bit-channel partitions may be determined based on bit-channel capacities of input bit-channels from the previous stage of polarization and the mutual information transfer function. In some examples of the method, apparatus, and non-transitory computer-readable medium described above, the set of punctured bit locations corresponds to shortening-based puncturing of the received codeword, and a number of the punctured bit locations may be added to the number of the information bits for assigning to the bit-channel partitions for a first recursive partitioning.

In some examples of the method, apparatus, and non-transitory computer-readable medium described above, for the first polarization stage, a capacity of each corresponding bit-channel of the set of punctured bit locations may be set to unity. In some examples of the method, apparatus, and non-transitory computer-readable medium described above, the identifying the set of bit locations includes shortening a preliminary set of bit locations determined as a result of the recursive partitioning of the bit-channels by the number of the punctured bit locations. In some examples of the method, apparatus, and non-transitory computer-readable medium described above, the mutual information transfer function may be based on a binary erasure channel (BEC) function and a correction term.

In some examples of the method, apparatus, and non-transitory computer-readable medium described above, the received codeword comprises a first set of codeword bits and the set of bit locations comprises a first set of bit locations. Some examples of the method, apparatus, and non-transitory computer-readable medium described above may further include processes, features, means, or instructions for transmitting an indication that the decoding of the received codeword was unsuccessful and receiving a second set of codeword bits over the wireless channel in response to transmitting the indication that the decoding of the received codeword was unsuccessful. The second set of codeword bits may be, for example, a subset of a combined codeword including the first set of codeword bits and the second set of codeword bits, where the combined codeword is encoded using a second polar code having a code length longer than the polar code (i.e., the polar code used to encode the first set of codeword bits). Some examples of the method, apparatus, and non-transitory computer-readable medium described above may further include processes, features, means, or instructions for identifying a second set of bit locations used for the information bits for encoding of the second set of codeword bits, where, for the encoding of the second set of codeword bits (e.g., encoding of the combined codeword), at least one of the information bits is copied from a bit location of the second set of bit locations to a bit location of the first set of bit locations that is non-overlapping with the second set of bit locations, and decoding the combined codeword according to the second polar code to obtain the information bit vector at the first set of bit locations and the second set of bit locations, where the information bit allocations for the first and second transmissions are determined by initializing the input mutual information of respective polar codes to the corresponding channel capacity of the underlying code. The information bit locations for both transmissions may be different but may overlap in many bit locations.

A method for wireless communication is described. The method may include receiving a codeword that is encoded using a polar code, identifying a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term, and processing the received codeword according to the polar code to obtain an information bit vector at the set of bit locations.

An apparatus for wireless communication is described. The apparatus may include means for receiving a codeword that is encoded using a polar code, means for identifying a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term, and means for processing the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword that is encoded using a polar code, identify a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term, and process the received codeword according to the polar code to obtain an information bit vector at the set of bit locations.

A non-transitory computer readable medium for wireless communication is described. The non-transitory computer-readable medium may include instructions operable to cause a processor to receive a codeword that is encoded using a polar code, identify a set of bit locations of the polar code used for information bits for the encoding, where the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term, and process the received codeword according to the polar code to obtain an information bit vector at the set of bit locations.

In some examples of the method, apparatus, and non-transitory computer-readable medium described above, the set of bit locations of the polar code used for information bits for the encoding is identified based on a table that indicates information bit allocations for different numbers of coded bits, different numbers of information bits, different numbers of punctured bits, different types of puncturing, or a combination thereof. In some examples of the method, apparatus, and non-transitory computer-readable medium described above, the information bits assigned to the bit-channel partitions are assigned to bit-channels of the bit-channel partitions in a predetermined order. In some examples of the method, apparatus, and non-transitory computer-readable medium described above, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

In some examples of the method, apparatus, and non-transitory computer-readable medium described above, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof. In some examples of the method, apparatus, and non-transitory computer-readable medium described above, the information bits assigned to different bit-channel partitions are assigned to bit-channels of the different bit-channel partitions in a same order.

In some examples of the method, apparatus, and non-transitory computer-readable medium described above, the information bits assigned to different bit-channel partitions are assigned to bit-channels of the different bit-channel partitions in a different order. In some examples of the method, apparatus, and non-transitory computer-readable medium described above, the information bits assigned to different bit-channel partitions are assigned to bit-channels of the different bit-channel partitions based on a reliability order of bit-channels in each of the bit-channel partitions. In some examples of the method, apparatus, and non-transitory computer-readable medium described above, the reliability order of the bit-channels in each of the bit-channel partitions is derived from a reliability order of all bit-channels in the bit-channel partitions.

In some examples of the method, apparatus, and non-transitory computer-readable medium described above, the correction term may be based on a function of a bit-channel capacity of the at least one stage of polarization and a capacity imbalance factor. In some examples of the method, apparatus, and non-transitory computer-readable medium described above, the correction term includes an offset factor applied to the bit-channel capacity. In some examples of the method, apparatus, and non-transitory computer-readable medium described above, the correction term includes a scaling factor applied to the offset bit-channel capacity. In some examples of the method, apparatus, and non-transitory computer-readable medium described above, the correction term includes an offset applied to the scaled and offset bit-channel capacity.

In some examples of the method, apparatus, and non-transitory computer-readable medium described above, the received codeword comprises a first set of codeword bits and the set of bit locations comprises a first set of bit locations. Some examples of the method, apparatus, and non-transitory computer-readable medium described above may further include processes, features, means, or instructions for transmitting an indication that the decoding of the received codeword was unsuccessful and receiving a second set of codeword bits over the wireless channel in response to transmitting the indication that the decoding of the received codeword was unsuccessful. The second set of codeword bits may be, for example, a subset of a combined codeword including the first set of codeword bits and the second set of codeword bits, where the combined codeword is encoded using a second polar code having a code length longer than the polar code (i.e., the polar code used to encode the first set of codeword bits). Some examples of the method, apparatus, and non-transitory computer-readable medium described above may further include processes, features, means, or instructions for identifying a second set of bit locations used for the information bits for encoding of the second set of codeword bits, where, for the encoding of the second set of codeword bits (e.g., encoding of the combined codeword), at least one of the information bits is copied from a bit location of the second set of bit locations to a bit location of the first set of bit locations that is non-overlapping with the second set of bit locations, and decoding the combined codeword according to the second polar code to obtain the information bit vector at the first set of bit locations and the second set of bit locations, where the information bit allocations for the first and second transmissions are determined by initializing the input mutual information of respective polar codes to the corresponding channel capacity of the underlying code. The information bit locations for both transmissions may be different but may overlap in many bit locations.

A method for wireless communication is described. The method may include identifying a set of punctured bit locations for transmission of a codeword, the codeword to be generated from an information bit vector using a polar code, identifying a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, encoding the information bit vector mapped to the set of bit locations using the polar code to obtain the codeword, and transmitting the codeword over a wireless channel, where the transmitting includes puncturing the codeword at the set of punctured bit locations.

An apparatus for wireless communication is described. The apparatus may include means for identifying a set of punctured bit locations for transmission of a codeword, the codeword to be generated from an information bit vector using a polar code, means for identifying a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, means for encoding the information bit vector mapped to the set of bit locations using the polar code to obtain the codeword, and means for transmitting the codeword over a wireless channel, where the transmitting includes puncturing the codeword at the set of punctured bit locations.

Another apparatus for wireless communication is described. The apparatus may include a processor, memory in electronic communication with the processor, and instructions stored in the memory. The instructions may be operable to cause the processor to identify a set of punctured bit locations for transmission of a codeword, the codeword to be generated from an information bit vector using a polar code, identify a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, encode the information bit vector mapped to the set of bit locations using the polar code to obtain the codeword, and transmit the codeword over a wireless channel, where the transmitting includes puncturing the codeword at the set of punctured bit locations.

A non-transitory computer readable medium for wireless communication is described. The non-transitory computer-readable medium may include instructions operable to cause a processor to identify a set of punctured bit locations for transmission of a codeword, the codeword to be generated from an information bit vector using a polar code, identify a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, encode the information bit vector mapped to the set of bit locations using the polar code to obtain the codeword, and transmit the codeword over a wireless channel, where the transmitting includes puncturing the codeword at the set of punctured bit locations.

In some examples of the method, apparatus, and non-transitory computer-readable medium described above, the set of bit locations of the polar code used for information bits for the encoding is identified based on a table that indicates information bit allocations for different numbers of coded bits, different numbers of information bits, different numbers of punctured bits, different types of puncturing, or a combination thereof. In some examples of the method, apparatus, and non-transitory computer-readable medium described above, the information bits assigned to the bit-channel partitions are assigned to bit-channels of the bit-channel partitions in a predetermined order. In some examples of the method, apparatus, and non-transitory computer-readable medium described above, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

In some examples of the method, apparatus, and non-transitory computer-readable medium described above, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof. In some examples of the method, apparatus, and non-transitory computer-readable medium described above, the information bits assigned to different bit-channel partitions are assigned to bit-channels of the different bit-channel partitions in a same order.

In some examples of the method, apparatus, and non-transitory computer-readable medium described above, the information bits assigned to different bit-channel partitions are assigned to bit-channels of the different bit-channel partitions in a different order. In some examples of the method, apparatus, and non-transitory computer-readable medium described above, the information bits assigned to different bit-channel partitions are assigned to bit-channels of the different bit-channel partitions based on a reliability order of bit-channels in each of the bit-channel partitions. In some examples of the method, apparatus, and non-transitory computer-readable medium described above, the reliability order of the bit-channels in each of the bit-channel partitions is derived from a reliability order of all bit-channels in the bit-channel partitions.

In some examples of the method, apparatus, and non-transitory computer-readable medium described above, the target mutual information may be determined as the number of the information bits divided by the number of un-punctured bit locations in the received codeword. In some examples of the method, apparatus, and non-transitory computer-readable medium described above, the set of punctured bit locations corresponds to non-shortening based puncturing of the received codeword. In some examples of the method, apparatus, and non-transitory computer-readable medium described above, the non-shortening based puncturing includes block puncturing.

In some examples of the method, apparatus, and non-transitory computer-readable medium described above, for the first polarization stage, a capacity of each corresponding bit-channel of the set of punctured bit locations may be set to zero. In some examples of the method, apparatus, and non-transitory computer-readable medium described above, for the at least one stage of polarization, a capacity of each bit-channel of each of the bit-channel partitions may be determined based on bit-channel capacities of input bit-channels from the previous stage of polarization and the mutual information transfer function.

In some examples of the method, apparatus, and non-transitory computer-readable medium described above, the set of punctured bit locations corresponds to shortening-based puncturing of the received codeword, and a number of the punctured bit locations may be added to the number of information bits for assigning to the bit-channel partitions for a first recursive partitioning. In some examples of the method, apparatus, and non-transitory computer-readable medium described above, for the first polarization stage, a capacity of each corresponding bit-channel of the set of punctured bit locations may be set to unity.

In some examples of the method, apparatus, and non-transitory computer-readable medium described above, the identifying the set of bit locations includes shortening a preliminary set of bit locations determined as a result of the recursive partitioning of the bit-channels by the number of the punctured bit locations. In some examples of the method, apparatus, and non-transitory computer-readable medium described above, the mutual information transfer function may be based on a BEC function and, additionally and optionally, a correction term.

In some examples of the method, apparatus, and non-transitory computer-readable medium described above, the codeword comprises a first set of codeword bits and the set of bit locations comprises a first set of bit locations. Some examples of the method, apparatus, and non-transitory computer-readable medium described above may further include processes, features, means, or instructions for receiving an indication that decoding of the codeword was unsuccessful and identifying a second set of bit locations to be used for the information bits for encoding of a second set of codeword bits. The second set of codeword bits may be, for example, a subset of a combined codeword including the first set of codeword bits and the second set of codeword bits, where the combined codeword is encoded using a second polar code having a code length longer than the polar code (i.e., the polar code used to encode the first set of codeword bits). In some examples of the method, apparatus, and non-transitory computer-readable medium described above, for the encoding of the second set of codeword bits (e.g., encoding of the combined codeword), at least one of the information bits is copied from a bit location of the second set of bit locations to a bit location of the first set of bit locations that is non-overlapping with the second set of bit locations. Some examples of the method, apparatus, and non-transitory computer-readable medium described above may further include processes, features, means, or instructions for transmitting the second set of codeword bits over the wireless channel in response to receiving the indication that the decoding of the codeword was unsuccessful, where the information hit allocations for the first and second transmissions are determined by initializing the input mutual information of respective polar codes to the corresponding channel capacity of the underlying code. The information bit locations for both transmissions may be different but may overlap in many bit locations.

A method for wireless communication is described. The method may include identifying an information bit vector for encoding using a polar code, identifying a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term, encoding the information bit vector mapped to the set of bit locations using the polar code to obtain a codeword, and transmitting the codeword over a wireless channel.

An apparatus for wireless communication is described. The apparatus may include means for identifying an information bit vector for encoding using a polar code, means for identifying a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term, means for encoding the information bit vector mapped to the set of bit locations using the polar code to obtain a codeword, and means for transmitting the codeword over a wireless channel.

Another apparatus for wireless communication is described. The apparatus may include a processor, memory in electronic communication with the processor, and instructions stored in the memory. The instructions may be operable to cause the processor to identify an information bit vector for encoding using a polar code, identify a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term, encode the information bit vector mapped to the set of bit locations using the polar code to obtain a codeword, and transmit the codeword over a wireless channel.

A non-transitory computer readable medium for wireless communication is described. The non-transitory computer-readable medium may include instructions operable to cause a processor to identify an information bit vector for encoding using a polar code, identify a set of bit locations of the polar code to be used for information bits of the information bit vector, where the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term, encode the information bit vector mapped to the set of bit locations using the polar code to obtain a codeword, and transmit the codeword over a wireless channel.

In some examples of the method, apparatus, and non-transitory computer-readable medium described above, the set of bit locations of the polar code used for information bits for the encoding is identified based on a table that indicates sets of bit locations of polar codes for different numbers of coded bits, different numbers of information bits, different numbers of punctured bits, different types of puncturing, or a combination thereof. In some examples of the method, apparatus, and non-transitory computer-readable medium described above, the information bits assigned to the bit-channel partitions are assigned to bit-channels of the bit-channel partitions in a predetermined order. In some examples of the method, apparatus, and non-transitory computer-readable medium described above, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

In some examples of the method, apparatus, and non-transitory computer-readable medium described above, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof. In some examples of the method, apparatus, and non-transitory computer-readable medium described above, the information bits assigned to different bit-channel partitions are assigned to bit-channels of the different bit-channel partitions in a same order.

In some examples of the method, apparatus, and non-transitory computer-readable medium described above, the information bits assigned to different bit-channel partitions are assigned to bit-channels of the different bit-channel partitions in a different order. In some examples of the method, apparatus, and non-transitory computer-readable medium described above, the information bits assigned to different bit-channel partitions are assigned to bit-channels of the different bit-channel partitions based on a reliability order of bit-channels in each of the bit-channel partitions. In some examples of the method, apparatus, and non-transitory computer-readable medium described above, the reliability order of the bit-channels in each of the bit-channel partitions is derived from a reliability order of all bit-channels in the bit-channel partitions.

In some examples of the method, apparatus, and non-transitory computer-readable medium described above, the correction term may be based on a function of a bit-channel capacity of the at least one stage of polarization and a capacity imbalance factor. In some examples of the method, apparatus, and non-transitory computer-readable medium described above, the correction term includes an offset factor applied to the bit-channel capacity. In some examples of the method, apparatus, and non-transitory computer-readable medium described above, the correction term includes a scaling factor applied to the offset bit-channel capacity. In some examples of the method, apparatus, and non-transitory computer-readable medium described above, the correction term includes an offset applied to the scaled and offset bit-channel capacity.

In some examples of the method, apparatus, and non-transitory computer-readable medium described above, the codeword comprises a first set of codeword bits and the set of bit locations comprises a first set of bit locations. Some examples of the method, apparatus, and non-transitory computer-readable medium described above may further include processes, features, means, or instructions for receiving an indication that decoding of the codeword was unsuccessful and identifying a second set of bit locations to be used for the information bits for encoding of a second set of codeword bits. The second set of codeword bits may be, for example, a subset of a combined codeword including the first set of codeword bits and the second set of codeword bits, where the combined codeword is encoded using a second polar code having a code length longer than the polar code (i.e., the polar code used to encode the first set of codeword bits). In some examples of the method, apparatus, and non-transitory computer-readable medium described above, for the encoding of the second set of codeword bits (e.g., encoding of the combined codeword), at least one of the information bits is copied from a bit location of the second set of bit locations to a bit location of the first set of bit locations that is non-overlapping with the second set of bit locations. Some examples of the method, apparatus, and non-transitory computer-readable medium described above may further include processes, features, means, or instructions for transmitting the second set of codeword bits over the wireless channel in response to receiving the indication that the decoding of the codeword was unsuccessful, where the information bit allocations for the first and second transmissions are determined by initializing the input mutual information of respective polar codes to the corresponding channel capacity of the underlying code. The information bit locations for both transmissions may be different but may overlap in many bit locations.

DETAILED DESCRIPTION

Figure 1:
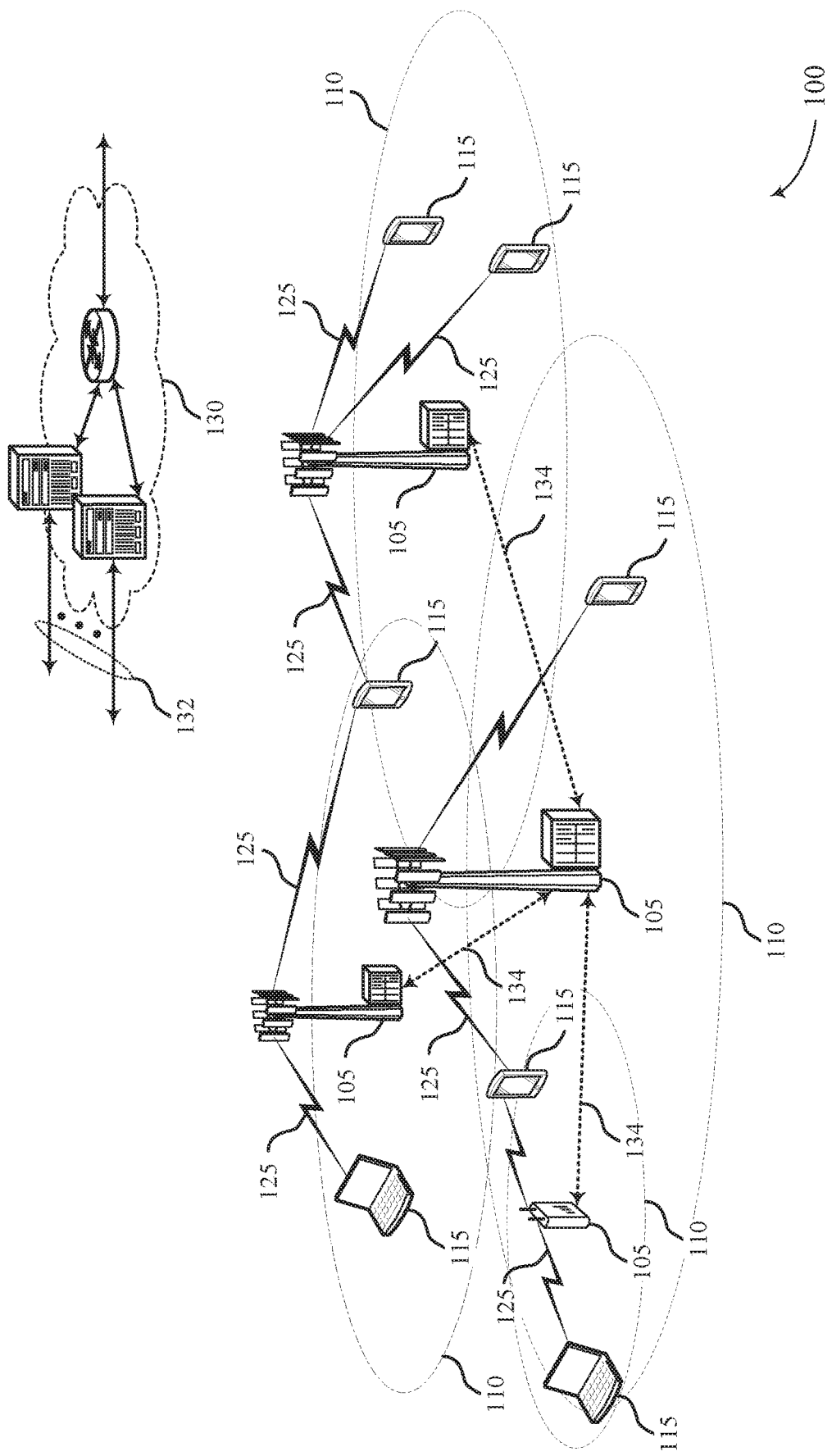
FIG. 1 illustrates an example of a wireless communications system that supports a mutual-information based recursive polar code construction in accordance with various aspects of the present disclosure.

Techniques are described for enhanced performance of polar codes where puncturing is employed. A base station may encode a set of bits for a transmission to a UE using a polar code. The number of bits generated by a polar code encoder may be determined based on a power function (e.g., $2^N$). Thus, in order to achieve a given code rate or codeword size for a transmission, more bits may be generated by the polar code than are transmitted for the given code rate or codeword size. In such cases, the base station may puncture the encoded bits to satisfy the given code rate. That is, the base station may rate match the output codeword of the polar code encoder to a number of desired bits for the given code rate by not transmitting some of the encoded bits. Because the polar code construction may not account for the punctured bits, the gains associated with using the polar code may be compromised, which may result in reduced throughput in a wireless communications system.

Some wireless communications systems may support efficient techniques for accommodating puncturing in a polar coding scheme. An encoder may identify target mutual information for a transmission and may polarize bit-channels based on the identified target mutual information. The resulting polarized bit-channels may then be partitioned into groups, each group associated with a specific capacity (or mutual information) that corresponds to the reliability of the bit-channels in the group. The polarization of the bit-channels and the partitioning of the bit-channels into different groups may be done recursively until the block size of a group of polarized bit-channels is below a certain threshold or the error due to dividing an integer number of bit locations is above a certain threshold. The information bits may then be distributed to the polarized bit-channels based on the allocations (e.g., distributed within each block according to a polarization weight or a predetermined bit-channel ranking within each block).

However, if a set of bits is punctured for the transmission, the capacity (or target mutual information) of the unpolarized bit-channels may be different (e.g., some unpolarized bit-channels may have zero capacity because they are not transmitted in the punctured codeword). As described herein, an encoder may employ a polar coding scheme that accounts for differences in capacity of the unpolarized bit-channels based on the number of bits punctured for a transmission. Specifically, initial target mutual information and recursive partitioning may be adjusted for the puncturing. For example, as the polarized bit-channels are recursively partitioned into groups, the effect of capacity differences due to punctured bits is propagated to each set of partitioned bit-channels. Thus, the number of information bits allocated to each partitioned bit-channel group accounts for the punctured bit-channels. As such, the adjusted initial capacity (or number of un-punctured bits) may be distributed to the different groups of polarized bit-channels appropriately, and the information bits of the transmission may be allocated to the most reliable polarized bit-channels.

Aspects of the disclosure introduced above are described below in the context of a wireless communications system. Examples of processes and signaling exchanges that support a mutual-information based recursive polar code construction are then described. Aspects of the disclosure are further illustrated by and described with reference to apparatus diagrams, system diagrams, and flowcharts that relate to a mutual-information based recursive polar code construction.

FIG. 1 illustrates an example of a wireless communications system 100 that supports a mutual-information based recursive polar code construction in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

In some cases, a base station 105 may encode a set of bits for a transmission to a UE 115 using a polar code. The number of bits generated by a polar code encoder may be determined based on a power function (e.g., $2^N$). Thus, in order to achieve a given code rate or codeword size for a transmission, more bits may be generated by the polar code than are transmitted for the given code rate or codeword size. In such cases, the base station 105 may, puncture the encoded bits to satisfy the given code rate. That is, the base station 105 may rate match the output codeword of the polar code encoder to a number of desired bits for the given code rate by not transmitting some of the encoded bits. Because the polar code may not account for the punctured bits, the gains associated with using the polar code may be compromised, which may result in reduced throughput in a wireless communications system.

Wireless communications system 100 may support efficient techniques for accommodating puncturing in a polar coding scheme. An encoder may identify target mutual information for a transmission and may polarize bit-channels based on the identified target mutual information. At each stage of polarization, a capacity of each bit-channel is determined based on bit-channel capacities of input bit-channels from the previous stage of polarization and the mutual information transfer function. The resulting polarized bit-channels may then be partitioned into groups, each group associated with a specific capacity (or mutual information) that corresponds to the aggregate reliability of the bit-channels in the group. The polarization of the bit-channels and the partitioning of the bit-channels into different groups may be done recursively until the number of bit locations allocated to a group of polarized bit-channels is below a certain threshold. The information bits may then be distributed to different polarized bit-channels based on the reliability metrics of the polarized bit-channels.

However, if a set of bits is punctured for the transmission, the initial capacity (or target mutual information) used to partition the unpolarized bit-channels into polarized bit-channels may be different. As described herein, an encoder may employ a polar coding scheme that adjusts the initial target mutual information based on the number of bits punctured for a transmission. Thus, the polarized bit-channels may be partitioned into groups associated with different reliability metrics (or different mutual information) based on the number of un-punctured bits. As such, the adjusted initial capacity (or number of un-punctured bits) may be distributed to the different groups of polarized bit-channels appropriately, and the information bits of the transmission may be allocated to the most reliable polarized bit-channels.

Figure 2:
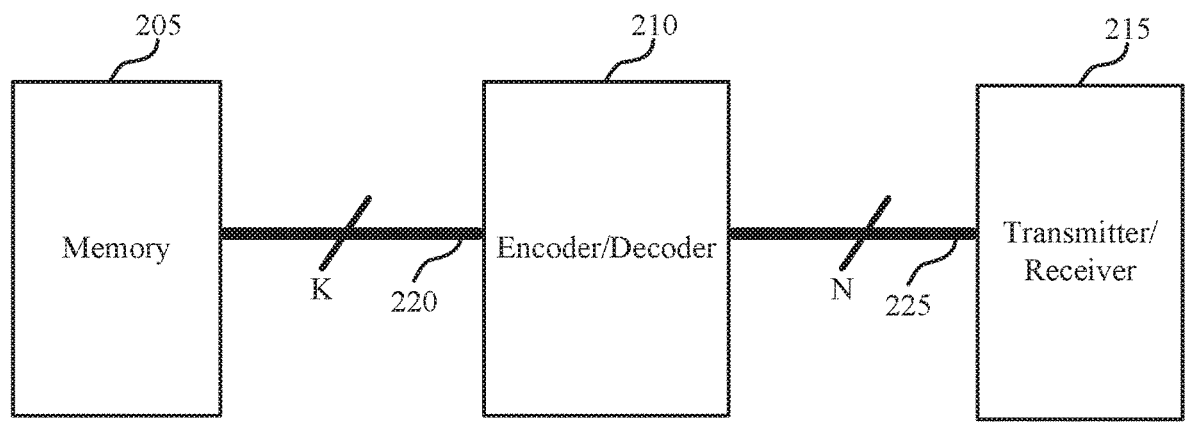
FIG. 2 illustrates an example of a device that supports a mutual-information based recursive polar code construction in accordance with various aspects of the present disclosure.

FIG. 2 illustrates an example of a device 200 that supports mutual-information based recursive polar code construction in accordance with various aspects of the present disclosure. Device 200 may include memory 205, encoder/decoder 210, and transmitter/receiver 215. Bus 220 may connect memory 205 and encoder/decoder 210, and bus 225 may connect encoder/decoder 210 and transmitter/receiver 215. In some instances, device 200 may have data stored in memory 205 to be transmitted to another device, such as, a UE 115 or a base station 105. To initiate data transmission, device 200 may retrieve the data, including information bits, from memory 205 for the transmission. The information bits included in memory 205 may be passed on to encoder/decoder 210 via bus 220. The number of information bits may be represented as a value k, as shown.

Encoder/decoder 210 may encode the k information bits and output a codeword having a length N, where k<N. Parity bits may be used in some forms of outer codes to provide redundancy to protect information bits, and frozen bits may be denoted by a given value (0, 1, etc.) known to both the encoder and the decoder (i.e., the encoder encoding information bits at a transmitter, and the decoder decoding the codeword received at a receiver). From a transmitting device perspective, device 200 may encode information bits to produce a codeword, and the codeword may be transmitted via transmitter 215. From a receiving device perspective, device 200 may receive encoded data (e.g., a codeword) via receiver 215 and may decode the encoded data using decoder 210 to obtain the information bits.

As mentioned above, device 200 may generate a codeword of length N and dimensionality k (corresponding to the number of information bits) using a polar code. A polar code is an example of a linear block error correcting code and has been shown to approach a theoretical channel capacity as the length of N increases. That is, polar codes may be used to increase the probability of a successful transmission. During encoding, a set of unpolarized bit-channels may be transformed into polarized bit-channels (e.g., channel instances or sub-channels) that may each be associated with a reliability metric. A reliability metric of a polarized bit-channel may approximate the ability of the polarized bit-channel to successfully convey an information bit to a receiver. Each polarized bit-channel may then be loaded with an information bit or non-information bit for a transmission based on the reliability metrics of different polarized bit-channels.

In some cases, reliability metrics may be determined based on a recursive partitioning of bit locations (e.g., channel instances or sub-channels) of the polar code. In a first polarization stage, a set of unpolarized bit-channels may be polarized, and the resulting polarized bit-channels may each be associated with a reliability metric determined based on the reliability metric (or mutual information) of the unpolarized bit-channels. The polarized bit-channels may then be partitioned into sectors or groups based on the determined reliability metrics of the different polarized bit-channels. For example, the bit-channels corresponding to single parity check operations may be partitioned into a first, lower reliability group, while the bit-channels corresponding to repetition operations may be partitioned into a second, higher reliability group. The polarization process may continue recursively until each partition reaches a given size.

A transmitting device may identify a number of information bits for a transmission (e.g., of an information bit vector), and the transmitting device may allocate or distribute the information bits to different groups of polarized bit-channels during the recursive partitioning based on a capacity of the different groups. Since the capacity of the different groups may be based on the reliability metric of different polarized bit-channels, subsets of the information bits may be distributed or allocated to different groups of polarized channels based on the reliability metrics associated with the different groups of polarized channels. The information bits may then be assigned to specific polarized bit-channels within a group based on a polarization metric (e.g., polarization weight, density evolution, etc.). Assigning information bits within each group may be based on a predetermined ranking of bit-channels within the groups. In some cases, the predetermined ranking of bit-channels within the groups (e.g., the one or more bit-reliability sequences for the polar code) may be the same for all groups or may be different for different groups. As such, the information bits may be loaded on the polarized bit-channels associated with the highest reliability metrics, and the remaining bits (e.g., parity bits and frozen bits) may be loaded on the remaining polarized bit-channels.

In some cases, however, the capacity of the unpolarized bit-channels may be affected by rate matching (e.g., due to puncturing). In such cases, if a polar code does not account for punctured bits, the information bits may not be allocated or distributed to the most favorable bit locations (i.e., bit location associated with the highest reliability). Accordingly, a wireless device may experience reduced throughput. Device 200 may support efficient techniques for facilitating puncturing in a polar coding scheme. Specifically, the recursive partitioning of bit-channels into polarized bit-channels may be based on the overall capacity for a transmission adjusted based on the number of bits punctured. The capacity of different sectors and groups of polarized bit-channels may thus be altered according to the adjusted polarized bit capacity, and a device may be able to allocate or distribute information bits to the most favorable bit locations.

Figure 3:
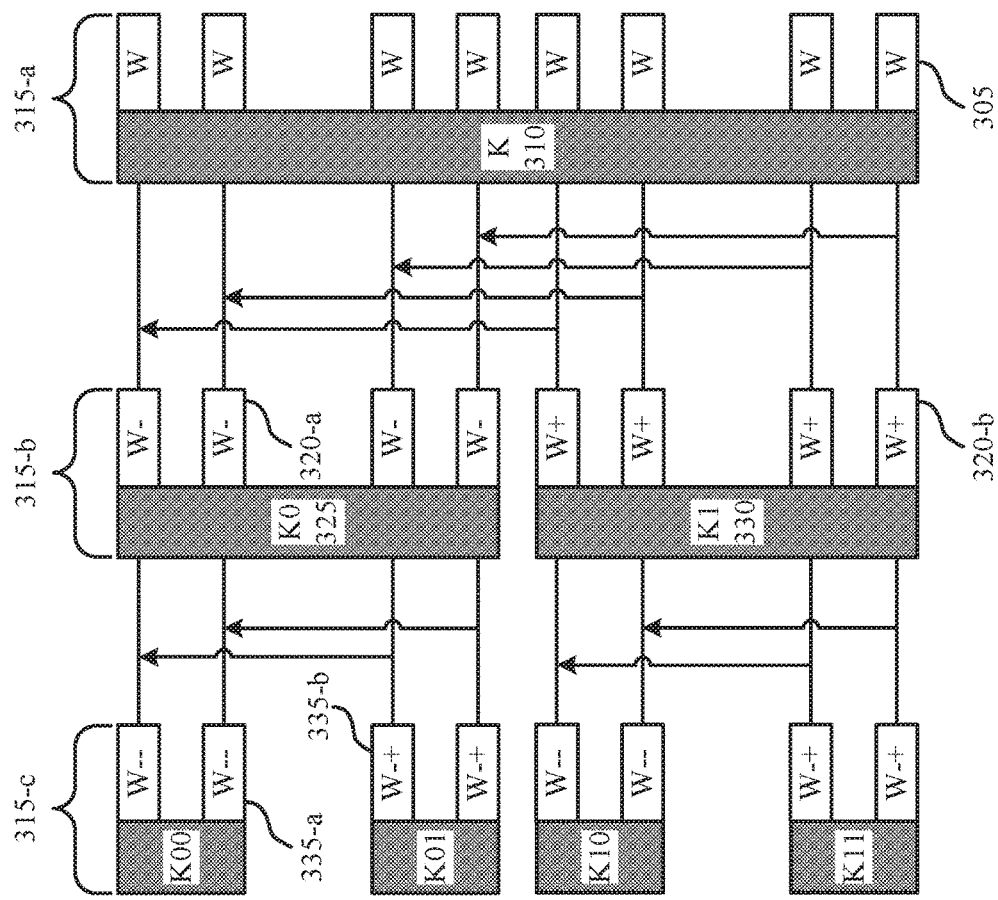
FIG. 3 illustrates an example of a polar coding scheme that supports a mutual-information based recursive polar code construction in accordance with various aspects of the present disclosure.
Figure 3:
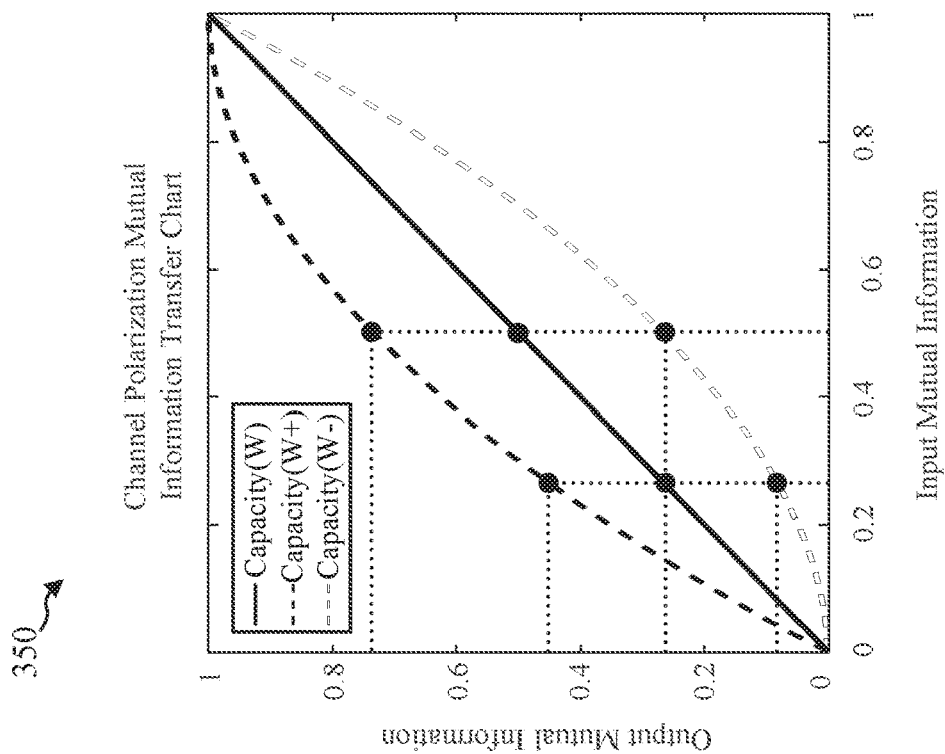

FIG. 3 illustrates an example of a polar coding scheme 300. In some cases, a transmitting device (e.g., a base station 105 or a UE 115, as described with reference to FIG. 1) may identify information for a transmission to a receiving device over a channel 'W.' In some examples, the polar coding scheme 300 may be used to generate a multiple of eight ($8*2^x$) coded bits for the transmission (e.g., a multiple of four ($4*2^x$) information bits 310 (i.e., $K=4*2^x$) and a multiple of four ($4*2^x$) parity or frozen bits). As shown in polar coding scheme 300, an encoding process would proceed from left to right, while polarization may be understood as occurring in polarization stages proceeding from right to left.

To ensure that the information bits transmitted by the transmitting device see an optimized coding gain when decoded by the receiving device, the transmitting device may transmit the information bits on channel instances (or sub-channels) of the channel 'W' associated with the highest reliability. In some cases, the transmitting device may identify a target mutual information (or code rate) for a transmission, and the transmitting device may use this information to encode the information bits for the transmission. In the present example, the target mutual information (or code rate) may be calculated as the number of information bits divided by the capacity of a group of bit-channels at a specific encoding stage (e.g., encoding stage 315-a). As can be seen in equation 1 below, the capacity of each bit-channel at the first polarization stage 315-a corresponds to the overall capacity of the transmission.

$$\text{Target Mutual Information} = \text{Code rate} = \frac{K}{2^m} \quad (1)$$

Where $m=\log_2(N)$ if N is the code length without puncturing. Based on the target mutual information (or code rate), the transmitting device may partition the unpolarized bit-channels 305 into groups of polarized bit-channels 320.

Specifically, the transmitting device may determine the mutual information or capacity of the polarized bit-channels based on mapping the target mutual information to a channel polarization mutual information transfer function, such as a function corresponding to the channel polarization mutual information transfer chart 350. Furthermore, the transmitting device may allocate or distribute information bits to the different polarized bit-channels based on the mutual information or capacity of the polarized hit-channels. As illustrated, the number of polarized bit-channels 320-a in each partitioned group for each polarization stage is the same. As shown in the channel polarization mutual information transfer chart 350, the mutual information or capacity of the polarized bit-channels 320-b may be greater than or equal to the mutual information or capacity of the polarized bit-channels 320-a, and the sum of the capacity of the polarized bit-channels 320-a and 320-b may be equal to the sum of the capacity of the unpolarized bit-channels 305.

$$\text{Capacity}(W+) \geq \text{Capacity}(W-) \quad (2)$$

$$\text{Capacity}(W+) + \text{Capacity}(W-) = 2*\text{Capacity}(W) \quad (3)$$

Thus, the transmitting device may allocate or distribute more information bits to polarized bit-channels 320-b than to polarized bit-channels 320-a. The transmitting device may identify the distribution of the information bits between the polarized bit-channels 320 based on the following equations:

$$K0 + K1 = K \quad (4)$$

$$\frac{K0}{K1} = \frac{Cap(W-)}{Cap(W+)} \quad (5)$$

Or equivalently:

$$K0 = \text{Cap}(W-)*N0$$

$$K1 = \text{Cap}(W+)*N1 \quad (6)$$

where K0 corresponds to the number of information bits 325 (or bit locations) allocated or distributed to polarized bit-channels 320-a, K1 corresponds to the number of information bits 330 (or bit locations) allocated or distributed to polarized bit-channels 320-b, and N0 and N1 are constants.

In the example introduced above where $K=4*2^x$ and $m=3$, each of the unpolarized bit-channels 305 may have a capacity of 0.5 which, based on the channel polarization mutual information transfer chart 350, gives a mutual information for the polarized bit-channels 320-b of approximately 0.75 and a mutual information of the polarized bit-channels 320-a of approximately 0.25. Since mutual information corresponds to the capacity of the polarized bit-channels 320, the transmitting device may allocate or distribute three (3) bits to polarized bit-channels 320-b (i.e., $K1=3$) and one (1) bit to polarized bit-channels 320-a (i.e., $K0=1$). Thus, the resulting mutual information of the group of polarized bit-channels 320-a corresponds to the following equation:

$$\text{Mutual Information} = \frac{K0}{2^{m-1}} \quad (7)$$

Similarly, the resulting mutual information of the group of polarized bit-channels 320-b corresponds to the following equation:

$$\text{Mutual Information} = \frac{K1}{2^{m-1}} \quad (8)$$

As illustrated, the transmitting device may then recursively partition the polarized bit-channels into groups of further polarized bit-channels based on the capacity of different partitions to identify the bit-channels with the highest reliabilities. The transmitting device may distribute or allocate the information bits to these further polarized bit-channels (i.e., assign bit locations) based on the mutual information (or reliability) of the polarized bit-channels. As an example, polarized bit-channels 320-a may be further polarized into polarized bit-channels 335. The transmitting device may identify the mutual information of polarized bit-channels 320-a and use this information to partition these bit-channels into further polarized bit-channels 335. As discussed above, in the present example, the mutual information of polarized bit-channels 320-a may be 0.25 while the mutual information of polarized bit-channels 320-b may be 0.75.

Based on the mutual information, the transmitting device may partition the polarized bit-channels 320-a into groups of polarized bit-channels 335 using the same techniques described above. The example provided is simplified for ease of illustration and the techniques described herein may generally be applied to cases where the codeword length 'N' is above a specific threshold (e.g., 32, 64, or 128 bit-channels, etc.) These techniques may be repeated recursively until the block size of a group of polarized bit-channels is below a certain threshold. An encoder may then assign a number of information bits to each group based on the reliability of the polarized bit-channels within a group.

For example, if the size of a block is less than or equal to the threshold, then a sequence may be used to determine the distribution of the allocated information bits within the group. The sequence may be derived by applying a polarization weight or by using density evolution techniques (e.g., with a pre-calculated sequence). In some cases, the information bits may be distributed to bit-channels within a group in a predetermined order. In some examples, the information bits may be distributed to bit-channels within different groups in a same order, and, in other examples, the information bits may be distributed to bit-channels within different groups in different orders. For example, a reliability order for all N bit-channels of the polar code may be established for a given number of information bits 'k', and the partitioned reliability order may be used to distribute information bits allocated to each partition. Accordingly, the bit locations of the information bits may be chosen to ensure that a receiving device can repeat the process used to determine the information bit locations. A receiving device may receive the transmission and may use similar techniques to identify the bit locations of the transmission by partitioning unpolarized bit-channels into polarized bit-channels recursively.

In some cases, however, the number of bits generated by the polar code may exceed the number of bits to be transmitted. For example, the transmitting device may puncture some bits of the encoded bits prior to transmitting the bits to a receiving device. A punctured bit may be a bit for which no information is transmitted (e.g., the bit is skipped) or a bit that is used for another purpose (e.g., transmission of a reference signal, etc.). Puncturing may include, for example, shortening puncturing (or known bit puncturing), in which a set of most significant bits (MSBs) or later-generated bits of a codeword are punctured, and block puncturing (or unknown bit puncturing), in which a set of least significant bits (LSBs) or earlier-generated bits of a codeword are punctured. To facilitate puncturing, the transmitting device may adjust the polar coding scheme based on the number of bits punctured for a transmission.

Figure 4A:
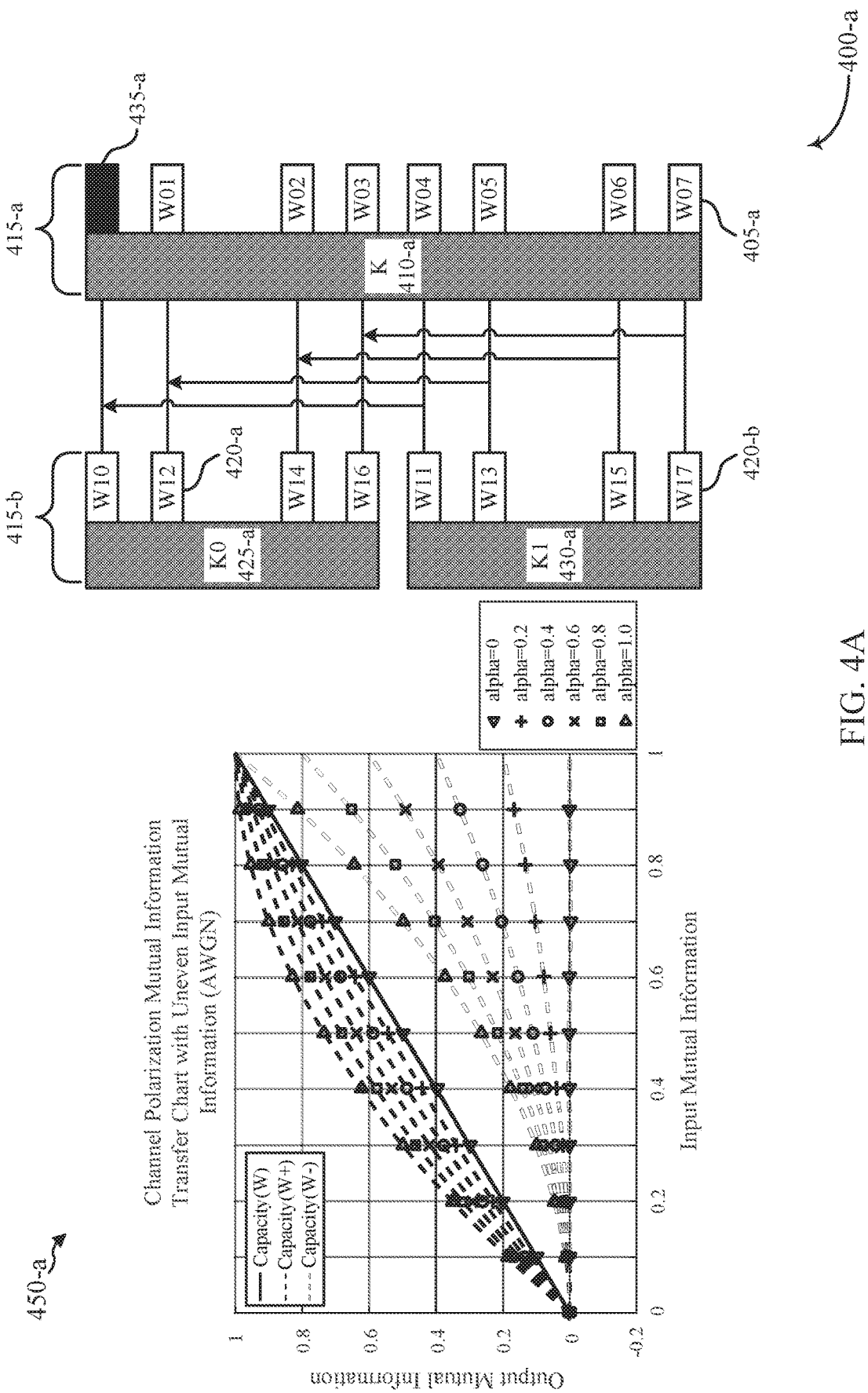
FIGS. 4A-4C illustrate examples of polar coding schemes that support a mutual-information based recursive polar code construction in accordance with various aspects of the present disclosure.

FIG. 4A illustrates an example of a polar coding scheme 400-a that supports a mutual-information based recursive polar code construction in accordance with various aspects of the present disclosure. In some cases, a transmitting device (e.g., a base station 105 or a UE 115, as described with reference to FIG. 1) may identify information for a transmission to a receiving device over a channel 'W.' In some examples, the polar coding scheme 400-a may be used to generate a multiple of eight (8*2^x) coded bits for the transmission (e.g., a multiple of four (4*2^x) information bits 410-a (i.e., K=4*2^x) and a multiple of four (4*2^x) parity and frozen bits). The transmitting device may identify that a portion of bits (e.g., bit 435-a) may be punctured for the transmission (e.g., unknown bit puncturing), and the transmitting device may adjust polar coding scheme 400-a based on the number of punctured bits.

To increase the robustness of the transmission of the information bits, the transmitting device may transmit the information bits on channel instances (or sub-channels) corresponding to the channels associated with the highest reliability. In some cases, the transmitting device may identify a target mutual information (or code rate) for a transmission, and the transmitting device may use this information to encode the information bits for the transmission. The target mutual information (or code rate) for the transmission may be adjusted to account for the puncturing. Specifically, in the present example, the mutual information of the punctured bit 435-a may be set to zero (0), and the target mutual information (or code rate) may be calculated as the number of information bits divided by the capacity of a group at a corresponding encoding stage of a transmission (e.g., encoding stage 415-a). As can be seen in equation 9 below, the capacity of the unpolarized bit-channels at a first encoding stage 415-a corresponds to the difference between the overall capacity of the transmission denoted as $2^m$ and the number of punctured bits denoted as (N−M), where N is the length of the mother code (i.e., the length of the code generated by the polar code) and M is the number of un-punctured bits. That is, the capacity of the unpolarized bit-channels at the first encoding stage 415-a corresponds to the number of un-punctured bits M.

$$\text{Target Mutual Information} = \text{Code rate} = \frac{K}{2^m - (N-M)} = \frac{K}{M} \quad (9)$$

Based on the target mutual information (or code rate), the transmitting device may partition the unpolarized bit-channels 405-a into groups of polarized bit-channels 420.

Specifically, the transmitting device may determine the mutual information or capacity of the polarized bit-channels based on mapping the target mutual information to a channel polarization mutual information transfer function, such as a function corresponding to the channel polarization mutual information transfer chart 450-a. Furthermore, the transmitting device may allocate or distribute information bits to the different polarized bit-channels based on the mutual information or capacity of the polarized bit-channels. As illustrated in the channel polarization mutual information transfer chart 450-a, the mutual information or capacity of each of the polarized bit-channels 420-b is greater than or equal to the capacity of corresponding ones of the polarized bit-channels 420-a, and the sum of the capacity of the polarized bit-channels may be equal to the sum of the capacity of the unpolarized bit-channels. The capacity of non-shortening based punctured bits may be set to zero.

$$\text{Capacity}(W+) \geq \text{Capacity}(W-) \quad (10)$$

$$C(W10)+C(W12)+C(W14)+C(W16)+C(W11)+C(W13)+C(W15)+C(W17)=0+C(W01)+C(W02)+C(W03)+C(W04)+C(W05)+C(W06)+C(W07) \quad (11)$$

Thus, the transmitting device may allocate or distribute information bits to polarized bit-channels 420-b and polarized bit-channels 420-a in proportion to their capacities. The transmitting device may identify the distribution of the information bits between the polarized bit-channels 420 based on the following equations:

$$K0 + K1 = K \quad (12)$$

$$\frac{K0}{K1} = \frac{C(W10) + C(W12) + C(W14) + C(W16)}{C(W11) + C(W13) + C(W15) + C(W17)} \quad (13)$$

Mutual information transfer chart 450-a shows the capacity for the W+ and W− bit-channels, where the capacity of the input bit-channels may be different. For a given set of two (2) capacity (or mutual information) values input on single parity check and partition input bit-channels, the capacity for mutual information transfer chart 450-a will be the larger of the two values, and an alpha value may correspond to a ratio between the two values. Thus, the capacity of one input bit-channel may be a normalized common capacity and the capacity of another input bit-channel may be the normalized capacity scaled by the alpha value.

These techniques may be repeated recursively until the block size of a group of polarized bit-channels is below a certain threshold (e.g., 32, 64, or 128 bit-channels, etc.) or certain conditions on the code block length are satisfied. For example, if the size of a nested polar code is less than or equal to the threshold, then a reliability ranking calculation (e.g., nested density evolution or polarization weight) or pre-calculated ranking may be used to determine the distribution/mapping of the allocated information bits (i.e., the bit locations) within a group. The pre-calculated ranking may be derived by applying a polarization weight or by using density evolution techniques. In some examples, the pre-calculated ranking may be the same for different groups. That is, the reliability order used for a given partition having, for example, N/2 bit-channels, may be a reliability order for the N/2 bit-channels without considering whether the bit channels are the top or bottom half of the polar code, which provides the same pre-calculated ranking for each group. In other examples, the pre-calculated ranking may be different for different groups. For example, different reliability orders for the bit-channels in different partitions may be established, and the different reliability orders may be used to distribute information bits allocated to each partition.

Alternatively, a reliability order for all N bit-channels of the polar code may be established (e.g., for all K or a given range of K), and the partitioned reliability order may be used to distribute information bits allocated to each partition. That is, the reliability order for each of the two groups, each having N/2 bit-channels, may be determined taking into account the position of the partition (e.g., top or bottom partition). Thus, the partitioning of the K information bits into K0 and K1 for the two groups of N/2 bit-channels may account for puncturing, while the reliability order for assigning the K0 and K1 bits within each of the partitions may be performed using respective subsets of the pre-determined reliability order for the N bit-channels. For example, the reliability order for a given N/2 partition may be determined based on the order of bit channels within the partition based on the reliability order given for all N bit-channels. A receiving device may receive the transmission and may perform similar techniques to identify the bit locations of the transmission by partitioning unpolarized bit-channels into polarized bit-channels recursively.

In some cases, the techniques described above for identifying information bit allocations of a transmission by partitioning unpolarized bit-channels into polarized bit-channels recursively may be used to identify bit locations for different combinations of numbers of coded bits, numbers of information bits, numbers of punctured bits, and different types of puncturing. The information bit allocations for the different combinations of the above factors may be given by an equation or a table such that a wireless device may be able to identify the bit locations of a codeword based on the equation or the table (i.e., rather than performing the recursive partitioning described above). Further, in some examples, the table may indicate a range of bit locations (e.g., not all) for a range of the different combinations of the factors described above, and a wireless device may identify bit locations of a codeword based on the range of bit locations indicated by the table.

Figure 4B:
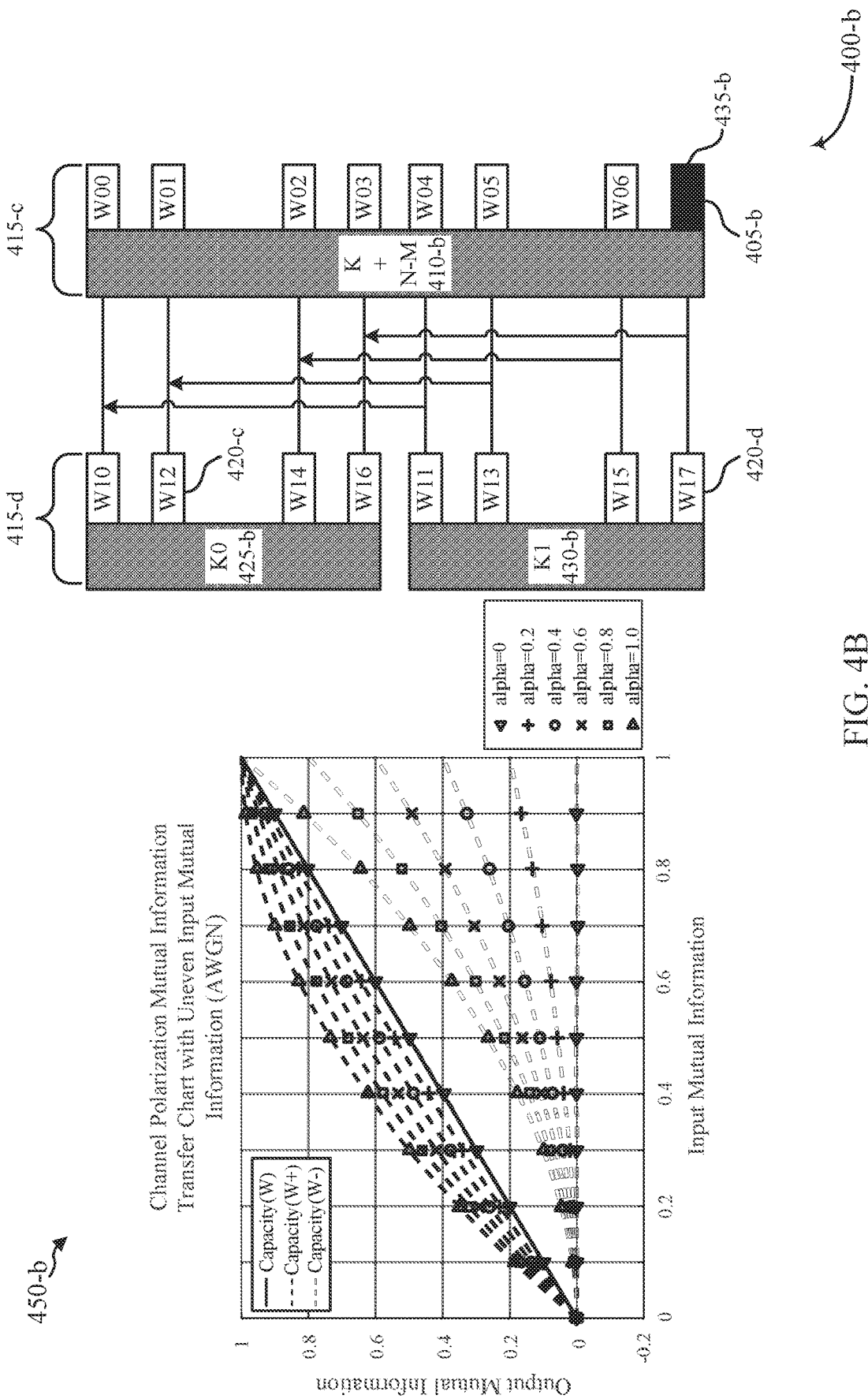

FIG. 4B illustrates an example of a polar coding scheme 400-b that supports a mutual-information based recursive polar code construction in accordance with various aspects of the present disclosure. In some cases, a transmitting device (e.g., a base station 105 or a UE 115, as described with reference to FIG. 1) may identify information for a transmission to a receiving device over a channel 'W.' In some examples, the polar coding scheme 400-b may be used to generate a multiple of eight ($8*2^x$) coded bits for the transmission (e.g., a multiple of four ($4*2^x$) information bits 410-b (i.e., $K=4*2^x$) and a multiple of four (4) parity and frozen bits). The transmitting device may identify that a portion of bits (e.g., bit 435-b) may be punctured for the transmission (e.g., known bit puncturing), and the transmitting device may adjust polar coding scheme 400-b based on the number of punctured bits.

To increase the robustness of the transmission of the information bits, the transmitting device may transmit the information bits on channel instances (or sub-channels) corresponding to the channels associated with the highest reliability. In some cases, the transmitting device may identify a target mutual information (or code rate) for a transmission, and the transmitting device may use this information to encode the information bits for the transmission. The target mutual information (or code rate) for the transmission may be adjusted to account for the puncturing. Specifically, in the present example, the mutual information of the punctured bit 435-b may be set to one, and the target mutual information (or code rate) may be calculated as the number of information bits divided by the capacity of a group of polarized bits at a corresponding encoding stage of a transmission (e.g., encoding stage 415-c). As can be seen in equation 14 below, the capacity of the unpolarized bit-channels at a first encoding stage 415-c corresponds to the difference between the overall capacity of the transmission denoted as $2^m$ and the number of punctured bits denoted as (N−M), where N is the length of the mother code (i.e., the length of the code generated by the polar code) and M is the number of un-punctured bits. That is, the capacity of the unpolarized bit-channels at the first encoding stage 415-c corresponds to the number of un-punctured bits M.

$$\text{Target Mutual Information} = \text{Code rate} = \frac{K}{2^m - (N-M)} = \frac{K}{M} \quad (14)$$

Based on the target mutual information (or code rate), the transmitting device may partition the unpolarized bit-channels 405-b into groups of polarized bit-channels 420.

Specifically, the transmitting device may determine the mutual information or capacity of the polarized bit-channels based on mapping the target mutual information to a channel polarization mutual information transfer function, such as a function corresponding to the channel polarization mutual information transfer chart 450-b. Furthermore, the transmitting device may allocate or distribute information bits to the different polarized bit-channels based on the mutual information or capacity of the polarized bit-channels. As illustrated in the channel polarization mutual information transfer chart 450-b, the mutual information or capacity of each of the polarized bit-channels 420-d is greater than or equal to the capacity of corresponding ones of the polarized bit-channels 420-c, and the sum of the capacity of the polarized bit-channels may be equal to the sum of the capacity of the unpolarized bit-channels. The capacity of shortening based punctured bits may be set to unity (a capacity value of 1).

$$\text{Capacity}(W+) > \text{Capacity}(W-) \quad (15)$$

$$C(W10)+C(W12)+C(W14)+C(W16)+C(W11)+C(W13)+C(W15)+C(W17)=C(W00)+C(W01)+C(W02)+C(W03)+C(W04)+C(W05)+C(W06)+1 \quad (16)$$

Thus, the transmitting device may allocate or distribute information bits to polarized bit-channels 420-*d* and polarized bit-channels 420-*c* in proportion to their capacities. The transmitting device may identify the distribution of the information bits between the polarized bit-channels 420 based on the following equations:

$$K0 + K1 = K + (N - M) \quad (17)$$

$$\frac{K0}{K1} = \frac{C(W10) + C(W12) + C(W14) + C(W16)}{C(W11) + C(W13) + C(W15) + C(W17)} \quad (18)$$

Figure 4C:
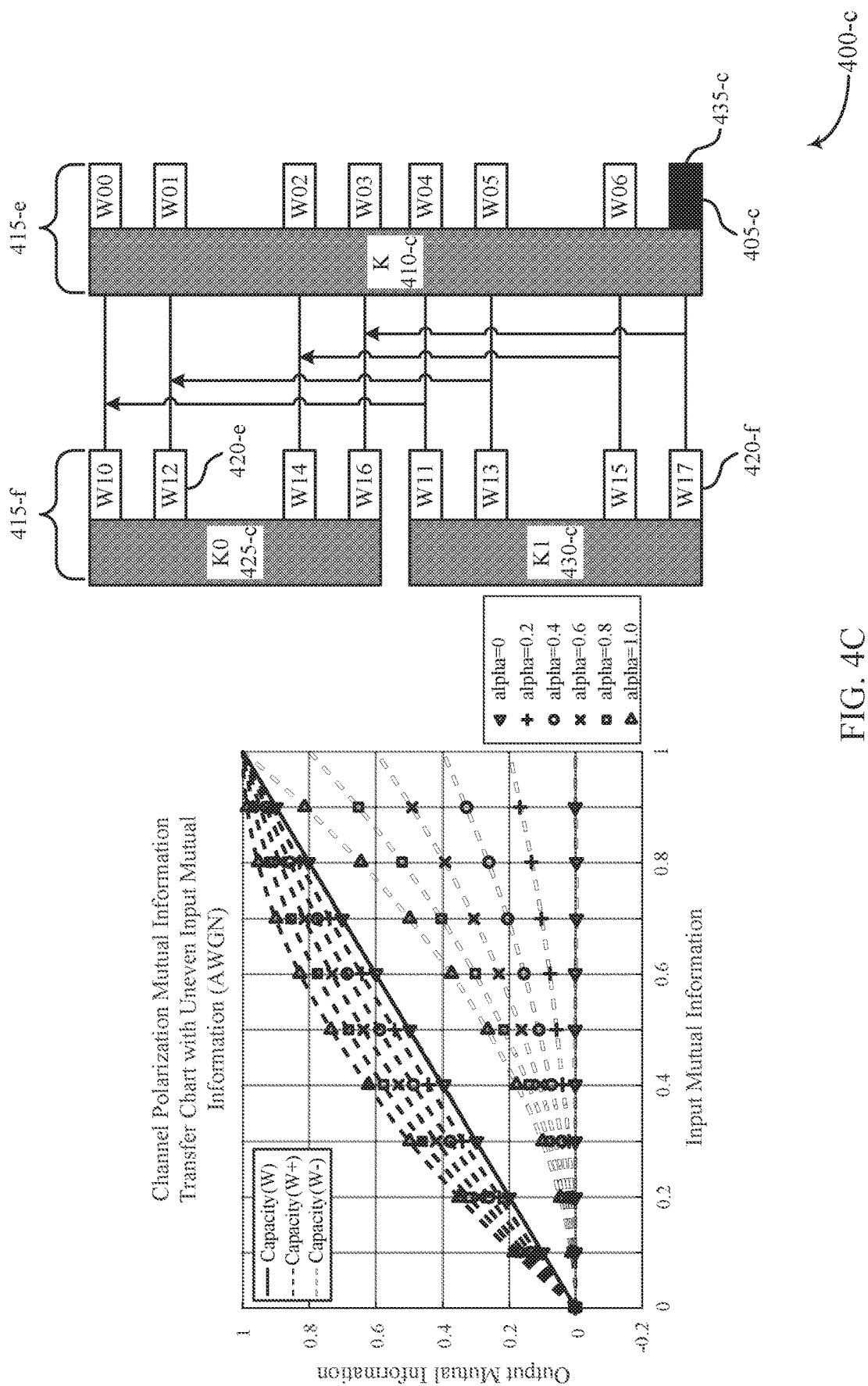

For a given set of two (2) capacity (or mutual information) values input on a single parity check and partition input bit-channels, the normalized capacity will be the larger of the two values, and an alpha value may correspond to a ratio between the two values. Thus, the capacity of one bit-channel may be a normalized capacity and the capacity of another bit-channel may be the normalized capacity scaled by the alpha value. Although not illustrated in FIG. 4B, the capacity of shortening based punctured bits may also be set to unity (1), and a transmitting device may use techniques similar to those described with reference to FIG. 4A to partition bit-channels into bit-channel partitions. For instance, in the example of FIG. 4C, the mutual information at unpolarized bit channels 405-*c* may be set equal to K/M (i.e., R=K/M), and the mutual information of the punctured bit 435-*c* may be set to one (i.e., R=1 for known bit puncturing). Based on the mutual information (or code rate), a transmitting device may partition the unpolarized bit-channels 405-*c* into groups of polarized bit-channels 420 (e.g., a first group of polarized bit channels 420-*e* and a second group of polarized bit channels 420-*f*). In this example, the recursive partitioning of bit channels (e.g., the recursive partitioning of Ki's, such as the partitioning of K 410-*c* to K0 425-*c* and K1 430-*c*) may not include shortened bits (e.g., the shortened locations at each polarization stage 415, such as polarization stages 415-*e* and 415-*f*, may be known).

These techniques may be repeated recursively until the block size of a group of polarized bit-channels is below a certain threshold or certain other conditions are satisfied. For example, if the size of a nested polar code is less than or equal to the threshold, then a reliability ranking calculation (e.g., polarization weight) or pre-calculated ranking may be used to determine the distribution of the allocated information bits (i.e., the bit locations) within a group. The pre-calculated ranking may be derived by applying a polarization weight or by using density evolution techniques. In some examples, the pre-calculated ranking may be the same for different groups. That is, the reliability order used for a given partition having, for example, N/2 bit-channels, may be a reliability order for the N/2 bit-channels without considering whether the bit channels are the top or bottom half of the polar code, which provides the same pre-calculated ranking for each group. In other examples, the pre-calculated ranking may be different for different groups. For example, different reliability orders for the bit-channels in different partitions may be established, and the different reliability orders may be used to distribute information bits allocated to each partition.

Alternatively, a reliability order for all N bit-channels of the polar code may be established (e.g., for all K or a given range of K), and the partitioned reliability order may be used to distribute information bits allocated to each partition. That is, the reliability order for each of the two groups, each having N/2 bit-channels, may be determined taking into account the position of the partition (e.g., top or bottom partition). Thus, the partitioning of the K information bits into K0 and K1 for the two groups of N/2 bit-channels may account for puncturing, while the reliability order for assigning the K0 and K1 bits within each of the partitions may be performed using respective subsets of the predetermined reliability order for the N bit-channels. Accordingly, the bit locations of the information bits may be chosen in a manner that can be repeated by a receiving device. A receiving device may receive the transmission and may perform similar techniques to identify the bit locations of the transmission by partitioning unpolarized bit-channels into polarized bit-channels recursively.

In some cases, the techniques described above for identifying bit locations of a transmission by partitioning unpolarized bit-channels into polarized bit-channels recursively may be used to identify information bit allocations for different combinations of numbers of coded bits, numbers of information bits, numbers of punctured bits, and different types of puncturing. The information bit allocations for the different combinations of the above factors may be given by an equation or a table such that a wireless device may be able to identify the bit locations of a codeword based on the equation or the table (i.e., rather than performing the recursive partitioning described above). Further, in some examples, the table may indicate a range of bit locations (e.g., not all) for a range of the different combinations of the factors described above, and a wireless device may identify bit locations of a codeword based on the range of bit locations indicated by the table.

Figure 5:
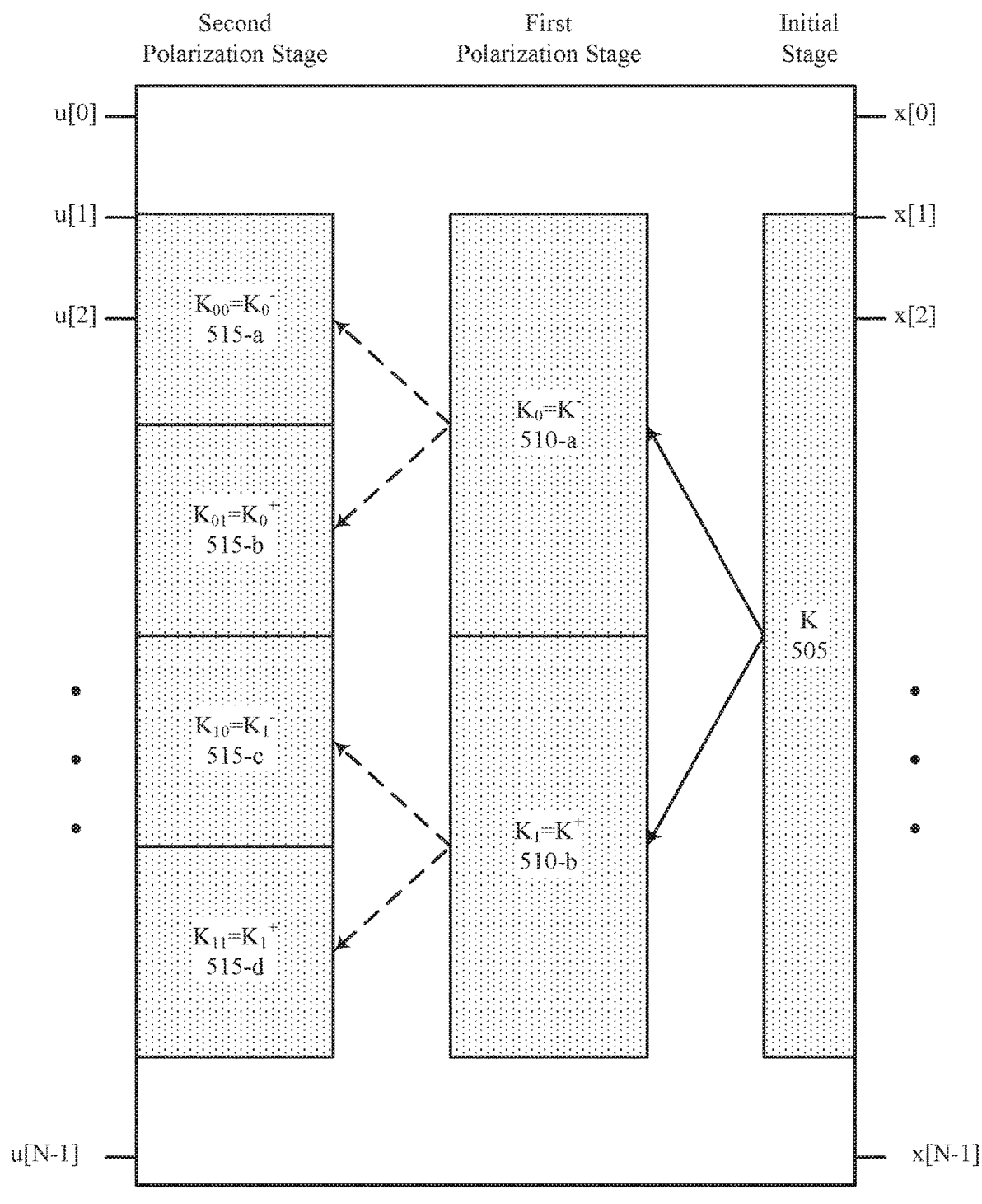
FIG. 5 illustrates an example of a generator matrix that supports a mutual-information based recursive polar code construction in accordance with various aspects of the present disclosure.

FIG. 5 illustrates an example of a generator matrix 500 that supports a mutual-information based recursive polar code construction in accordance with various aspects of the present disclosure. The generator matrix 500 may be used at an encoder to generate a codeword for transmission to a receiving device, and the generator matrix 500 may be used at a decoder to decode a codeword received from a transmitting device. At a transmitting device, a polar code may be used to generate a mother code of length N. As discussed above, however, it may be appropriate for the encoder to puncture a portion of the bits of the mother code of length N generated by the polar code (or rate-match the mother code to a set of resources). As such, the encoder may use the techniques described with reference to FIGS. 4A-4C to account for puncturing in the encoding process.

In one example, the mother code may be punctured using block puncturing (as described with reference to FIG. 4A, where the top ⅛ coded bits are punctured), and the capacities of the punctured bits may be set to zero. In this example, the output bits corresponding to unpolarized bit-channels x[0] to x[N−M−1] may be punctured, where M corresponds to the number of un-punctured bits. Thus, polarized bit-channels u[0] to u[N−M−1] may be unused for information bits (e.g., set to a known value) while information bits are mapped to bit channel locations selected from polarized bit-channels u[N−M] to u[N/2−1] in an upper partition of bit-channels and polarized bit-channels u[N/2] to u[N−1] in a lower partition of bit channels.

In another example, the mother code may be shortened using block shortening (as described with reference to FIG. 4B), and the capacities of the punctured bits may be set to one. In this example, the output bits corresponding to unpolarized bit-channels x[M] to x[N−1] may be punctured/shortened (e.g., with a mutual information or capacity set equal to one for known bit puncturing). Thus, polarized bit-channels u[M] to u[N−1] may be unused for information bits (e.g., set to a known value) while information bits are mapped to bit-channel locations selected from polarized bit-channels u[0] to u[N/2−1] in an upper partition of bit-channels and polarized bit-channels u[N/2] to u[M−1] in a lower partition of bit channels.

The polarized bit-channels may then be recursively partitioned into bit-channel partitions (as described with reference to FIGS. 4A-4C), and the information bits to be transmitted may be mapped to bit-channels in the u-domain (e.g., bit-channels u[0:N−1]) associated with the highest reliabilities. Depicted on the right in an initial stage is a set of codeword bits x[0] to x[N−1] which are to be generated from K information bits 505. A transmitting device may determine the bit locations for the K information bits 505 in the u domain (e.g., from bit channels u[0] to u[N−1]) by recursive partitioning of the K information bits 505 starting from the x domain. For example, the transmitting device may partition the K information bits in at least a first polarization stage. At the first polarization stage, K0 of the K information bits 505 may be allocated to partition 510-*a*, and K1 of the K information bits 505 may be allocated to partition 510-*b*. In some cases, the recursive partitioning may proceed to additional polarization stages. For example, at the second polarization stage, K00 of the K0 information bits may be allocated to partition 515-*a*, and K01 of the K0 information bits may be allocated to partition 515-*b*. Also, at the second polarization stage, K10 of the K1 information bits may be allocated to partition 515-*c*, and K11 of the K1 information bits may be allocated to partition 515-*d*. The techniques described herein may be applied to additional polarization stages. Or, in some cases, the techniques may be only applied at the first polarization stage, and some other technique (e.g., an equation or table) may be used to either allocate bits at additional stages, or determine the order within each partition.

In systems that use rate-matching, indices corresponding to punctured or shortened bits may not be selected as information bits (K), and the information bit allocation may be adjusted such that information bits (K) may be allocated to upper and lower parts of the u-domain according to the following:

For block puncturing:

$$K^- = \left\lfloor \left(R^2 + \left(-\frac{\left|R - \frac{1}{2}\right|}{32} + \frac{1}{64}\right)\right) \times \left(M - \frac{N}{2}\right)\right\rfloor, K^+ = K - K^-,$$

where $R = \frac{K}{M}$,

K=number of information bits, M=number of transmitted bits (after rate matching), and N=mother code length.

For block shortening:

$$K^+ = \left\lfloor \left(2R - R^2 - \left(-\frac{\left|R - \frac{1}{2}\right|}{32} + \frac{1}{64}\right)\right) \times \left(M - \frac{N}{2}\right)\right\rfloor, K^- = K - K^+,$$

where $R = \frac{K}{M}$,

K=number of information bits, M=number of transmitted bits (after rate matching), and N=mother code length.

Information bits may be adjusted, for example, at the first order polarization stage, and K− and K+ may be derived over the upper and lower N/2 bits respectively from K over all N bits.

The above equations for information bit allocation for block puncturing and block shortening may be used for a block rate-matching scheme. However, for a general rate-matching scheme, the information bit allocation may be adjusted such that information bits (K) may be allocated to upper and lower parts of the u-domain according to the following:

For block puncturing: $K^- = \lfloor MI_-(R) \times J \rfloor$, $K^+ = K - K^-$, where $$R = \frac{K}{M}$$

and J corresponds to the non-punctured bits in the upper N/2 bits.

For block shortening: $K^+ = \lfloor MI_+(R) \times J \rfloor$, $K^+ = K - K^-$, where $$R = \frac{K}{M}$$

and J corresponds to the non-shortened bits in the lower N/2 bits.

The equations for the block rate-matching scheme may be generated using the equations for the general rate-matching scheme based on the following:

For block puncturing:

$$MI_-(R) = \left(R^2 + \left(-\frac{\left|R - \frac{1}{2}\right|}{32} + \frac{1}{64}\right)\right), J = M - \frac{N}{2}.$$

For block shortening:

$$MI_+(R) = \left(2R - R^2 - \left(-\frac{\left|R - \frac{1}{2}\right|}{32} + \frac{1}{64}\right)\right), J = M - \frac{N}{2}.$$

For other rate-matching schemes, $MI_-(R)$, $MI_+(R)$, and J may be derived accordingly. A similar information allocation adjustment (IAA) may be done for repetition.

In some aspects, in the examples described above for determining information bit allocations using the provided equations, the values of variables within the equations may be determined (e.g., by a transmitting or a receiving device) based on a look-up table. For instance, the value of R (i.e., K/M) may be determined using the look-up table, where:

$$K = y * 2^n \text{ and } y \in (0.5, 1]$$

$$M = x * 2^m \text{ and } x \in (0.5, 1]$$

$$R = \frac{y * 2^n}{x * 2^m} \text{ and } x, y \in (0.5, 1]$$

In one example, the look-up table may provide values of 1/x which may then be used to further determine values of R. In this example, the table may be a one-dimensional table including 64 entries indicating different values of 1/x with a 10-bit output. Thus, the values of 1/x (e.g., $v_{out}=1/x$) may be accurately determined based on the look up table, and the value of R may then be determined based on the following equation:

$$R = \frac{K}{M} = (y * v_{out}) * \frac{2^n}{2^m}$$

In another example, the table may provide values of y/x which may then be used to determine values of R. In this example, the table may be a two-dimensional table including 4096 entries (i.e., 64*64) indicating different values of y/x. Thus, the values of y/x (e.g., $z_{out}=y/x$) may be accurately determined based on the look-up table, and the value of R may then be determined based on the following equation:

$$R = \frac{K}{M} = z_{out} * \frac{2^n}{2^m}$$

The information bit allocations (e.g., K⁻ or K⁺) may therefore be determined based on the equations described above (i.e., the equations for K⁻ or K⁺) using values provided by the look-up table.

As with the examples described above with reference to FIGS. 4A-4C, the bit locations of the information bits may be chosen in a manner that can be repeated by a receiving device. A receiving device may receive the transmission and may perform similar techniques to identify the bit locations of the transmission by partitioning unpolarized bit-channels into polarized bit-channels recursively, and assigning information bits to the different bit-channel partitions (e.g., based on the equations described above).

Figure 6:
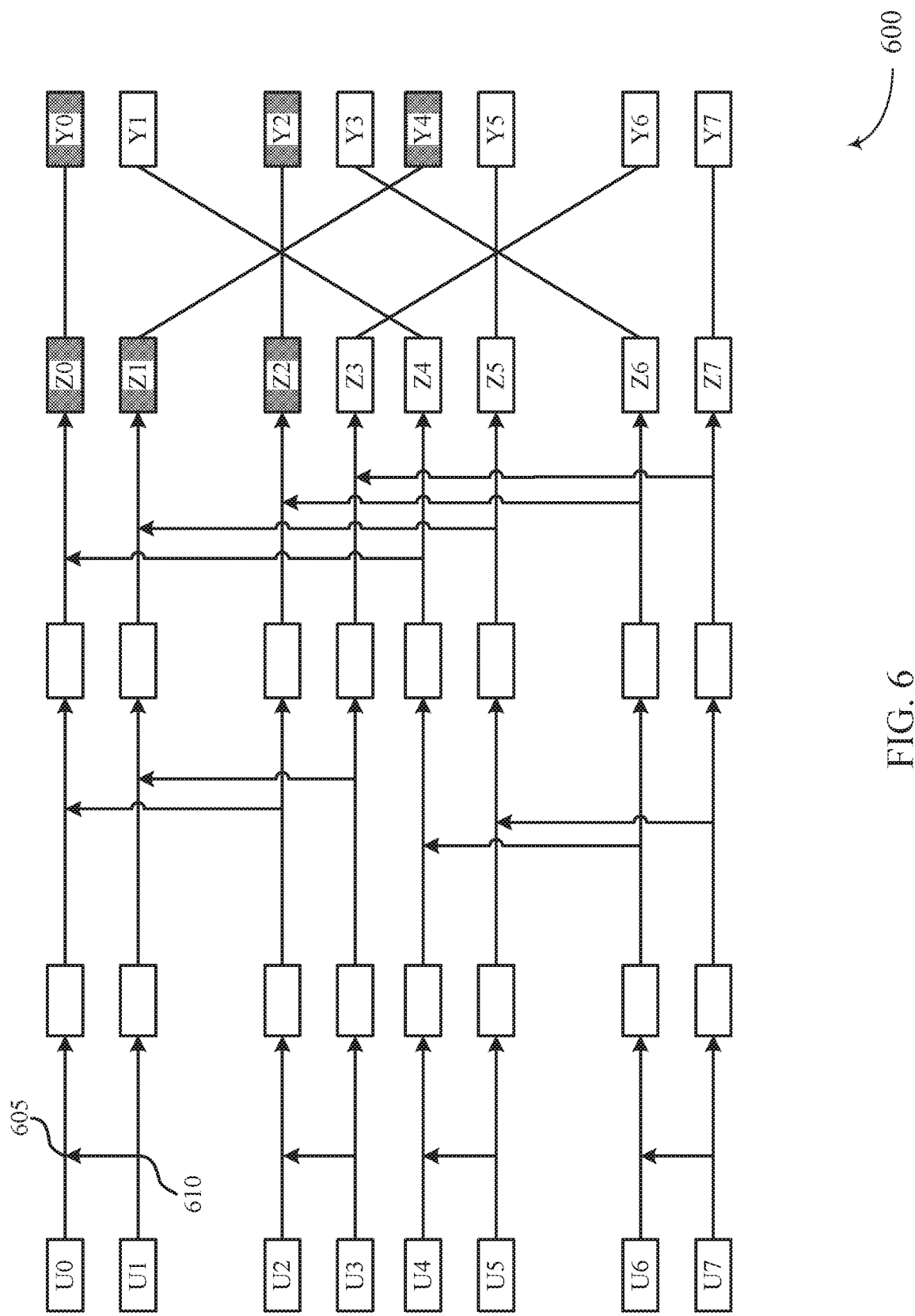
FIGS. 6-8 illustrate examples of polar coding schemes that support a mutual-information based recursive polar code construction in accordance with various aspects of the present disclosure.

FIG. 6 illustrates an example of a polar coding scheme 600 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7), including information bits, frozen bits, and/or parity bits. The set of bits may be encoded in a codeword Z using a polar code encoding algorithm implemented by the encoder. The polar code encoding algorithm may be implemented by a plurality of operations, including, for example, exclusive OR (XOR) operations 605 performed where the upper ends of vertical arrow segments intersect horizontal arrow segments and repetition operations 610 performed where the lower ends of vertical arrow segments intersect horizontal arrow segments. Each XOR operation 605 and repetition operation 610 may generate an output, and the XOR operations 605 and repetition operations 610 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y includes bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a non-shortening puncturing scheme before the bits are transmitted. Unknown bit puncturing is one form of non-shortening puncturing and involves refraining from transmitting a set of LSBs of the codeword Z (e.g., LSBs Z0, Z1, and Z2). The set of LSBs that are punctured are bits of the codeword Z that are dependent on the computation of other bits of the codeword Z. As illustrated, the puncture of a contiguous set of three (3) LSBs of codeword Z results in a puncture of a non-contiguous set of bits in codeword Y. Block puncturing may refer to a puncturing of a contiguous set of bit locations in codeword Z (which may start from bit 0 downward). Polar coding scheme 700 may implement similar techniques to those described with reference to FIG. 4 to accommodate puncturing in the encoding process.

Figure 7:
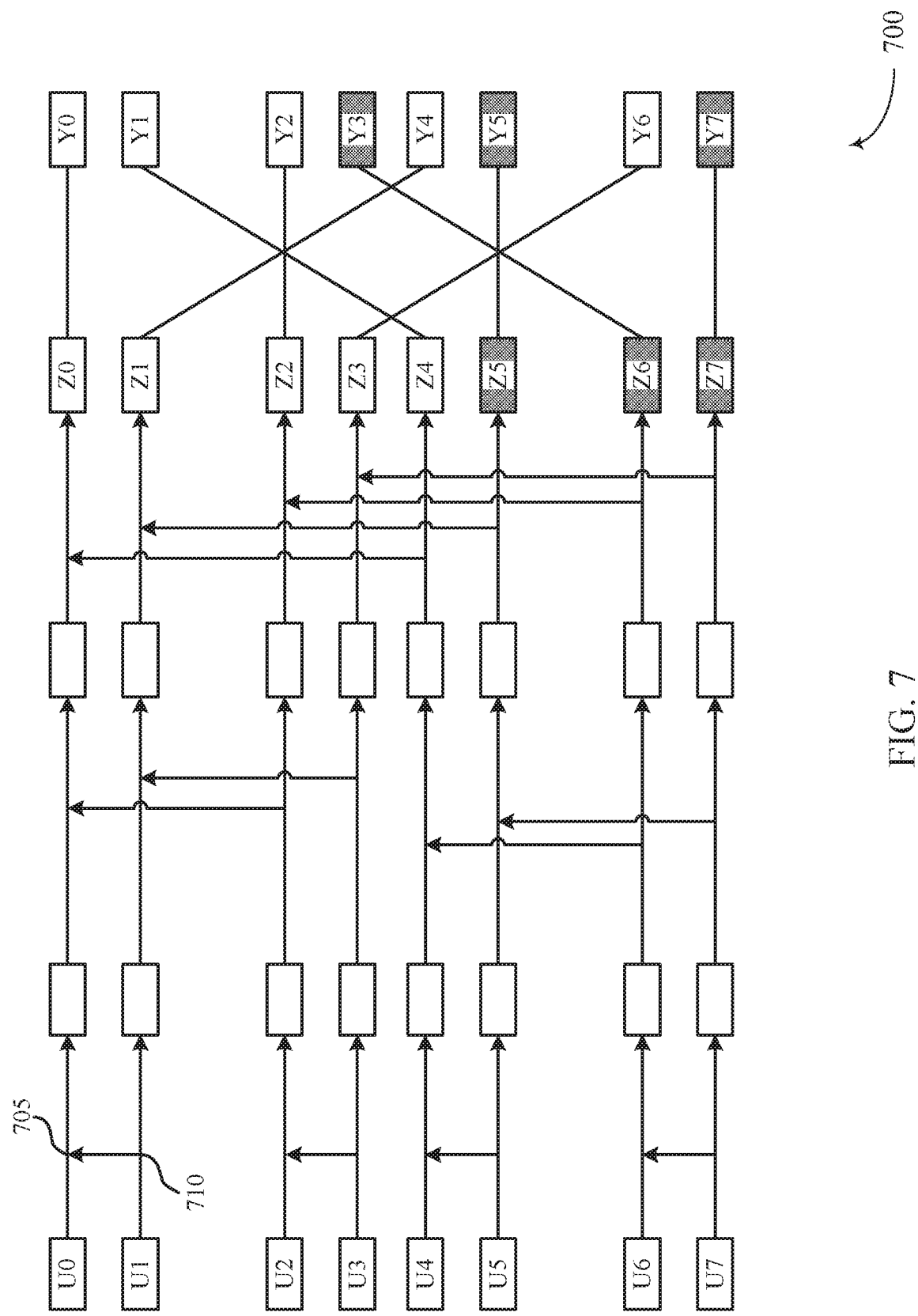

FIG. 7 illustrates an example of a polar coding scheme 700 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7) including information bits, frozen bits, and/or parity bits. The set of bits may be encoded in a codeword Z using a polar code encoding algorithm implemented by the encoder. The polar code encoding algorithm may be implemented by a plurality of operations, including, for example, XOR operations 705 performed where the upper ends of vertical arrow segments intersect horizontal arrow segments and repetition operations 710 performed where the lower ends of vertical arrow segments intersect horizontal arrow segments. Each XOR operation 705 and repetition operation 710 may generate an output, and the XOR operations 705 and repetition operations 710 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y includes bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a shortening puncturing scheme before the bits are transmitted. In the present example, shortening (or known bit puncturing) may include the puncturing of a set of MSBs of the codeword Z and zeroing of corresponding locations in U with the same indices. In some examples, zeroing may be equivalent to any known bit value (e.g., a logic 0 or a logic 1). As illustrated, the puncturing of a contiguous set of three (3) MSBs of codeword Z results in the puncturing of a non-contiguous set of bits in codeword Y. This type of puncturing may be referred to as natural order shortening. Polar coding scheme 700 may implement similar techniques to those described with reference to FIG. 5 to accommodate puncturing in the encoding process.

Figure 8:
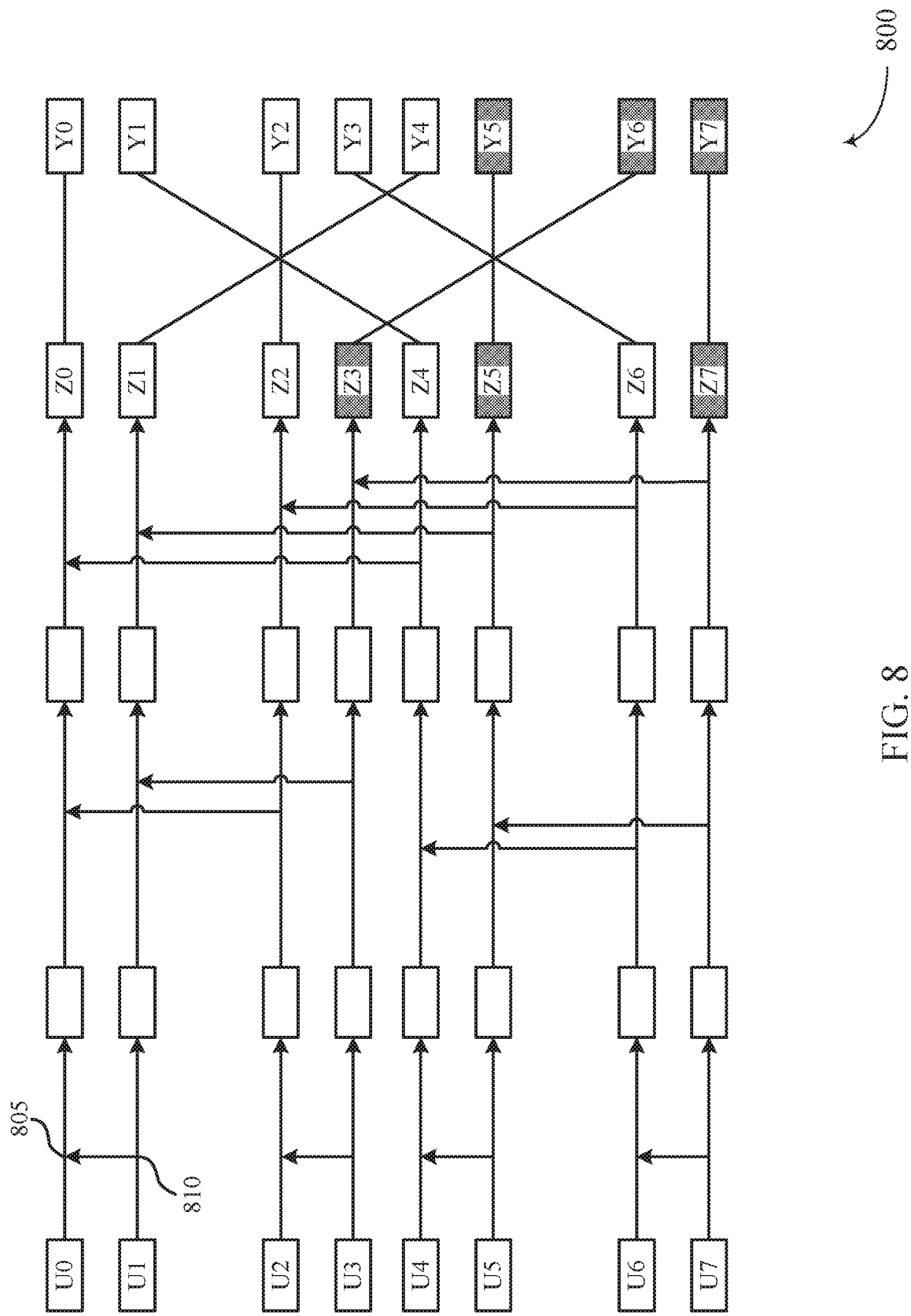

FIG. 8 illustrates an example of a polar coding scheme 800 that supports a mutual-information based recursive polar code construction in accordance with various aspects of the present disclosure. An encoder at a transmitting device may receive an input vector (U) with a set of bits (e.g., U0, U1, U2, U3, U4, U5, U6, and U7) including information bits, frozen bits, and/or parity bits. The set of bits may be encoded in a codeword Z using a polar code encoding algorithm implemented by the encoder. The polar code encoding algorithm may be implemented by a plurality of operations, including, for example, XOR operations 805 performed where the upper ends of vertical arrow segments intersect horizontal arrow segments and repetition operations 810 performed where the lower ends of vertical arrow segments intersect horizontal arrow segments. Each XOR operation 805 and repetition operation 810 may generate an output, and the XOR operations 805 and repetition operations 810 may be performed on a number of interconnected bit-channels to generate the codeword Z.

The codeword Z includes a set of bits (e.g., Z0, Z1, Z2, Z3, Z4, Z5, Z6, and Z7) that may be transmitted over a physical channel. Codeword Y includes bits Y0, Y1, Y2, Y3, Y4, Y5, Y6, and Y7, which may be in a bit-reversed order compared to the bits of the codeword Z. The transmitter may transmit codeword Z (non-bit-reversed) or codeword Y (bit-reversed). In some cases, the codewords Y or Z may be punctured in accordance with a shortening puncturing scheme before the bits are transmitted. In the present example, shortening (or known bit puncturing) may include the puncturing of a set of MSBs of the codeword Y and zeroing of corresponding locations in U with the indices that are bit-reversed compared to the bit locations zeroed in codeword Y. In some examples, zeroing may be equivalent to any known bit value (e.g., a logic 0 or a logic 1). As illustrated, the puncturing of a contiguous set of three (3) MSBs of codeword Y results in the puncturing of a non-contiguous set of bits in codeword Z. This type of puncturing may be referred to as bit-reversed order shortening. Polar coding scheme 800 may implement similar techniques to those described with reference to FIG. 5 to accommodate puncturing in the encoding process.

Figure 9A:
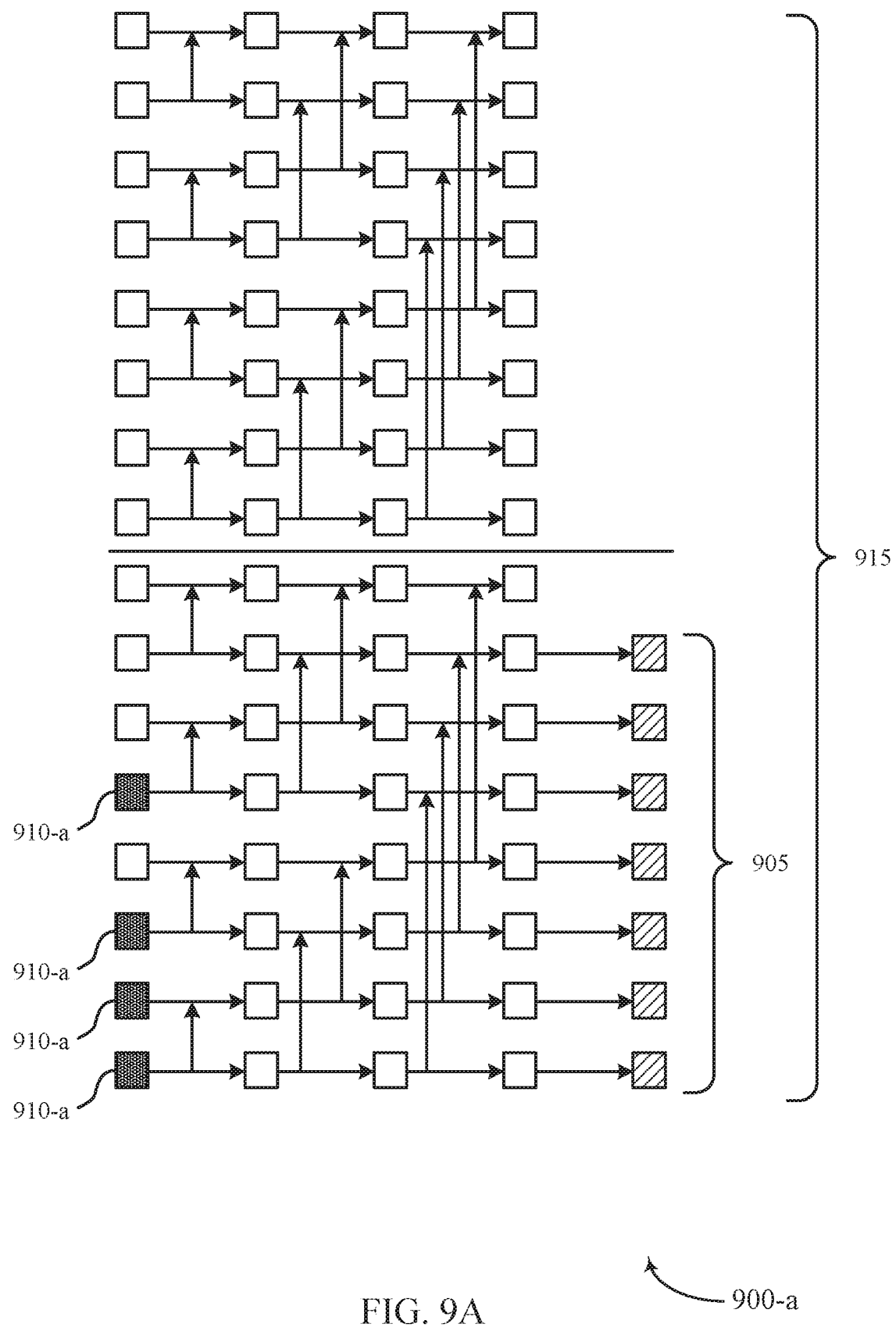
FIGS. 9A-9C illustrate examples of polar coding schemes that support a mutual-information based recursive polar code construction in accordance with various aspects of the present disclosure.
Figure 9B:
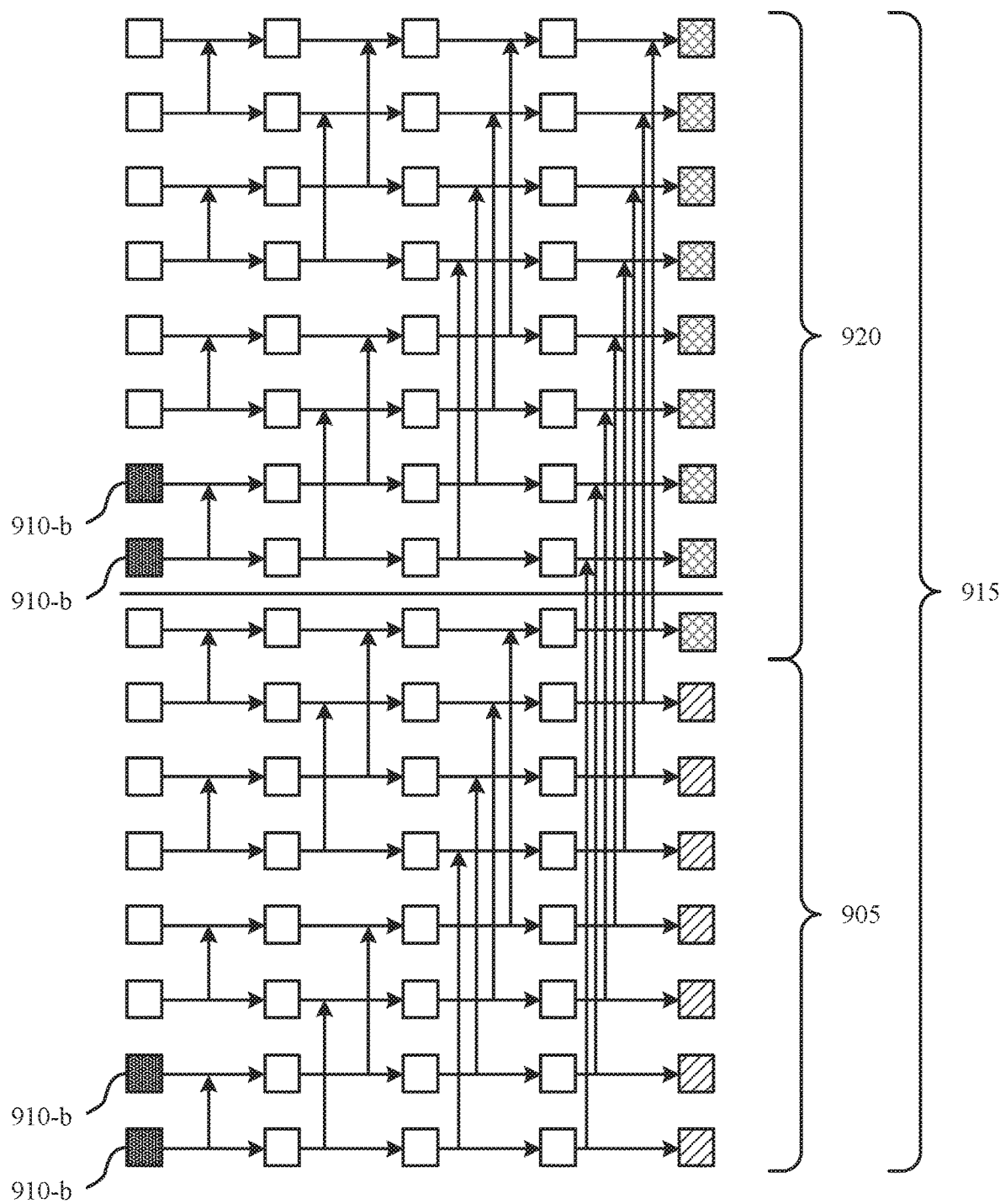
Figure 9C:
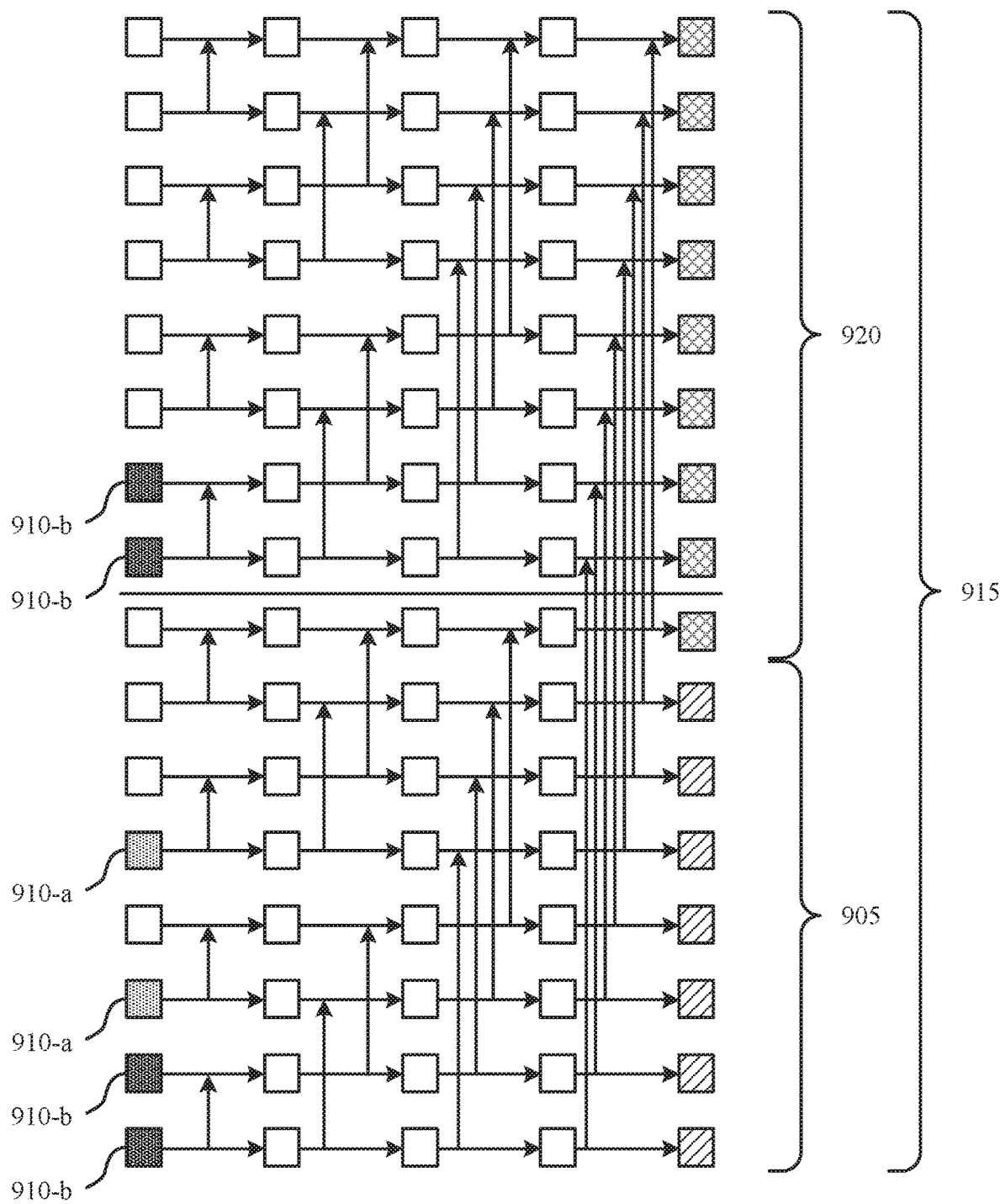

FIGS. 9A-9C illustrate examples of polar coding schemes 900 that support mutual-information based recursive polar code construction in accordance with various aspects of the present disclosure. In the example of FIG. 9A, a transmitting device may identify a first set of codeword bits 905 to transmit to a receiving device. The first set of codeword bits 905 may represent a subset of a polar encoded codeword 915 for a given code length N (e.g., using puncturing) to be generated from K information bits, with K=4 in the illustrated example. As such, the transmitting device may use the techniques described above with reference to FIGS. 1-8 to identify appropriate bit-channels to use to encode the information bits. For instance, the transmitting device may identify that polarized bit-channels 910-$a$ are associated with the highest reliabilities, and the transmitting device may map the information bits to the polarized bit-channels 910-$a$. The transmitting device may then encode the information bits along with other bits (e.g., frozen bits) to generate the codeword and select the first set of codeword bits 905 to be transmitted to a receiving device.

In some cases, the transmitting device may receive a message (e.g., a HARQ message) from the receiving device that indicates that the decoding of the codeword was unsuccessful based on the first set of codeword bits 905. The transmitting device may be configured to retransmit encoded bits generated from the information bits to the receiving device. In particular, as illustrated in FIG. 9B, the transmitting device may identify a second set of codeword bits 920 generated a polar code with a longer code length to transmit to the receiving device. Because the receiving device now has received at least one copy of each of the codeword bits 915, the effective capacity (e.g., required capacity) of each received codeword bit is lower than for the first set of codeword bits 905. Based on the different codeword bit capacity, the transmitting device may identify that a second, different set of polarized bit-channels 910-$b$ are associated with the highest reliabilities, and the transmitting device may map the information bits to the polarized bit-channels 910-$b$. The second set of polarized bit-channels 910-$b$ may be identified using the mutual information recursion techniques described above with reference to FIGS. 3-8.

As described herein, to keep the values of the bits mapped to the polarized bit-channels consistent in the first and second transmissions and, at the same time, utilize the best information bit locations for a transmission, the transmitting device may copy a subset of the information bits and map this subset of the information bits to polarized bit-channels 910-$a$, as illustrated in FIG. 9C. That is, the transmitting device may copy a subset of the information bits and map this subset of the information bits to polarized bit-channels used to transmit the same information bits in the first transmission. Accordingly, a receiving device may be able to combine the first set of codeword bits 905 and the second set if codeword bits 920 to result in a combined codeword 915 for decoding. The receiving device may then determine the information bits at the locations 910-$a$ and 910-$b$ (including the copied information bits) by decoding the combined codeword 915. Although the examples described above discuss that the lengths of the first and second codewords may be different, it is to be understood that the lengths of the first and second codewords may be the same. Additionally, the example shows that the first set of codeword bits 905 and the second set of codeword bits 920 span the codeword length of $2^m$ 915, which may not necessarily be the case. For example, the sum of the codeword bits in the first set of codeword bits 905 and the second set of codeword bits may be less than $2^m$ 915.

Further, the example described with reference to FIGS. 9A-9C is directed to decoding according to a same decoding order across the first transmission and the second transmission. However, in other examples, a receiving device may decode the first and second transmissions according to different decoding orders. For example, the receiving device may decode the first transmission according to a sequential decoding order (e.g., starting from a top bit channel and ending at a bottom bit channel), and the receiving device may decode the second transmission according to a different decoding order (e.g., starting with even bit channels and ending with odd bit channels). In this case, the location of the information bits introduced in the second transmission may be determined based on the decoding order, and the bits to be copied to bit locations of the first transmission may be selected based on the decoding order.

Figure 10:
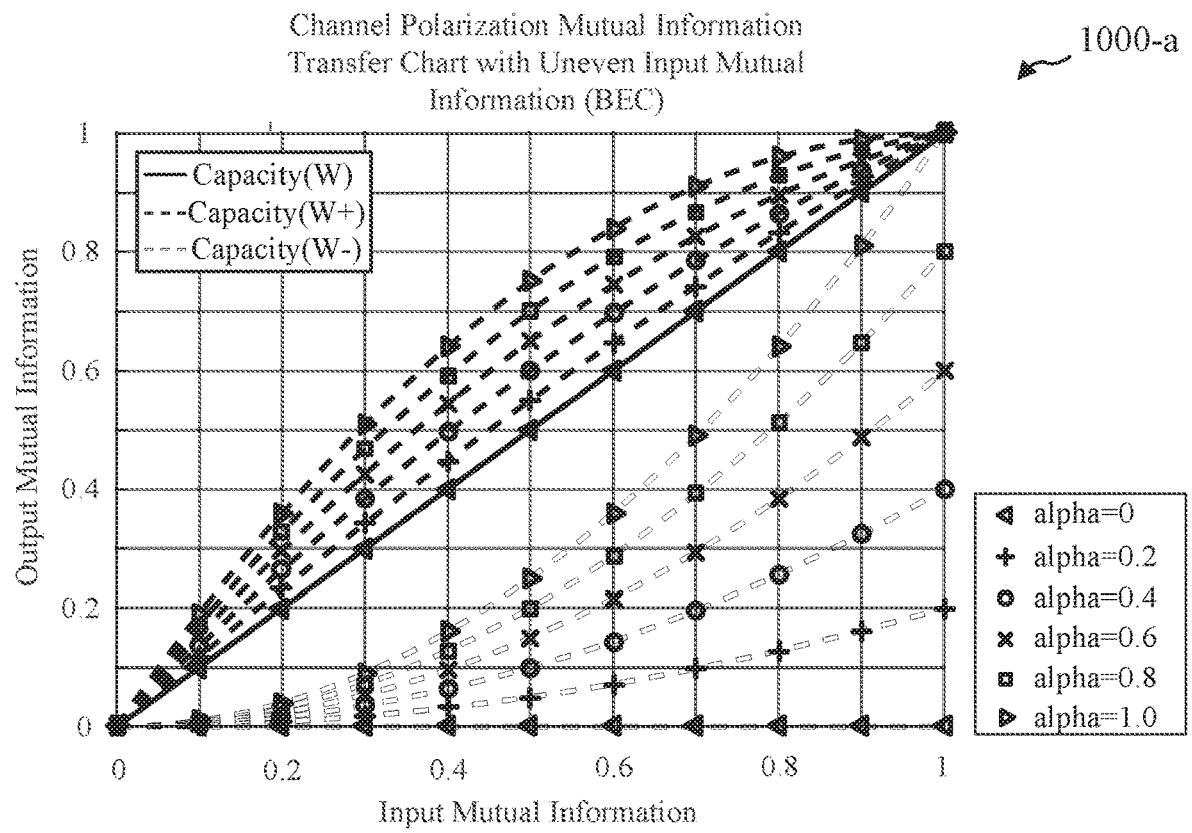
FIG. 10 illustrates an example of a channel polarization mutual information transfer function in accordance with various aspects of the present disclosure.
Figure 10:
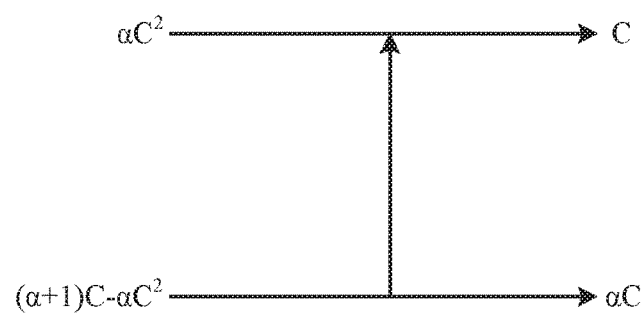

FIG. 10 illustrates an example of a channel polarization mutual information transfer function that supports mutual-information based recursive polar code construction in accordance with various aspects of the present disclosure. The mutual information transfer function may be used to derive channel polarization mutual information transfer chart with uneven input mutual information 1000-$a$. As described with reference to FIGS. 3-5, the channel polarization mutual information transfer function may be used to determine the mutual information of polarized bit-channels (e.g., polarized bit-channels W+ and W−) based on the mutual information of a bit-channel 'W.' Similarly, the channel polarization mutual information transfer function may be used to recursively determine the mutual information of polarized bit-channels. In some cases, however, the computational complexity associated with a mutual information transfer function (e.g., such as those described with reference to FIGS. 4 and 5) may be high, which may be detrimental to implementations at a UE 115. Thus, less computationally complex mutual information transfer functions may be desirable.

The mutual information transfer function as described in the present example may be less computationally complex than other mutual information transfer functions (e.g., such as those described with reference to FIGS. 4 and 5). The mutual information transfer function as described in the present example may be derived based on a BEC, whereas other mutual information transfer functions may be derived based on an additive white Gaussian noise (AWGN) channel. Computation 1000-b is associated with mutual information transfer chart 1000-a and shows the relationship between the BEC capacity of input bit-channels and the BEC capacity of output polarized bit-channels. Computation 1000-b illustrates the simplicity of the computation used to derive the capacity of polarized bit-channels as compared to computations associated with other mutual information transfer functions. In some cases, however, the mutual information transfer function described in the present example may not align with other mutual information transfer functions derived based on an AWGN channel.

Figure 11A:
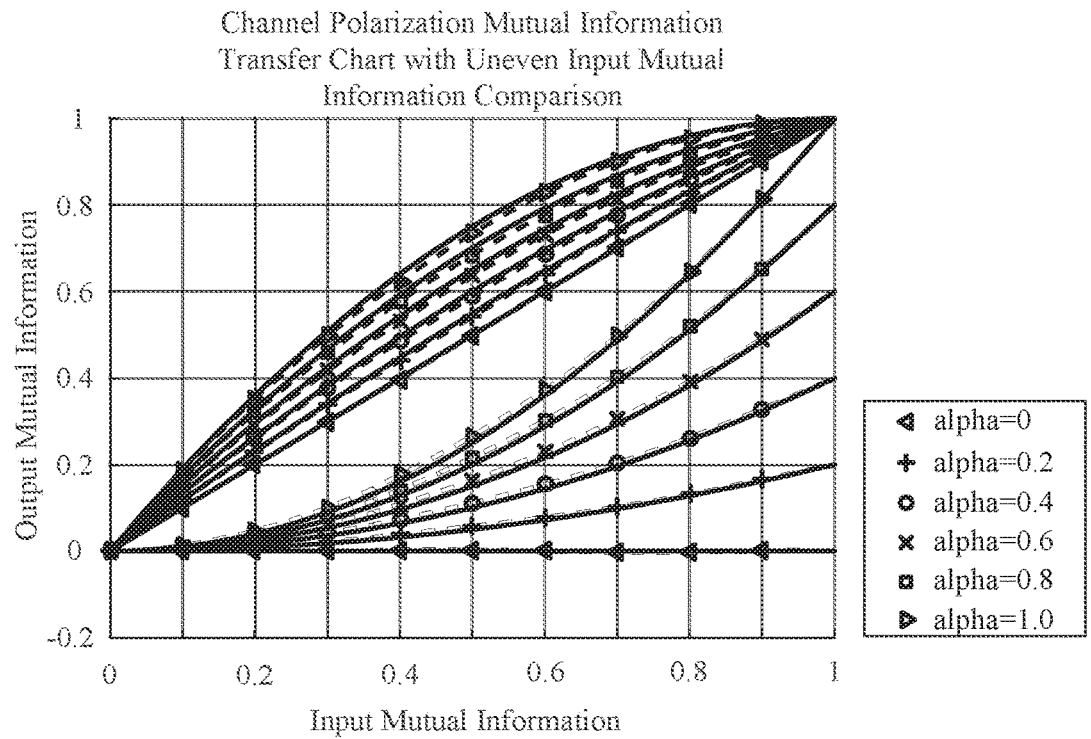
FIGS. 11A and 11B illustrate examples of a channel polarization mutual information transfer function comparison and correction in accordance with various aspects of the present disclosure.
Figure 11B:
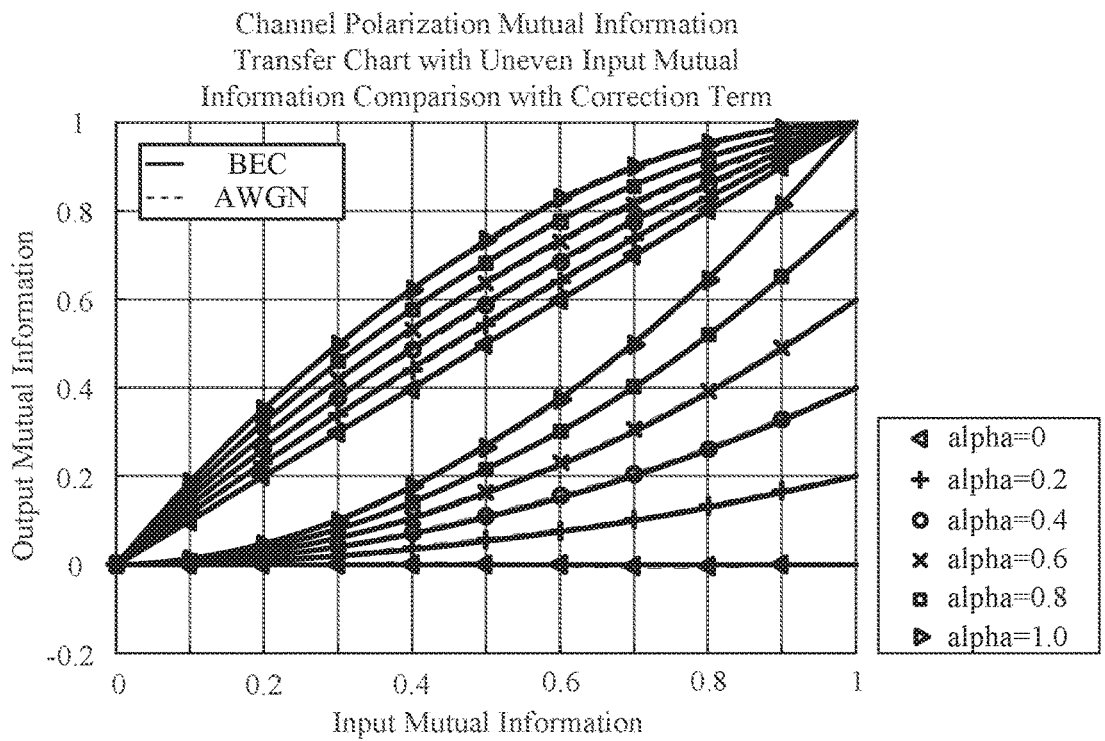

FIG. 11 illustrates an example of a channel polarization mutual information transfer function comparison and correction 1100 that supports mutual-information based recursive polar code construction in accordance with various aspects of the present disclosure. As illustrated in mutual information transfer chart 1100-a, a mutual information transfer chart derived based on a BEC does not align with a mutual information transfer chart derived based on a AWGN channel. Accordingly, an encoder may apply a correction term to the mutual information transfer function derived based on the BEC to align the functions. Specifically, the output capacity of the mutual information transfer function derived based on the BEC $$\text{Output Capacity} = (\alpha+1)C - \alpha C^2 \quad (19)$$

may be adjusted by a correction term to align the graphs to give $$\text{Output Capacity} = (\alpha+1)C - \alpha C^2 - \delta \quad (20)$$

where $$\delta = (F1e^{F2} * \text{abs}(C+F3) + F4e^{F5}) * \alpha \quad (21)$$

corresponds to an example of the correction term, and C corresponds to a capacity of a bit-channel or mutual information associated with a bit-channel. In some examples, the factors in the equation above may be defined as follows: $F1=-4$, $F2=-2$, $F3=-0.5$, $F4=2$, and $F5=-2$. Mutual information transfer chart 1100-b represents a mutual information transfer chart derived based on the BEC and the correction term described above.

Figure 12:
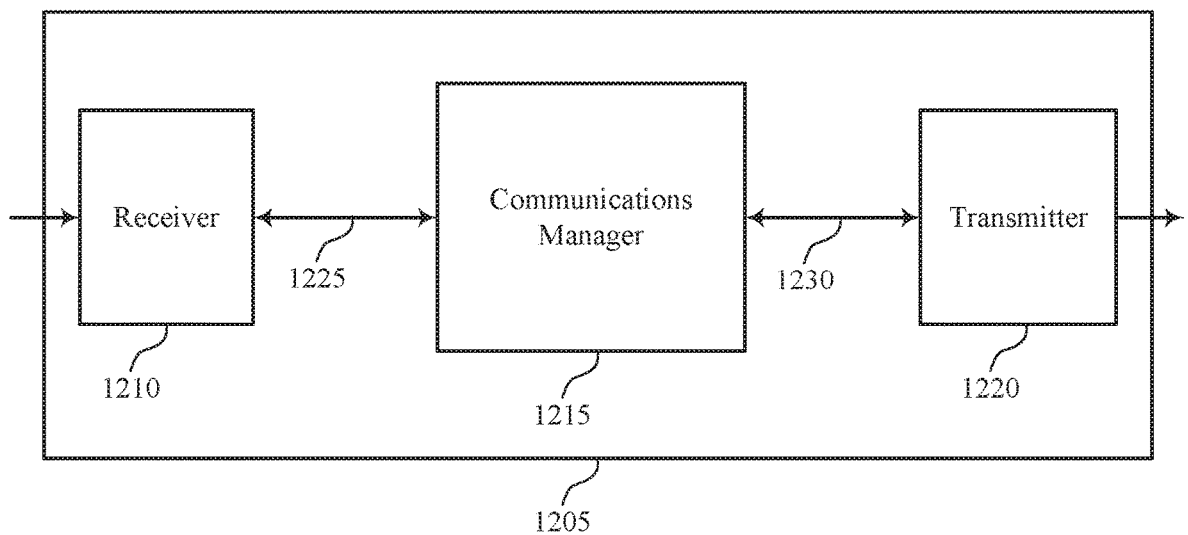
FIGS. 12-16 show block diagrams of a device that supports a mutual-information based recursive polar code construction in accordance with various aspects of the present disclosure.

FIG. 12 shows a block diagram 1200 of a wireless device 1205 that supports mutual-information based recursive polar code construction in accordance with aspects of the present disclosure. Wireless device 1205 may be an example of aspects of a UE 115 or base station 105 as described with reference to FIG. 1. Wireless device 1205 may include receiver 1210, communications manager 1215, and transmitter 1220, wireless device 1205 may also include a processor. Each of these components may be in communication with one another (e.g., via one or more buses).

Receiver 1210 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device, for example, via link 1225. The receiver 1210 may be an example of aspects of the transceiver 1835 or the transceiver 1835 described with reference to FIGS. 18 and 18. The receiver 1210 may utilize a single antenna or a set of antennas.

Communications manager 1215 may be an example of aspects of the communications manager 1815 or communications manager 1815 described with reference to FIGS. 18 and 18. Communications manager 1215 and/or at least some of its various sub-components may be implemented in hardware, software executed by a processor, firmware, or any combination thereof. If implemented in software executed by a processor, the functions of the communications manager 1215 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The communications manager 1215 and/or at least some of its various sub-components may be physically located at various positions, including being distributed such that portions of functions are implemented at different physical locations by one or more physical devices. In some examples, communications manager 1215 and/or at least some of its various sub-components may be a separate and distinct component in accordance with various aspects of the present disclosure. In other examples, communications manager 1215 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 1215 may identify a set of punctured bit locations in the received codeword, identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and decode the received codeword according to the polar code to obtain an information bit vector at the set of bit locations.

The communications manager 1215 may also identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term and process the received codeword according to the polar code to obtain an information bit vector at the set of bit locations.

The communications manager 1215 may also identify a set of punctured bit locations for transmission of a codeword, the codeword to be generated from an information bit vector using a polar code, identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword, and encode the information bit vector mapped to the set of bit locations using the polar code to obtain the codeword.

The communications manager 1215 may also identify an information bit vector for encoding using a polar code, identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term, and encode the information bit vector mapped to the set of bit locations using the polar code to obtain a codeword.

Transmitter 1220 may transmit signals generated by other components of the device. In some examples, the transmitter 1220 may be collocated with a receiver 1210 in a transceiver module. In some cases, transmitter 1220 may be in communication with communications manager 1215 via link 1230. For example, the transmitter 1220 may be an example of aspects of the transceiver 1835 or the transceiver 1835 described with reference to FIGS. 18 and 18. The transmitter 1220 may utilize a single antenna or a set of antennas. Transmitter 1220 may transmit the codeword over a wireless channel, where, in some cases, the transmitting includes puncturing the codeword at the set of punctured bit locations.

Figure 13:
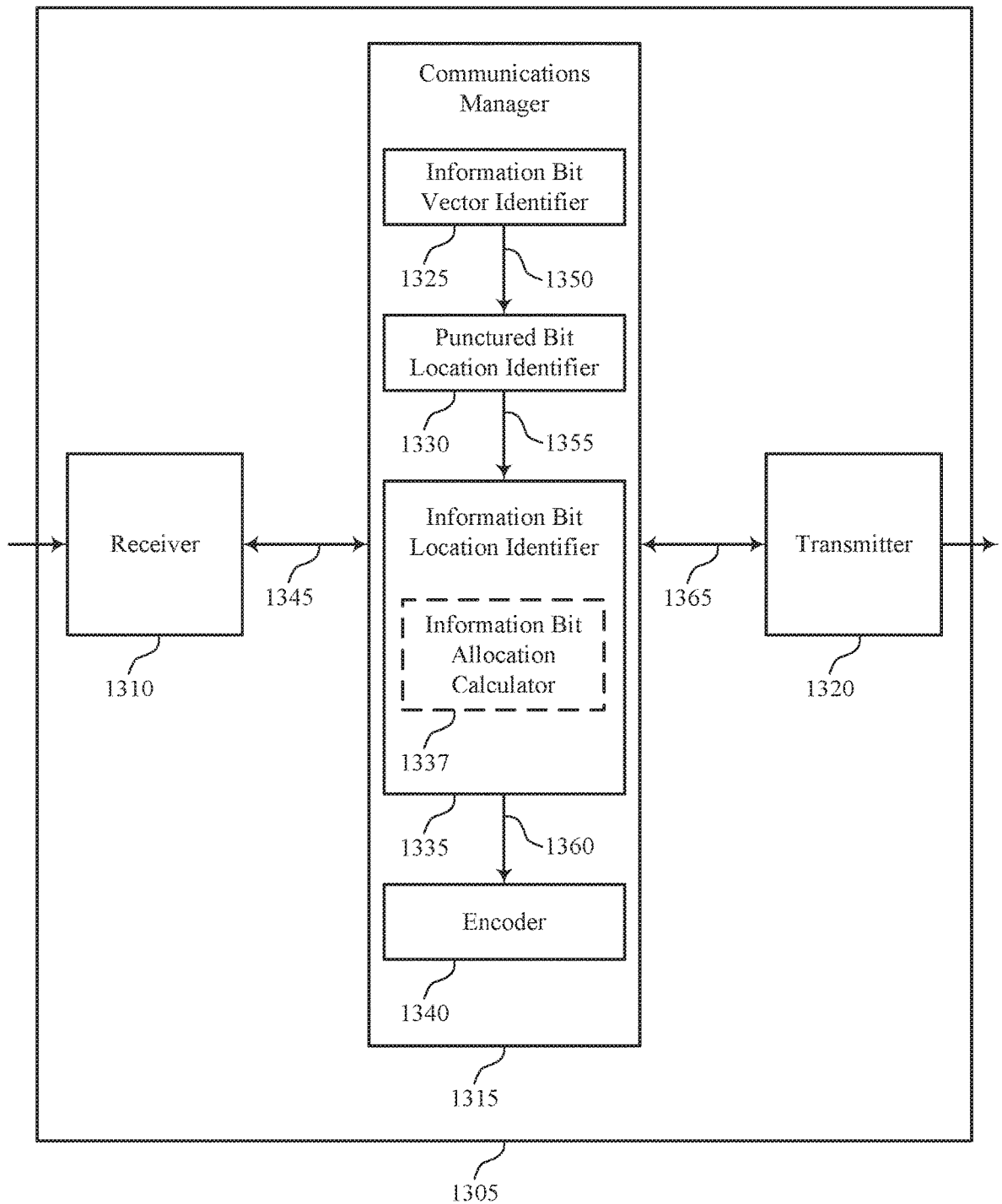

FIG. 13 shows a block diagram 1300 of a wireless device 1305 that supports mutual-information based recursive polar code construction in accordance with aspects of the present disclosure. Wireless device 1305 may be an example of aspects of a wireless device 1205 or a UE 115 or base station 105 as described with reference to FIGS. 1 and 12. Wireless device 1305 may include receiver 1310, communications manager 1315, and transmitter 1320, wireless device 1305 may also include a processor. Each of these components may be in communication with one another (e.g., via one or more buses).

Receiver 1310 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device, for example, via link 1345. The receiver 1310 may be an example of aspects of the transceiver 1835 or the transceiver 1835 described with reference to FIGS. 18 and 18. The receiver 1310 may utilize a single antenna or a set of antennas.

Transmitter 1320 may transmit signals generated by other components of the device. In some cases, transmitter 1320 may be in communication with communications manager 1315 via link 1365. In some examples, the transmitter 1320 may be collocated with a receiver 1310 in a transceiver module. For example, the transmitter 1320 may be an example of aspects of the transceiver 1835 or the transceiver 1835 described with reference to FIGS. 18 and 18. The transmitter 1320 may utilize a single antenna or a set of antennas.

Communications manager 1315 may be an example of aspects of the communications manager 1815 or communications manager 1815 described with reference to FIGS. 18 and 18. Communications manager 1315 may include information bit vector identifier 1325, punctured bit location identifier 1330, information bit location identifier 1335, and encoder 1340.

In some aspects, information bit vector identifier 1325 may identify an information bit vector for encoding using a polar code, and information bit vector identifier 1325 may pass the information bit vector 1350 to punctured bit location identifier 1330. Punctured bit location identifier 1330 may identify a set of punctured bit locations for transmission of a codeword, the codeword to be generated from the information bit vector using a polar code. Punctured bit location identifier 1330 may then pass the punctured bit locations 1355 to information bit location identifier 1335.

Information bit location identifier 1335 may identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword.

In some cases, the target mutual information is determined as the number of the information bits divided by the number of un-punctured bit locations in the received codeword. In some cases, the result of the division/inversion operation is derived from a table (e.g., as discussed above with reference to FIG. 5). In some cases, for the at least one stage of polarization, a capacity of each bit-channel of each of the bit-channel partitions is determined based on bit-channel capacities of input bit-channels from the previous stage of polarization and the mutual information transfer function. In some cases, the mutual information transfer function is based on a BEC function and, additionally and optionally, a correction term.

In some examples, information bit location identifier 1335 may include information bit allocation calculator 1337 which may calculate the number of information bits to be allocated in different bit-channel partitions/groups of the polar code based on the set of punctured bit locations. For example, information bit allocation calculator 1337 may identify the information bit allocation based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword. Information bit location identifier 1335 may then identify the set of bit locations of the polar code to be used for the information bits based on the information bit allocation.

Information bit location identifier 1335 may then pass the information bit locations 1360 to encoder 1340, and encoder 1340 may encode the information bit vector mapped to the set of bit locations using the polar code to obtain the codeword. Encoder 1340 may then pass the codeword to transmitter 1320 via link 1365, and transmitter 1320 may transmit the codeword over a wireless channel. In some cases, the transmitting may include puncturing the codeword at the set of punctured bit locations.

In other aspects, information bit vector identifier 1325 may identify an information bit vector for encoding using a polar code, and information bit vector identifier 1325 may pass the information bit vector (not shown) to information bit location identifier 1335. Information bit location identifier 1335 may identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and a correction term.

In some examples, information bit location identifier 1335 may include information bit allocation calculator 1337 which may identify an information bit allocation of the information bits of the information bit vector to bit-channel partitions of the polar code based on the BEC and the correction term. For example, information bit allocation calculator 1337 may identify the information bit allocation based on a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term. Information bit location identifier 1335 may then identify the set of bit locations of the polar code to be used for the information bits based on the information bit allocation (e.g., via a sequence, table, or equation for determining the information bit locations with each partition).

In some cases, the correction term is based on a function of a bit-channel capacity of the at least one stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity.

Information bit location identifier 1335 may then pass the information bit locations 1360 to encoder 1340, and encoder 1340 may encode the information bit vector mapped to the set of bit locations using the polar code to obtain a codeword. Encoder 1340 may then pass the codeword to transmitter 1320 via link 1365, and transmitter 1320 may transmit the codeword over a wireless channel.

Figure 14:
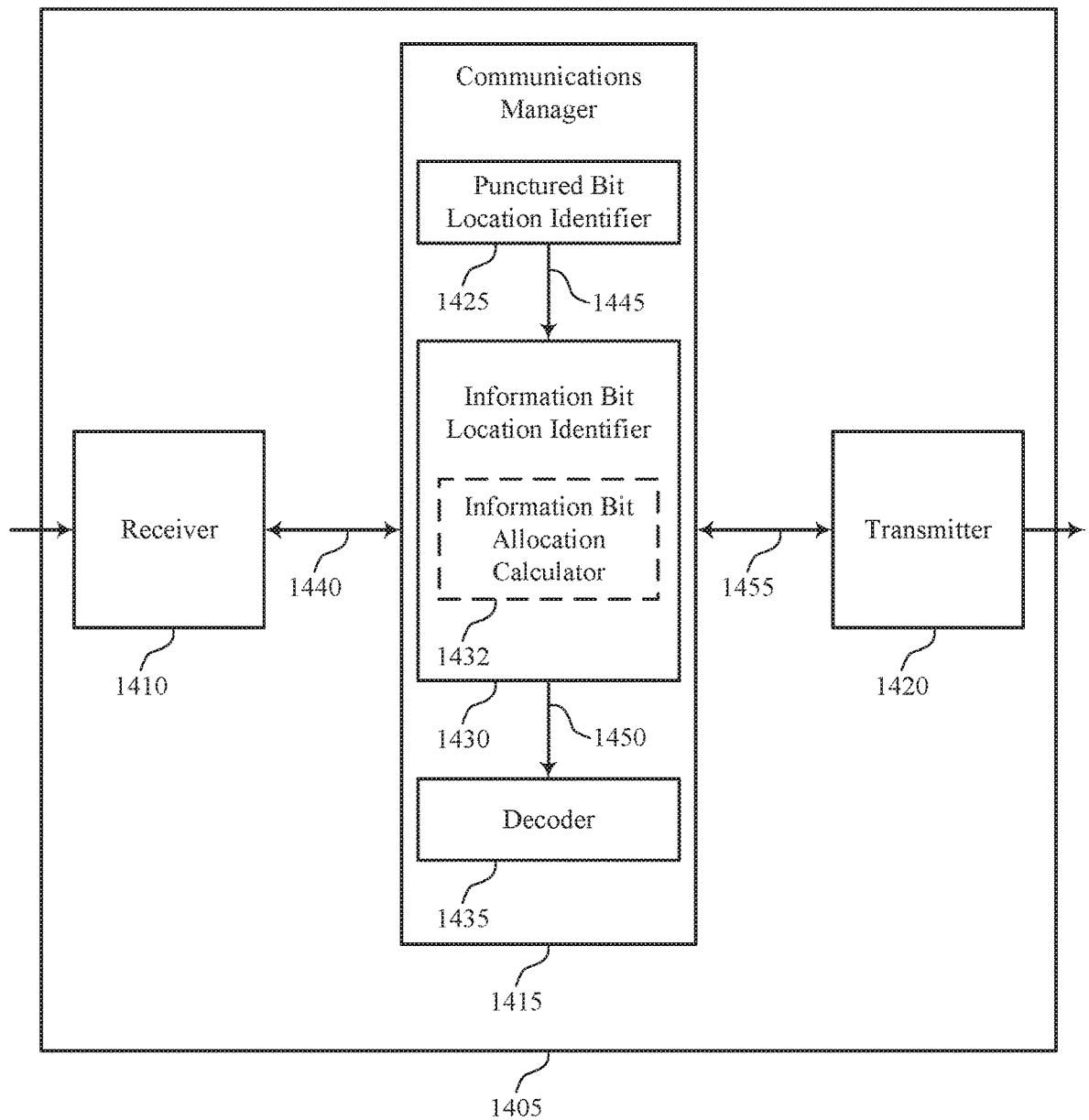

FIG. 14 shows a block diagram 1400 of a wireless device 1405 that supports mutual-information based recursive polar code construction in accordance with aspects of the present disclosure. Wireless device 1405 may be an example of aspects of a wireless device 1205 or a UE 115 or base station 105 as described with reference to FIGS. 1 and 12, wireless device 1405 may include receiver 1410, communications manager 1415, and transmitter 1420. Wireless device 1405 may also include a processor. Each of these components may be in communication with one another (e.g., via one or more buses).

Receiver 1410 may receive signaling via an antenna. In some examples, the signaling may be encoded in one or more codewords using a polar code. The receiver may process the signaling (e.g., downconversion, filtering, analog-to-digital conversion, baseband processing) and may pass the processed signaling on to other components of the wireless device, for example, via link 1440. The receiver 1410 may be an example of aspects of the transceiver 1835 or the transceiver 1835 described with reference to FIGS. 18 and 18. The receiver 1410 may utilize a single antenna or a set of antennas.

Transmitter 1420 may transmit signals generated by other components of the device. In some cases, transmitter 1420 may be in communication with communications manager 1415 via link 1455. In some examples, the transmitter 1420 may be collocated with a receiver 1410 in a transceiver module. For example, the transmitter 1420 may be an example of aspects of the transceiver 1835 or the transceiver 1835 described with reference to FIGS. 18 and 18. The transmitter 1420 may utilize a single antenna or a set of antennas.

Communications manager 1415 may be an example of aspects of the communications manager 1815 or the communications manager 1815 described with reference to FIGS. 18 and 18. Communications manager 1415 may include punctured bit location identifier 1425, information bit location identifier 1430, and decoder 1435.

In some aspects, receiver 1410 may receive a codeword over a wireless channel, the codeword being encoded using a polar code, and receiver 1410 may pass the received codeword to punctured bit location identifier 1425 via link 1440. Punctured bit location identifier 1425 may then identify a set of punctured bit locations in the received codeword, and punctured bit location identifier 1425 may pass information 1445 about the punctured bit locations of the received codeword to information bit location identifier 1430.

Information bit location identifier 1430 may identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword.

In some cases, the target mutual information is determined as the number of the information bits divided by the number of un-punctured bit locations in the received codeword. In some cases, for the at least one stage of polarization, a capacity of each bit-channel of each of the bit-channel partitions is determined based on bit-channel capacities of input bit-channels from the previous stage of polarization and the mutual information transfer function. In some cases, the mutual information transfer function is based on a BEC function and, additionally and optionally, a correction term.

In some examples, information bit location identifier 1430 may include an information bit allocation calculator 1432 which may calculate the number of information bits to be allocated in different bit-channel partitions/groups of the polar code based on the set of punctured bit locations. In some cases, information bit allocation calculator 1432 may calculate the number of information bits to be allocated in different bit-channel partitions/groups based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword. Information bit location identifier 1430 may then identify a set of bit locations of the polar code used for the information bits for the encoding based on the information bit allocation.

Information bit location identifier 1430 may then pass information 1450 about the information bit locations of the received codeword to decoder 1435, and decoder 1435 may decode the received codeword according to the polar code to obtain an information bit vector at the set of bit locations.

In other aspects, receiver 1410 may receive a codeword that is encoded using a polar code, and receiver 1410 may pass the received codeword to information bit location identifier 1430 via link 1440. Information bit location identifier 1430 may then identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term.

In some examples, information bit location identifier 1430 may include an information bit allocation calculator 1432 which may identify an information bit allocation of information bits in the codeword to bit-channel partitions of the polar code based on the BEC and the correction term. For example, information bit allocation calculator 1432 may identify the information bit allocation based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term. Information bit location identifier 1430 may then identify the set of bit locations of the polar code used for information bits for the encoding based on the information bit allocation.

In some cases, the correction term is based on a function of a bit-channel capacity of the at least one stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity.

Information bit location identifier 1430 may then pass information 1450 about the information bit locations of the received codeword to the decoder 1435, and decoder 1435 may process the received codeword according to the polar code to obtain an information bit vector at the set of bit locations.

Figure 15:
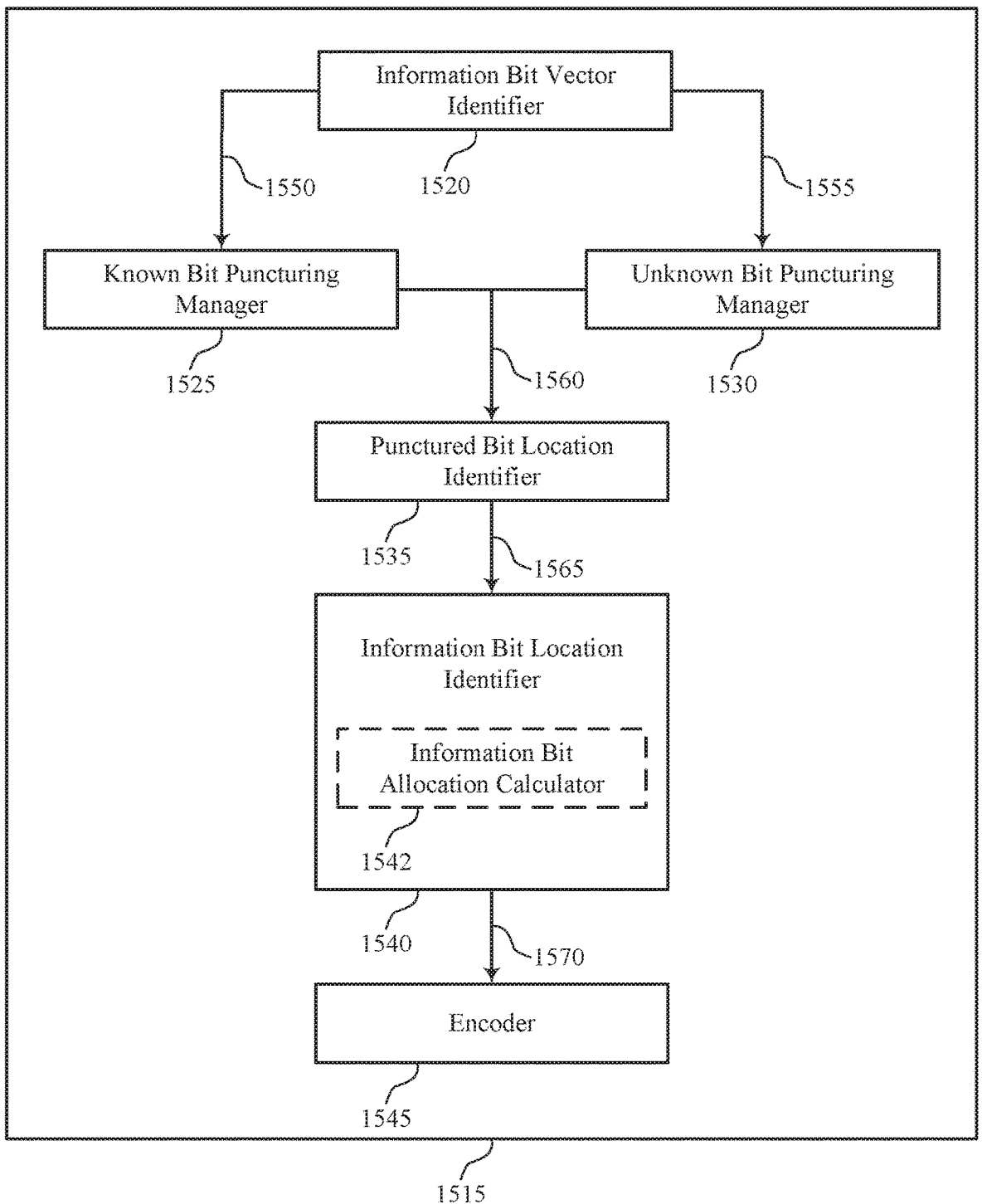

FIG. 15 shows a block diagram 1500 of a communications manager 1515 that supports mutual-information based recursive polar code construction in accordance with aspects of the present disclosure. The communications manager 1515 may be an example of aspects of a communications manager 1215, a communications manager 1315, a communications manager 1815, or a communications manager 1815 described with reference to FIGS. 12, 13, 18, and 18. The communications manager 1515 may include information bit vector identifier 1520, known bit puncturing manager 1525, unknown bit puncturing manager 1530, punctured bit location identifier 1535, information bit location identifier 1540, and encoder 1545. Each of these modules may communicate, directly or indirectly, with one another (e.g., via one or more buses).

In some aspects, information bit vector identifier 1520 may identify an information bit vector for encoding using a polar code, and information bit vector identifier 1520 may pass the information bit vector 1550 to known bit puncturing manager 1525 and/or the information bit vector 1555 to unknown bit puncturing manager 1530. In one example, known bit puncturing manager 1525 may identify a set of bits to be punctured in a codeword generated from the information bit vector, where the set of punctured bit locations corresponds to shortening-based puncturing of the codeword. In another example, unknown bit puncturing manager 1530 may identify a set of bits to be punctured in a codeword generated from the information bit vector, where the set of punctured bit locations corresponds to non-shortening based puncturing of the codeword. In some cases, the non-shortening based puncturing includes block puncturing. Known bit puncturing manager 1525 and/or unknown bit puncturing manager 1530 may then pass information 1560 about the set of bits to be punctured in the codeword to puncturing bit location identifier 1535.

Punctured bit location identifier 1535 may identify a set of punctured bit locations for transmission of the codeword. Punctured bit location identifier 1535 may then pass the punctured bit locations 1565 to information bit location identifier 1540. Information bit location identifier 1540 may identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword.

In some examples, information bit location identifier 1540 may include information bit allocation calculator 1542 which may calculate the number of information bits to be allocated in different bit-channel partitions/groups of the polar code based on the set of punctured bit locations. For example, information bit allocation calculator 1542 may identify the information bit allocation based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword. Information bit location identifier 1540 may then identify the set of bit locations of the polar code to be used for the information bits based on the information bit allocation.

In some cases, the set of bit locations of the polar code used for information bits for the encoding is identified based on a table that indicates information bit allocations for different numbers of coded bits, different numbers of information bits, different numbers of punctured bits, different types of puncturing, or a combination thereof. In some cases, the information bits assigned to the bit-channel partitions are assigned to bit-channels of the bit-channel partitions in a predetermined order. In some cases, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof. In some cases, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

In some cases, the information bits assigned to different bit-channel partitions are assigned to bit-channels of the different bit-channel partitions in a same order. In some cases, the information bits assigned to different bit-channel partitions are assigned to bit-channels of the different bit-channel partitions in a different order. In some cases, the information bits assigned to different bit-channel partitions are assigned to bit-channels of the different bit-channel partitions based on a reliability order of bit-channels in each of the bit-channel partitions. In some cases, the reliability order of the bit-channels in each of the bit-channel partitions is derived from a reliability order of all bit-channels in the bit-channel partitions.

In some cases, the set of punctured bit locations corresponds to shortening-based puncturing of the codeword, and a number of the punctured bit locations is added to the number of information bits for assigning to the bit-channel partitions for the first recursive partitioning. In some cases, for the first polarization stage, a capacity of each corresponding bit-channel of the set of punctured bit locations is set to unity. In some cases, the identifying the set of bit locations includes shortening a preliminary set of bit locations determined as a result of the recursive partitioning of the bit-channels by the number of the punctured bit locations. In some cases, for the first polarization stage, a capacity of each corresponding bit-channel of the set of punctured bit locations is set to zero.

In some cases, the target mutual information is determined as the number of the information bits divided by the number of un-punctured bit locations in the received codeword. In some cases, for the at least one stage of polarization, a capacity of each bit-channel of each of the bit-channel partitions is determined based on bit-channel capacities of input bit-channels from the previous stage of polarization and the mutual information transfer function. In some cases, the mutual information transfer function is based on a BEC function and, additionally and optionally, a correction term.

Information bit location identifier 1540 may then pass the information bit locations 1570 to encoder 1545, and encoder 1545 may encode the information bit vector mapped to the set of bit locations using the polar code to obtain the codeword. Encoder 1545 may then pass the codeword to a transmitter, and the transmitter may transmit the codeword over a wireless channel. In some cases, the transmitting may include puncturing the codeword at the set of punctured bit locations.

In some cases, the codeword includes a first set of codeword bits and the set of bit locations includes a first set of bit locations. Information bit location identifier 1540 may receive an indication that decoding of the codeword was unsuccessful, and information bit location identifier 1540 may identify a second set of bit locations to be used for the information bits for encoding of a second set of codeword bits, where, for the encoding of the second set of codeword bits, at least one of the information bits is copied from a bit location of the second set of bit locations to a bit location of the first set of bit locations that is non-overlapping with the second set of bit locations. Information bit location identifier 1540 may then pass the second set of codeword bits to a transmitter, and the transmitter may transmit the second set of codeword bits over the wireless channel in response to receiving the indication that the decoding of the codeword was unsuccessful.

In other aspects, information bit vector identifier 1520 may identify an information bit vector for encoding using a polar code, and information bit vector identifier 1520 may pass the information bit vector (not shown) to information bit location identifier 1540. Information bit location identifier 1540 may identify a set of bit locations of the polar code to be used for information bits of the information bit vector, where the set of bit locations is determined based on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term.

In some examples, information bit location identifier 1540 may include information bit allocation calculator 1542 which may identify an information bit allocation of the information bits of the information bit vector to bit-channel partitions of the polar code based on the BEC and the correction term. For example, information bit allocation calculator 1542 may identify the information bit allocation based on a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term. Information bit location identifier 1540 may then identify the set of bit locations of the polar code to be used for the information bits based on the information bit allocation.

In some cases, the set of bit locations of the polar code used for information bits for the encoding is identified based on a table that indicates information bit allocations for different numbers of coded bits, different numbers of information bits, different numbers of punctured bits, different types of puncturing, or a combination thereof. In some cases, the information bits assigned to the bit-channel partitions are assigned to bit-channels of the bit-channel partitions in a predetermined order. In some cases, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof. In some cases, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

In some cases, the information bits assigned to different bit-channel partitions are assigned to bit-channels of the different bit-channel partitions in a same order. In some cases, the information bits assigned to different bit-channel partitions are assigned to bit-channels of the different bit-channel partitions in a different order. In some cases, the information bits assigned to different bit-channel partitions are assigned to bit-channels of the different bit-channel partitions based on a reliability order of bit-channels in each of the bit-channel partitions. In some cases, the reliability order of the bit-channels in each of the bit-channel partitions is derived from a reliability order of all bit-channels in the bit-channel partitions.

In some cases, the correction term is based on a function of a bit-channel capacity of the at least one stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity.

Information bit location identifier 1540 may then pass the information bit locations 1570 to encoder 1545, and encoder 1545 may encode the information bit vector mapped to the set of bit locations using the polar code to obtain a codeword. Encoder 1545 may then pass the codeword to a transmitter, and the transmitter may transmit the codeword over a wireless channel.

In some cases, the codeword includes a first set of codeword bits and the set of bit locations includes a first set of bit locations. Information bit location identifier 1540 may receive an indication that decoding of the codeword was unsuccessful, and information bit location identifier 1540 may identify a second set of bit locations to be used for the information bits for encoding of a second set of codeword bits, where, for the encoding of the second set of codeword bits, at least one of the information bits is copies from a bit location of the second set of bit locations to a bit location of the first set of bit locations that is non-overlapping with the second set of bit locations. Information bit location identifier 1540 may then pass the second set of codeword bits to a transmitter, and the transmitter may transmit the second set of codeword bits over the wireless channel in response to receiving the indication that the decoding of the codeword was unsuccessful.

Figure 16:
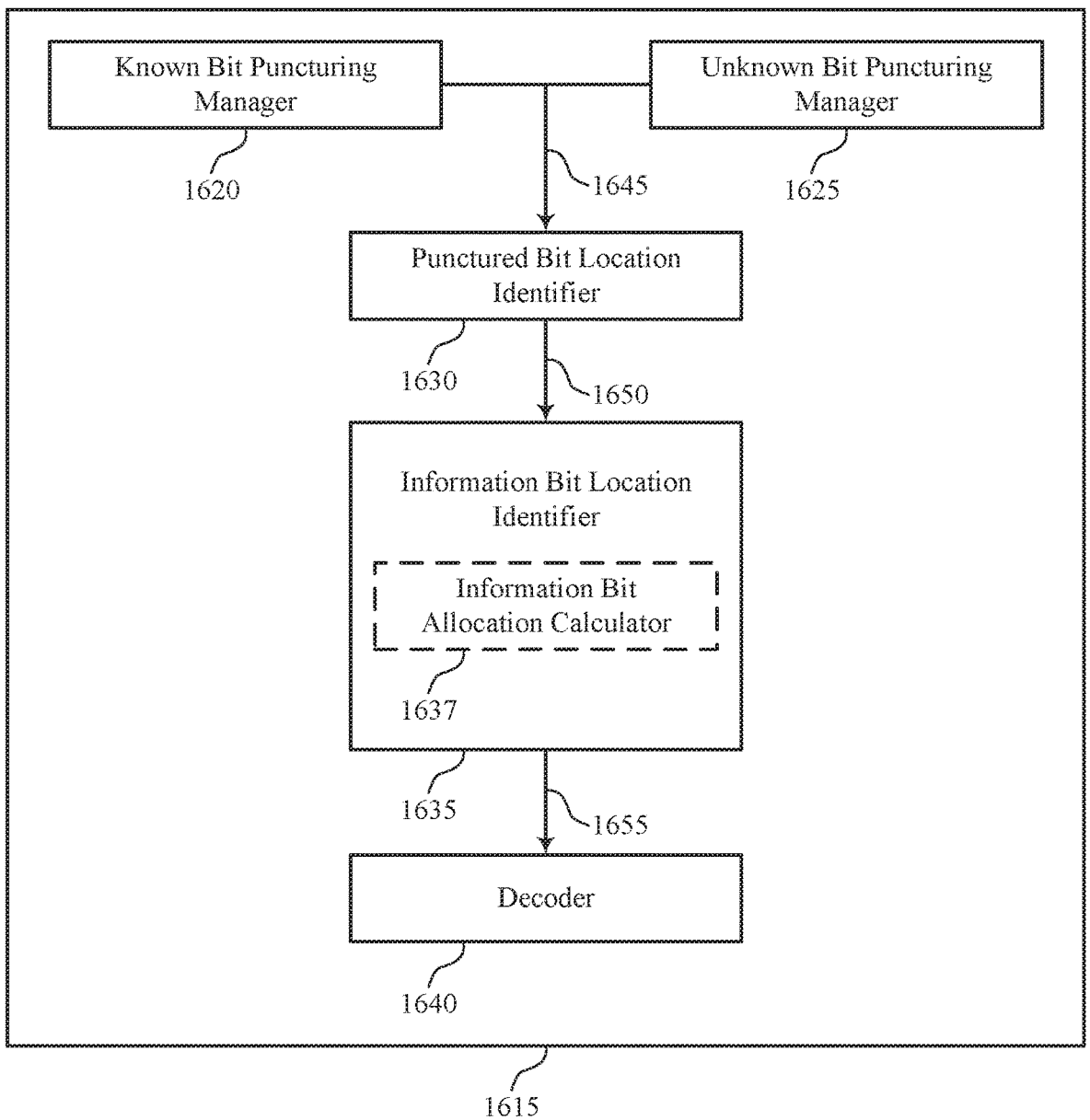

FIG. 16 shows a block diagram 1600 of a communications manager 1615 that supports mutual-information based recursive polar code construction in accordance with aspects of the present disclosure. The communications manager 1615 may be an example of aspects of a communications manager 1215, a communications manager 1415, a communications manager 1815, or a communications manager 1815 described with reference to FIGS. 12, 14, 18, and 18. The communications manager 1615 may include known bit puncturing manager 1620, unknown bit puncturing manager 1625, punctured bit location identifier 1630, information bit location identifier 1635, and decoder 1640. Each of these modules may communicate, directly or indirectly, with one another (e.g., via one or more buses).

In some aspects, a receiver may receive a codeword over a wireless channel, the codeword being encoded using a polar code, and the receiver may pass the received codeword to known bit puncturing manager 1620 or unknown bit puncturing manager 1625. In one example, known bit puncturing manager 1620 may identify a set of bits to be punctured in the received codeword, where the set of punctured bit locations corresponds to shortening-based puncturing of the received codeword. In another example, unknown bit puncturing manager 1625 may identify a set of bits to be punctured in the received codeword, where the set of punctured bit locations corresponds to non-shortening based puncturing of the received codeword. In some cases, the non-shortening based puncturing includes block puncturing. Known bit puncturing manager 1620 and/or unknown bit puncturing manager 1625 may then pass information 1645 about the set of bits to be punctured in the received codeword to puncturing bit location identifier 1630.

Punctured bit location identifier 1630 may identify a set of punctured bit locations in the received codeword, and punctured bit location identifier 1630 may pass information 1650 about the punctured bit locations of the received codeword to information bit location identifier 1635. Information bit location identifier 1635 may identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword.

In some examples, information bit location identifier 1635 may include an information bit allocation calculator 1637 which may calculate the number of information bits to be allocated in different bit-channel partitions/groups of the polar code based on the set of punctured bit locations. For example, information bit location identifier 1637 may determine the information bit allocation based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword. Information bit location identifier 1635 may then identify a set of bit locations of the polar code used for the information bits for the encoding based on the information bit allocation.

In some cases, the set of bit locations of the polar code used for information bits for the encoding is identified based on a table that indicates information bit allocations for different numbers of coded bits, different numbers of information bits, different numbers of punctured bits, different types of puncturing, or a combination thereof. In some cases, the information bits assigned to the bit-channel partitions are assigned to bit-channels of the bit-channel partitions in a predetermined order. In some cases, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof. In some cases, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

In some cases, the information bits assigned to different bit-channel partitions are assigned to bit-channels of the different bit-channel partitions in a same order. In some cases, the information bits assigned to different bit-channel partitions are assigned to bit-channels of the different bit-channel partitions in a different order. In some cases, the information bits assigned to different bit-channel partitions are assigned to bit-channels of the different bit-channel partitions based on a reliability order of bit-channels in each of the bit-channel partitions. In some cases, the reliability order of the bit-channels in each of the bit-channel partitions is derived from a reliability order of all bit-channels in the bit-channel partitions.

In some cases, the set of punctured bit locations corresponds to shortening-based puncturing of the received codeword, and a number of the punctured bit locations is added to the number of the information bits for assigning to the bit-channel partitions for the first recursive partitioning. In some cases, for the first polarization stage, a capacity of each corresponding bit-channel of the set of punctured bit locations is set to unity. In some cases, the identifying the set of bit locations includes shortening a preliminary set of bit locations determined as a result of the recursive partitioning of the bit-channels by the number of the punctured bit locations. In some cases, for the first polarization stage, a capacity of each corresponding bit-channel of the set of punctured bit locations is set to zero (or one for known-bit puncturing (i.e., shortening)).

In some cases, the target mutual information is determined as the number of the information bits divided by the number of un-punctured bit locations in the received codeword. In some cases, for the at least one stage of polarization, a capacity of each bit-channel of each of the bit-channel partitions is determined based on bit-channel capacities of input bit-channels from the previous stage of polarization and the mutual information transfer function. In some cases, the mutual information transfer function is based on a BEC function and, additionally and optionally, a correction term. Information bit location identifier 1635 may then pass information 1655 about the information bit locations of the received codeword to decoder 1640, and decoder 1640 may decode the received codeword according to the polar code to obtain an information bit vector at the set of bit locations.

In some cases, the received codeword includes a first set of codeword bits and the set of bit locations includes a first set of bit locations. A transmitter at communications manager 1615 may transmit an indication that the decoding of the received codeword was unsuccessful. Information bit location identifier 1635 may receive a second set of codeword bits over the wireless channel in response to transmitting the indication that the decoding of the received codeword was unsuccessful. The second set of codeword bits may be, for example, a subset of a combined codeword including the first set of codeword bits and the second set of codeword bits, where the combined codeword is encoded using a second polar code having a code length longer than the polar code (i.e., the polar code used to encode the first set of codeword bits). Information bit location identifier 1635 may identify a second set of bit locations used for the information bits for encoding of the second set of codeword bits, where, for the encoding of the second set of codeword bits (e.g., encoding of the combined codeword), at least one of the information bits is copied from a bit location of the second set of bit locations to a bit location of the first set of bit locations that is non-overlapping with the second set of bit locations. Information bit location identifier 1635 may then pass information 1655 about the information bit locations of the second set of codeword bits to decoder 1640, and decoder 1640 may decode the combined codeword according to the polar code to obtain the information bit vector at the first set of bit locations and the second set of bit locations.

In other aspects, a receiver may receive a codeword that is encoded using a polar code, and the receiver may pass the received codeword to information bit location identifier 1635. Information bit location identifier 1635 may then identify a set of bit locations of the polar code used for information bits for the encoding, where the set of bit locations is determined based on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term.

In some examples, information bit location identifier 1635 may include an information bit allocation calculator 1637 which may identify an information bit allocation of information bits in the codeword to bit-channel partitions of the polar code based on the BEC and the correction term. For example, information bit allocation calculator 1637 may identify the information bit allocation based on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term. Information bit location identifier 1635 may then identify the set of bit locations of the polar code used for information bits for the encoding based on the information bit allocation.

In some cases, the set of bit locations of the polar code used for information bits for the encoding is identified based on a table that indicates information bit allocations for different numbers of coded bits, different numbers of information bits, different numbers of punctured bits, different types of puncturing, or a combination thereof. In some cases, the information bits assigned to the bit-channel partitions are assigned to bit-channels of the bit-channel partitions in a predetermined order. In some cases, the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof. In some cases, the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

In some cases, the information bits assigned to different bit-channel partitions are assigned to bit-channels of the different bit-channel partitions in a same order. In some cases, the information bits assigned to different bit-channel partitions are assigned to bit-channels of the different bit-channel partitions in a different order. In some cases, the information bits assigned to different bit-channel partitions are assigned to bit-channels of the different bit-channel partitions based on a reliability order of bit-channels in each of the bit-channel partitions. In some cases, the reliability order of the bit-channels in each of the bit-channel partitions is derived from a reliability order of all bit-channels in the bit-channel partitions.

In some cases, the correction term is based on a function of a bit-channel capacity of the at least one stage of polarization and a capacity imbalance factor. In some cases, the correction term includes an offset factor applied to the bit-channel capacity. In some cases, the correction term includes a scaling factor applied to the offset bit-channel capacity. In some cases, the correction term includes an offset applied to the scaled and offset bit-channel capacity. Information bit location identifier 1635 may then pass information 1655 about the information bit locations of the received codeword to the decoder 1640, and decoder 1640 may process the received codeword according to the polar code to obtain an information bit vector at the set of bit locations.

In some cases, the received codeword includes a first set of codeword bits and the set of bit locations includes a first set of bit locations. A transmitter at communications manager 1615 may transmit an indication that the decoding of the received codeword was unsuccessful. Information bit location identifier 1635 may receive a second set of codeword bits over the wireless channel in response to transmitting the indication that the decoding of the received codeword was unsuccessful, the second set of codeword bits being encoded using a second polar code having a code length longer than the polar code, and information bit location identifier 1635 may identify a second set of bit locations used for the information bits for encoding of the second set of codeword bits, where, for the encoding of the second set of codeword bits, at least one of the information bits is copied from a bit location of the second set of bit locations to a bit location of the first set of bit locations that is non-overlapping with the second set of bit locations. Information bit location identifier 1635 may then pass information 1655 about the information bit locations of the second set of codeword bits to decoder 1640, and decoder 1640 may decode a combined codeword including the first set of codeword bits and the second set of codeword bits according to the polar code to obtain the information bit vector at the first set of bit locations and the second set of bit locations, where both of the bit locations are determined by mutual information recursion based information bit allocation.

Figure 17:
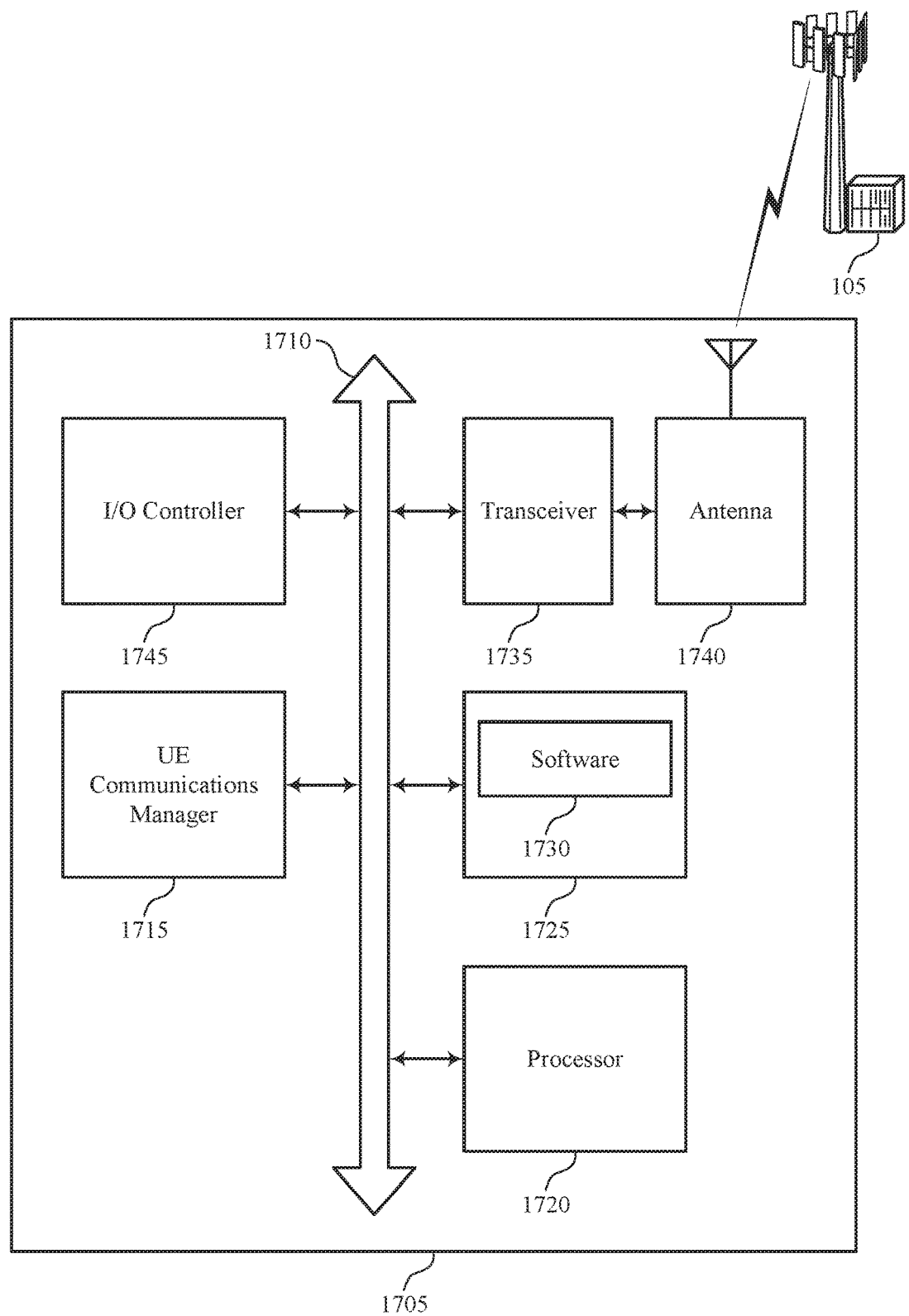
FIG. 17 illustrates a block diagram of a system including a user equipment (UE) that supports mutual-information based recursive polar code construction in accordance with various aspects of the present disclosure.

FIG. 17 shows a diagram of a system 1700 including a device 1705 that supports mutual-information based recursive polar code construction in accordance with aspects of the present disclosure. Device 1705 may be an example of or include the components of wireless device 1205, wireless device 1305, wireless device 1405, or a UE 115 as described above, e.g., with reference to FIGS. 1, 12, 13, and 14. Device 1705 may include components for bi-directional voice and data communications including components for transmitting and receiving communications, including UE communications manager 1715, processor 1720, memory 1725, software 1730, transceiver 1735, antenna 1740, and I/O controller 1745. These components may be in electronic communication via one or more busses (e.g., bus 1710). Device 1705 may communicate wirelessly with one or more base stations 105.

Processor 1720 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting mutual-information based recursive polar code construction).

Memory 1725 may include random access memory (RAM) and read only memory (ROM). The memory 1725 may store computer-readable, computer-executable software 1730 including instructions that, when executed, cause the processor to perform various functions described herein. In some cases, the memory 1725 may contain, among other things, a basic input/output system (BIOS) which may control basic hardware and/or software operation such as the interaction with peripheral components or devices.

Software 1730 may include code to implement aspects of the present disclosure, including code to support mutual-information based recursive polar code construction. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

I/O controller 1745 may manage input and output signals for device 1705. I/O controller 1745 may also manage peripherals not integrated into device 1705. In some cases, I/O controller 1745 may represent a physical connection or port to an external peripheral. In some cases, I/O controller 1745 may utilize an operating system such as iOS®, ANDROID®, MS-DOS®, MS-WINDOWS®, OS/2®, UNIX®, LINUX®, or another known operating system. In other cases, I/O controller 1745 may represent or interact with a modem, a keyboard, a mouse, a touchscreen, or a similar device. In some cases, I/O controller 1745 may be implemented as part of a processor. In some cases, a user may interact with device 1705 via I/O controller 1745 or via hardware components controlled by I/O controller 1745.

Figure 18:
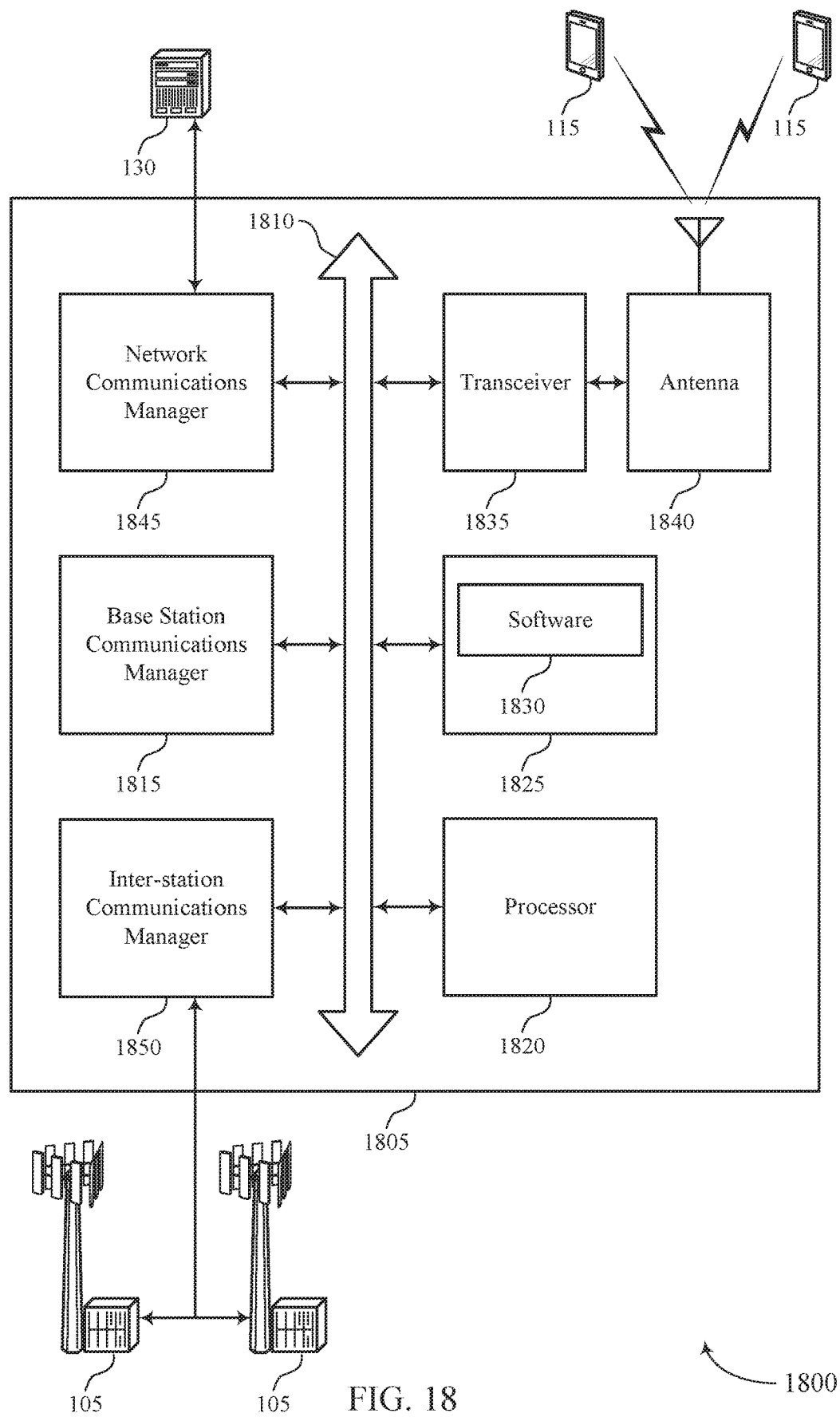
FIG. 18 illustrates a block diagram of a system including a base station that supports mutual-information based recursive polar code construction in accordance with various aspects of the present disclosure.

FIG. 18 shows a diagram of a system 1800 including a device 1805 that supports mutual-information based recursive polar code construction in accordance with aspects of the present disclosure. Device 1805 may be an example of or include the components of wireless device 1205, wireless device 1305, wireless device 1405, or a base station 105 as described above, e.g., with reference to FIGS. 1, 12, 13 and 14. Device 1805 may include components for bi-directional voice and data communications including components for transmitting and receiving communications, including base station communications manager 1815, processor 1820, memory 1825, software 1830, transceiver 1835, antenna 1840, network communications manager 1845, and inter-station communications manager 1850. These components may be in electronic communication via one or more busses (e.g., bus 1810). Device 1805 may communicate wirelessly with one or more UEs 115.

Processor 1820 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1820 may be configured to operate a memory array using a memory controller. In other cases, a memory controller may be integrated into processor 1820. Processor 1820 may be configured to execute computer-readable instructions stored in a memory to perform various functions (e.g., functions or tasks supporting mutual-information based recursive polar code construction).

Memory 1825 may include RAM and ROM. The memory 1825 may store computer-readable, computer-executable software 1830 including instructions that, when executed, cause the processor to perform various functions described herein. In some cases, the memory 1825 may contain, among other things, a BIOS which may control basic hardware and/or software operation such as the interaction with peripheral components or devices.

Software 1830 may include code to implement aspects of the present disclosure, including code to support mutual-information based recursive polar code construction. Software 1830 may be stored in a non-transitory computer-readable medium such as system memory or other memory. In some cases, the software 1830 may not be directly executable by the processor but may cause a computer (e.g., when compiled and executed) to perform functions described herein.

Transceiver 1835 may communicate bi-directionally, via one or more antennas, wired, or wireless links as described above. For example, the transceiver 1835 may represent a wireless transceiver and may communicate bi-directionally with another wireless transceiver. The transceiver 1835 may also include a modem to modulate the packets and provide the modulated packets to the antennas for transmission, and to demodulate packets received from the antennas.

In some cases, the wireless device may include a single antenna 1840. However, in some cases the device may have more than one antenna 1840, which may be capable of concurrently transmitting or receiving multiple wireless transmissions.

Network communications manager 1845 may manage communications with the core network (e.g., via one or more wired backhaul links). For example, the network communications manager 1845 may manage the transfer of data communications for client devices, such as one or more UEs 115.

Inter-station communications manager 1850 may manage communications with other base station 105, and may include a controller or scheduler for controlling communications with UEs 115 in cooperation with other base stations 105. For example, the inter-station communications manager 1850 may coordinate scheduling for transmissions to UEs 115 for various interference mitigation techniques such as beamforming or joint transmission. In some examples, inter-station communications manager 1850 may provide an X2 interface within an Long Term Evolution (LTE)/LTE-A wireless communication network technology to provide communication between base stations 105.

Figure 19:
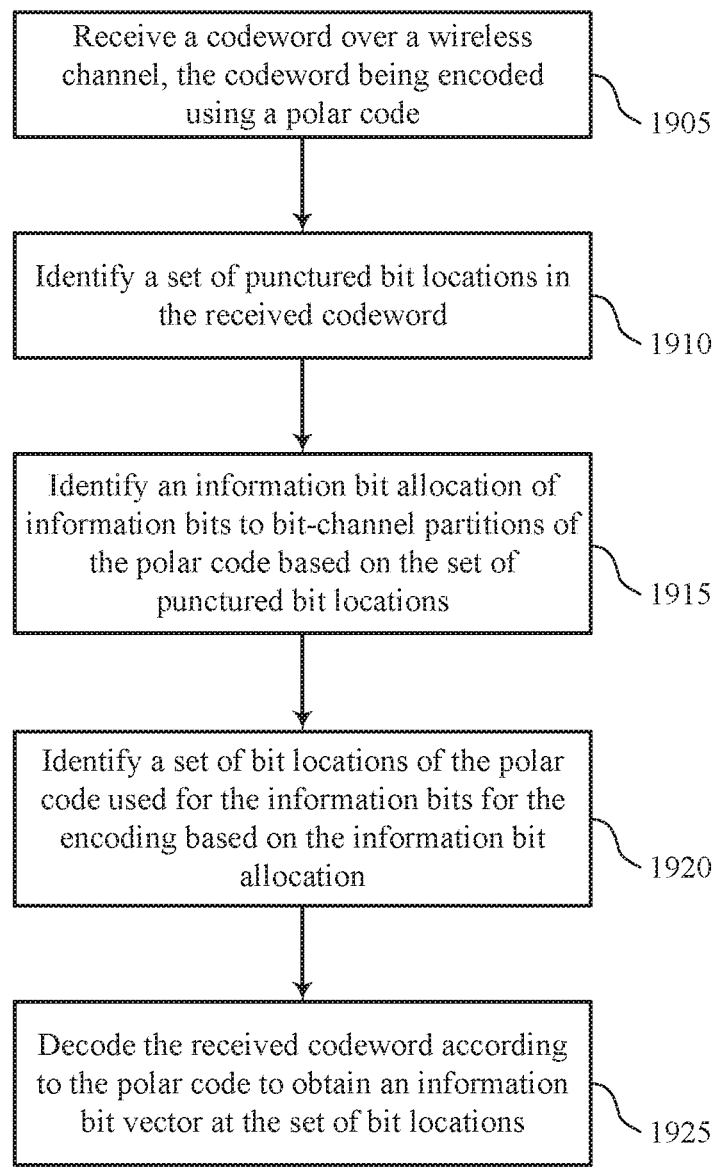
FIGS. 19 through 22 illustrate methods for a mutual-information based recursive polar code construction in accordance with various aspects of the present disclosure.

FIG. 19 shows a flowchart illustrating a method 1900 for mutual-information based recursive polar code construction in accordance with aspects of the present disclosure. The operations of method 1900 may be implemented by a UE 115 or base station 105 or its components as described herein. For example, the operations of method 1900 may be performed by a communications manager as described with reference to FIGS. 12 through 18. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1905 the UE 115 or base station 105 may receive a codeword over a wireless channel, the codeword being encoded using a polar code. The codeword may include information bits and frozen bits mapped to bit-channels of the polar code, where the information bits may be mapped to bit-channels of the polar code associated with the highest reliabilities. The operations of block 1905 may be performed according to the methods described with reference to FIGS. 1 through 11. In certain examples, aspects of the operations of block 1905 may be performed by a receiver as described with reference to FIGS. 12 through 18.

At block 1910 the UE 115 or base station 105 may identify a set of punctured bit locations in the received codeword. In some cases, the UE 115 or base station 105 may identify the set of punctured bit locations based on a number of bits punctured and a type of puncturing used for puncturing during encoding. Based on the set of punctured bit locations, the UE 115 or base station 105 may be able to identify a set of bit locations of the polar code used for information bits (e.g., using the techniques described below). The operations of block 1910 may be performed according to the methods described with reference to FIGS. 1 through 11. In certain examples, aspects of the operations of block 1910 may be performed by a punctured bit location identifier as described with reference to FIGS. 12 through 18.

At block 1915 the UE 115 or base station 105 may identify an information bit allocation of the information bits to bit-channel partitions of the polar code based on the set of punctured bit locations. For example, the information bit allocation may be determined based at least in part on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, where a target mutual information for a first polarization stage is determined as a function of the number of the information bits and a number of un-punctured bit locations in the received codeword. The operations of block 1915 may be performed according to the methods described with reference to FIGS. 1 through 11. In certain examples, aspects of the operations of block 1915 may be performed by an information bit allocation calculator as described with reference to FIGS. 12 through 18.

At block 1920 the UE 115 or base station 105 may identify a set of bit locations of the polar code used for information bits for the encoding based at least in part on the information bit allocation. For example, based on the information bits assigned to each bit-channel partition, the UE 115 or base station 105 may identify the specific bit-channels (i.e., the bit locations) used to transmit the information bits (e.g., using the techniques described with reference to FIGS. 4A-4C). Because the techniques used to identify the set of bit locations used for information bits during encoding may account for puncturing, the reliability of the received transmission of information bits may be increased. As a result, the chances that the UE 115 or base station 105 is able to successfully decode the codeword may be increased. The operations of block 1920 may be performed according to the methods described with reference to FIGS. 1 through 11. In certain examples, aspects of the operations of block 1920 may be performed by an information bit location identifier as described with reference to FIGS. 12 through 18.

At block 1925 the UE 115 or base station 105 may decode the received codeword according to the polar code to obtain an information bit vector at the set of bit locations. In some cases, the UE 115 or base station 105 may also identify a set of bit locations of the polar code used for frozen bits, and the UE 115 or base station 105 may use the frozen bits to, for example, detect errors during decoding. The operations of block 1925 may be performed according to the methods described with reference to FIGS. 1 through 11. In certain examples, aspects of the operations of block 1925 may be performed by a decoder as described with reference to FIGS. 12 through 18.

Figure 20:
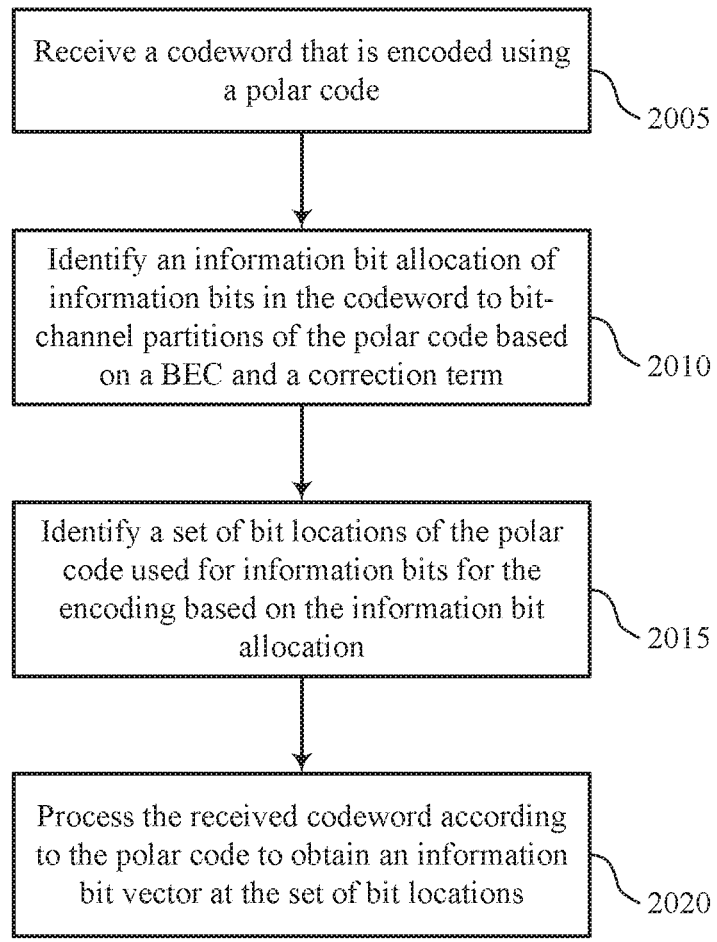

FIG. 20 shows a flowchart illustrating a method 2000 for mutual-information based recursive polar code construction in accordance with aspects of the present disclosure. The operations of method 2000 may be implemented by a UE 115 or base station 105 or its components as described herein. For example, the operations of method 2000 may be performed by a communications manager as described with reference to FIGS. 12 through 18. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2005 the UE 115 or base station 105 may receive a codeword that is encoded using a polar code. The codeword may include information bits and frozen bits mapped to bit-channels of the polar code, where the information bits may be mapped to bit-channels of the polar code associated with the highest reliabilities. The operations of block 2005 may be performed according to the methods described with reference to FIGS. 1 through 11. In certain examples, aspects of the operations of block 2005 may be performed by a receiver as described with reference to FIGS. 12 through 18.

At block 2010 the UE 115 or base station 105 may identify an information bit allocation of information bits in the codeword to bit-channel partitions of the polar code based on a BEC and, additionally and optionally, a correction term. For example, the information bit allocation may be determined based at least in part on a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and where the mutual information transfer function is based on a BEC function and, additionally and optionally, a correction term.

Because the mutual information transfer function may be derived based on a BEC function, the computational complexity associated with deriving the mutual information transfer function may be reduced. In addition, the correction term may, in some cases, improve the reliability of the mutual information transfer function (e.g., by aligning the derived mutual information transfer function with other mutual information transfer functions derived based on an AWGN channel). The operations of block 2010 may be performed according to the methods described with reference to FIGS. 1 through 11. In certain examples, aspects of the operations of block 2010 may be performed by an information bit allocation calculator as described with reference to FIGS. 12 through 18.

At block 2015 the UE 115 or base station 105 may identify a set of bit locations of the polar code used for information bits for the encoding based on the information bit allocation. For example, based on the information bits assigned to each bit-channel partition, the UE 115 or base station 105 may identify the specific bit-channels (i.e., the bit locations) used to transmit the information bits (e.g., using the techniques described with reference to FIGS. 4A-4C). The operations of block 2015 may be performed according to the methods described with reference to FIGS. 1 through 11. In certain examples, aspects of the operations of block 2015 may be performed by an information bit location identifier as described with reference to FIGS. 12 through 18.

At block 2020 the UE 115 or base station 105 may process the received codeword according to the polar code to obtain an information bit vector at the set of bit locations. In some cases, the UE 115 or base station 105 may also identify a set of bit locations of the polar code used for frozen bits, and the UE 115 or base station 105 may use the frozen bits to, for example, detect errors during decoding. The operations of block 2020 may be performed according to the methods described with reference to FIGS. 1 through 11. In certain examples, aspects of the operations of block 2020 may be performed by a decoder as described with reference to FIGS. 12 through 18.

Figure 21:
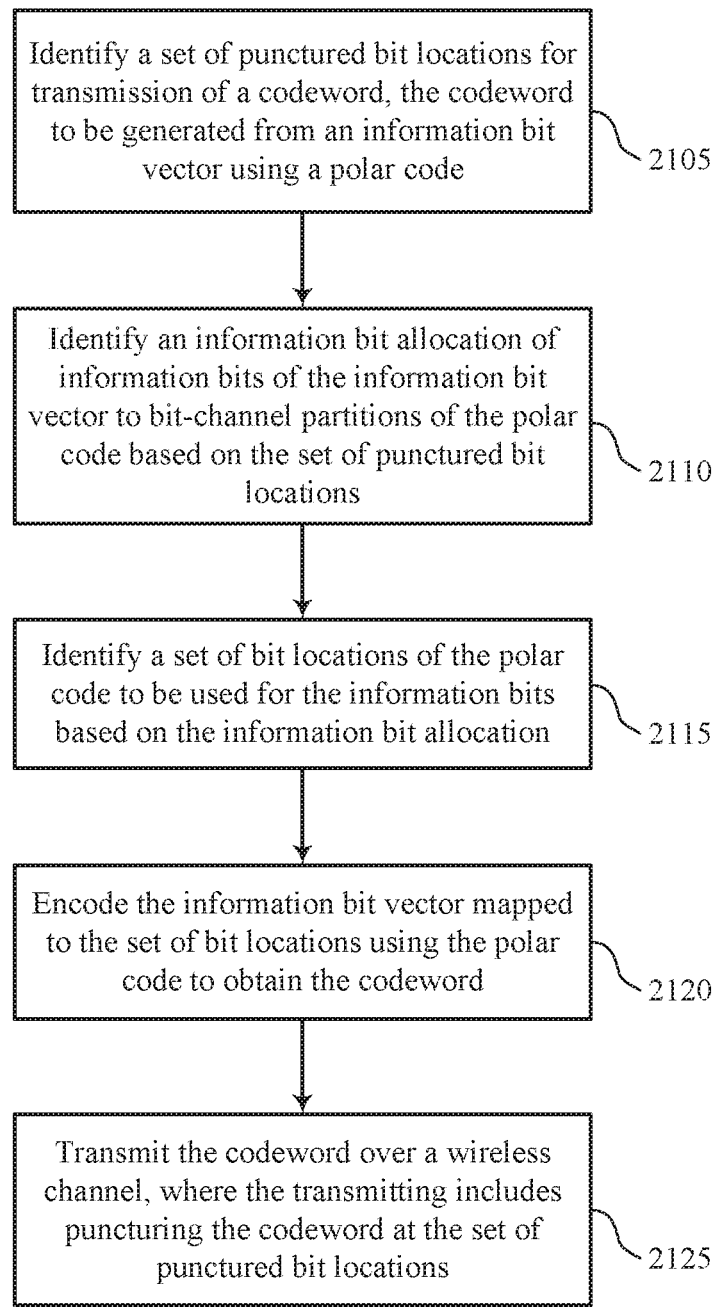

FIG. 21 shows a flowchart illustrating a method 2100 for mutual-information based recursive polar code construction in accordance with aspects of the present disclosure. The operations of method 2100 may be implemented by a UE 115 or base station 105 or its components as described herein. For example, the operations of method 2100 may be performed by a communications manager as described with reference to FIGS. 12 through 18. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2105 the UE 115 or base station 105 may identify a set of punctured bit locations for transmission of a codeword, the codeword to be generated from an information bit vector using a polar code. In some cases, the UE 115 or base station 105 may identify the set of punctured bit locations based on a number of bits punctured and a type of puncturing used for puncturing. Based on the set of punctured bit locations, the UE 115 or base station 105 may be able to identify a set of bit locations of the polar code to be used for information bits of the information bit vector (e.g., using the techniques described below at block 2110). The operations of block 2105 may be performed according to the methods described with reference to FIGS. 1 through 11. In certain examples, aspects of the operations of block 2105 may be performed by a punctured bit location identifier as described with reference to FIGS. 12 through 18.

At block 2110 the UE 115 or base station 105 may identify an information bit allocation of information bits of the information bit vector to bit-channel partitions of the polar code based on the set of punctured bit locations. For example, the information bit allocation may be determined based at least in part on a recursive partitioning of bit-channels of the polar code for at least one stage of polarization and assigning portions of a number of information bits of the at least one stage of polarization to bit-channel partitions based on a mutual information transfer function of respective aggregate capacities of the bit-channel partitions, and where a target mutual information for a first polarization stage is determined as a function of the number of the information bits and a number of un-punctured bit locations in the received codeword. The operations of block 2110 may be performed according to the methods described with reference to FIGS. 1 through 11. In certain examples, aspects of the operations of block 2110 may be performed by an information bit allocation calculator as described with reference to FIGS. 12 through 18.

At block 2115 the UE 115 or base station 105 may identify a set of bit locations of the polar code to be used for the information bits based at least in part on the information bit allocation. For example, based on the information bits assigned to each bit-channel partition, the UE 115 or base station 105 may identify the specific bit-channels (i.e., the bit locations) to be used to transmit the information bits (e.g., using the techniques described with reference to FIGS. 4A-4C). The operations of block 2115 may be performed according to the methods described with reference to FIGS. 1 through 11. In certain examples, aspects of the operations of block 2115 may be performed by an information bit location identifier as described with reference to FIGS. 12 through 18.

At block 2120 the UE 115 or base station 105 may encode the information bit vector mapped to the set of bit locations using the polar code to obtain the codeword. In some cases, the codeword may also include frozen bits mapped to bit-channels of the polar code. The frozen bits may be included in the codeword to allow a receiving device to detect errors during decoding of the codeword. The operations of block 2120 may be performed according to the methods described with reference to FIGS. 1 through 11. In certain examples, aspects of the operations of block 2120 may be performed by a encoder as described with reference to FIGS. 12 through 18.

At block 2125 the UE 115 or base station 105 may transmit the codeword over a wireless channel, where the transmitting includes puncturing the codeword at the set of punctured bit locations. Because the techniques used to identify the set of bit locations used for information bits of the information bit vector may account for puncturing, the reliability of the transmission of the information bits may be increased. As a result, the chances that a receiving UE 115 or base station 105 is able to successfully decode the codeword may be increased. The operations of block 2125 may be performed according to the methods described with reference to FIGS. 1 through 11. In certain examples, aspects of the operations of block 2125 may be performed by a transmitter as described with reference to FIGS. 12 through 18.

Figure 22:
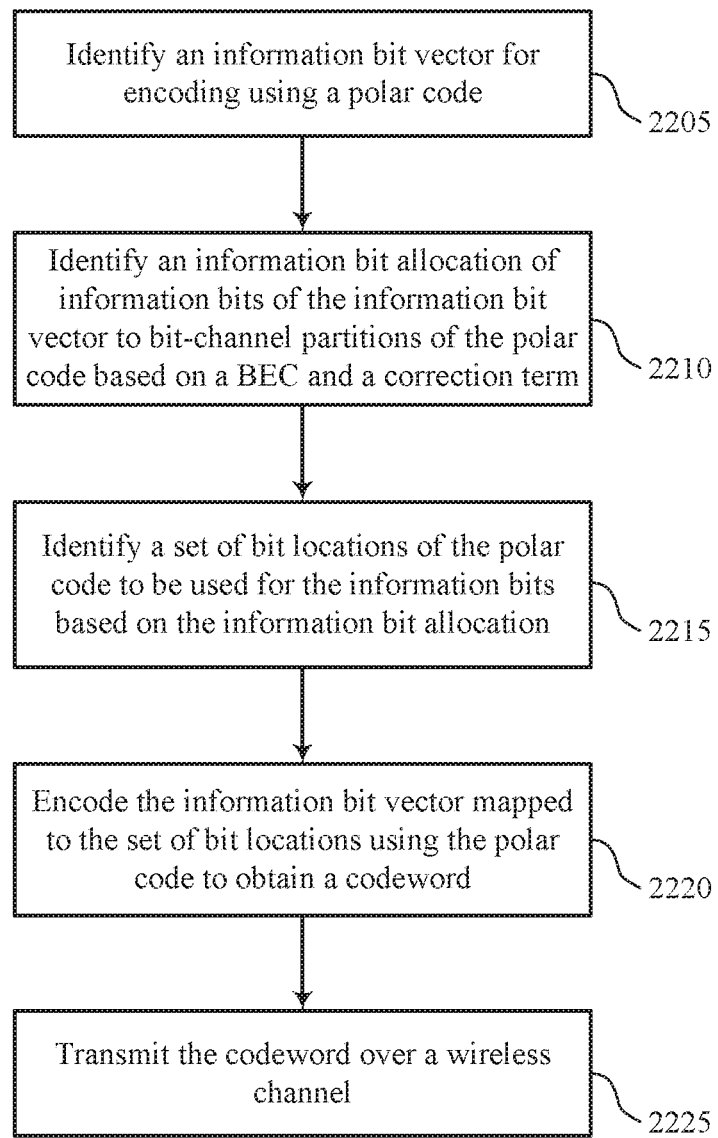

FIG. 22 shows a flowchart illustrating a method 2200 for mutual-information based recursive polar code construction in accordance with aspects of the present disclosure. The operations of method 2200 may be implemented by a UE 115 or base station 105 or its components as described herein. For example, the operations of method 2200 may be performed by a communications manager as described with reference to FIGS. 12 through 18. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2205 the UE 115 or base station 105 may identify an information bit vector for encoding using a polar code. Using the techniques described herein, the UE 115 or base station 105 may map the information bits of the information bit vector to the bit-channels of the polar code associated with the highest reliabilities to increase the reliability of a transmission of the information bit vector. The operations of block 2205 may be performed according to the methods described with reference to FIGS. 1 through 11. In certain examples, aspects of the operations of block 2205 may be performed by an information bit vector identifier as described with reference to FIGS. 12 through 18.

At block 2210 the UE 115 or base station 105 may identify an information bit allocation of information bits of the information bit vector to bit-channel partitions of the polar code based on a BEC and a correction term. For example, the information bit allocation may be determined based at least in part on a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and where the mutual information transfer function is based on a BEC function and, additionally and optionally, a correction term.

Because the mutual information transfer function may be derived based on a BEC function, the computational complexity associated with deriving the mutual information transfer function may be reduced. In addition, the correction term may, in some cases, improve the reliability of the mutual information transfer function (e.g., by aligning the derived mutual information transfer function with other mutual information transfer functions derived based on an AWGN channel). The operations of block 2210 may be performed according to the methods described with reference to FIGS. 1 through 11. In certain examples, aspects of the operations of block 2210 may be performed by an information bit allocation calculator as described with reference to FIGS. 12 through 18.

At block 2215 the UE 115 or base station 105 may identify a set of bit locations of the polar code to be used for the information bits based at least in part on the information bit allocation. For example, based on the information bits assigned to each bit-channel partition, the UE 115 or base station 105 may identify the specific bit-channels (i.e., the bit locations) to be used to transmit the information bits (e.g., using the techniques described with reference to FIGS. 4A-4C). The operations of block 2215 may be performed according to the methods described with reference to FIGS.

1 through 11. In certain examples, aspects of the operations of block 2215 may be performed by an information bit location identifier as described with reference to FIGS. 12 through 18.

At block 2220 the UE 115 or base station 105 may encode the information bit vector mapped to the set of bit locations using the polar code to obtain a codeword. In some cases, the codeword may also include frozen bits mapped to bit-channels of the polar code. The frozen bits may be included in the codeword to allow a receiving device to detect errors during decoding of the codeword. The operations of block 2220 may be performed according to the methods described with reference to FIGS. 1 through 11. In certain examples, aspects of the operations of block 2220 may be performed by a encoder as described with reference to FIGS. 12 through 18.

At block 2225 the UE 115 or base station 105 may transmit the codeword over a wireless channel. Because the information bits of the codeword may be mapped to bit-channels of the polar code associated with the highest reliabilities, the reliability of the transmission of the information bits may be increased. As a result, the chances that a receiving UE 115 or base station 105 is able to successfully decode the codeword may be increased. The operations of block 2225 may be performed according to the methods described with reference to FIGS. 1 through 11. In certain examples, aspects of the operations of block 2225 may be performed by a transmitter as described with reference to FIGS. 12 through 18.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of evolved node B (eNBs) provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
receiving a codeword over a wireless channel, the codeword being encoded using a polar code;
identifying a set of punctured bit locations in the received codeword;
identifying a set of bit locations of the polar code used for information bits for the encoding, wherein the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and wherein a target mutual information for a first polarization stage is determined as a function of the number of the information bits and a number of un-punctured bit locations in the received codeword; and decoding the received codeword according to the polar code to obtain an information bit vector at the set of bit locations.

2. The method of claim 1, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

3. The method of claim 1, wherein the information bits assigned to the bit-channel partitions are assigned to bit-channels of the bit-channel partitions in a predetermined order.

4. The method of claim 3, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

5. The method of claim 3, wherein the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

6. The method of claim 3, wherein the information bits assigned to different bit-channel partitions are assigned to bit-channels of the different bit-channel partitions in a same order.

7. The method of claim 3, wherein the information bits assigned to different bit-channel partitions are assigned to bit-channels of the different bit-channel partitions in a different order.

8. The method of claim 7, wherein the information bits assigned to different bit-channel partitions are assigned to bit-channels of the different bit-channel partitions based on a reliability order of bit-channels in each of the bit-channel partitions.

9. The method of claim 8, wherein the reliability order of the bit-channels in each of the bit-channel partitions is derived from a reliability order of all bit-channels in the bit-channel partitions.

10. The method of claim 1, wherein the target mutual information is determined as the number of the information bits divided by the number of un-punctured bit locations in the received codeword.

11. The method of claim 10, wherein the set of punctured bit locations corresponds to non-shortening based puncturing of the received codeword.

12. The method of claim 11, wherein, for the first polarization stage, a capacity of each corresponding bit-channel of the set of punctured bit locations is set to zero.

13. The method of claim 11, wherein the non-shortening based puncturing comprises block puncturing.

14. The method of claim 1, wherein, for the at least one stage of polarization, a capacity of each bit-channel of each of the bit-channel partitions is determined based on bit-channel capacities of input bit-channels from the previous stage of polarization and the mutual information transfer function.

15. The method of claim 1, wherein the set of punctured bit locations corresponds to shortening-based puncturing of the received codeword, and wherein a number of the punctured bit locations is added to the number of the information bits for assigning to the bit-channel partitions for a first recursive partitioning.

16. The method of claim 15, wherein, for the first polarization stage, a capacity of each corresponding bit-channel of the set of punctured bit locations is set to unity.

17. The method of claim 15, wherein the identifying the set of bit locations comprises shortening a preliminary set of bit locations determined as a result of the recursive partitioning of the bit-channels by the number of the punctured bit locations.

18. The method of claim 1, wherein the mutual information transfer function is based on a binary erasure channel (BEC) function and a correction term.

19. The method of claim 1, wherein the received codeword comprises a first set of codeword bits and the set of bit locations comprises a first set of bit locations, the method further comprising:

transmitting an indication that the decoding of the received codeword was unsuccessful;

receiving a second set of codeword bits over the wireless channel in response to transmitting the indication that the decoding of the received codeword was unsuccessful, the second set of codeword bits being encoded using a second polar code having a code length longer than the polar code;

identifying a second set of bit locations used for the information bits for encoding of the second set of codeword bits, wherein, for the encoding of the second set of codeword bits, at least one of the information bits is copied from a bit location of the second set of bit locations to a bit location of the first set of bit locations that is non-overlapping with the second set of bit locations; and decoding a combined codeword comprising the first set of codeword bits and the second set of codeword bits according to the second polar code to obtain the information bit vector at the first set of bit locations and the second set of bit locations.

20. A method for wireless communication, comprising:
receiving a codeword that is encoded using a polar code;
identifying a set of bit locations of the polar code used for information bits for the encoding, wherein the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and wherein the mutual information transfer function is based on a binary erasure channel (BEC) function and a correction term; and processing the received codeword according to the polar code to obtain an information bit vector at the set of bit locations.

21. The method of claim 20, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

22. The method of claim 20, wherein the information bits assigned to the bit-channel partitions are assigned to bit-channels of the bit-channel partitions in a predetermined order.

23. The method of claim 22, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

24. The method of claim 22, wherein the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

25. The method of claim 22, wherein the information bits assigned to different bit-channel partitions are assigned to bit-channels of the different bit-channel partitions in a same order.

26. The method of claim 22, wherein the information bits assigned to different bit-channel partitions are assigned to bit-channels of the different bit-channel partitions in a different order.

27. The method of claim 26, wherein the information bits assigned to different bit-channel partitions are assigned to bit-channels of the different bit-channel partitions based on a reliability order of bit-channels in each of the bit-channel partitions.

28. The method of claim 27, wherein the reliability order of the bit-channels in each of the bit-channel partitions is derived from a reliability order of all bit-channels in the bit-channel partitions.

29. The method of claim 20, wherein the correction term is based on a function of a bit-channel capacity of the at least one stage of polarization and a capacity imbalance factor.

30. The method of claim 29, wherein the correction term comprises an offset factor applied to the bit-channel capacity.

31. The method of claim 30, wherein the correction term comprises a scaling factor applied to the offset bit-channel capacity.

32. The method of claim 31, wherein the correction term comprises an offset applied to the scaled and offset bit-channel capacity.

33. The method of claim 20, wherein the received codeword comprises a first set of codeword bits and the set of bit locations comprises a first set of bit locations, the method further comprising:
   transmitting an indication that the decoding of the received codeword was unsuccessful;
   receiving a second set of codeword bits over the wireless channel in response to transmitting the indication that the decoding of the received codeword was unsuccessful, the second set of codeword bits being encoded using a second polar code having a code length longer than the polar code;
   identifying a second set of bit locations used for the information bits for encoding of the second set of codeword bits, wherein, for the encoding of the second set of codeword bits, at least one of the information bits is copied from a bit location of the second set of bit locations to a bit location of the first set of bit locations that is non-overlapping with the second set of bit locations; and
   decoding a combined codeword comprising the first set of codeword bits and the second set of codeword bits according to the second polar code to obtain the information bit vector at the first set of bit locations and the second set of bit locations.

34. An apparatus for wireless communication, comprising:
   means for receiving a codeword over a wireless channel, the codeword being encoded using a polar code;
   means for identifying a set of punctured bit locations in the received codeword;
   means for identifying a set of bit locations of the polar code used for information bits for the encoding, wherein the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and wherein a target mutual information for a first polarization stage is determined as a function of the number of the information bits and a number of un-punctured bit locations in the received codeword; and
   means for decoding the received codeword according to the polar code to obtain an information bit vector at the set of bit locations.

35. The apparatus of claim 34, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

36. The apparatus of claim 34, wherein the information bits assigned to the bit-channel partitions are assigned to bit-channels of the bit-channel partitions in a predetermined order.

37. The apparatus of claim 36, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

38. An apparatus for wireless communication, comprising:
   means for receiving a codeword that is encoded using a polar code; means for identifying a set of bit locations of the polar code used for information bits for the encoding, wherein the set of bit locations is determined based at least in part on an information bit allocation determined by a recursive partitioning of bit-channels of the polar code for at least one stage of polarization and an assignment of portions of a number of the information bits of the at least one stage of polarization to bit-channel partitions based on a mutual information transfer function of respective aggregate capacities of the bit-channel partitions, and wherein the mutual information transfer function is based on a binary erasure channel (BEC) function and a correction term; and
   means for processing the received codeword according to the polar code to obtain an information bit vector at the set of bit locations.

39. A method for wireless communication, comprising:
  identifying a set of punctured bit locations for transmission of a codeword, the codeword to be generated from an information bit vector using a polar code;
  identifying a set of bit locations of the polar code to be used for information bits of the information bit vector, wherein the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and wherein a target mutual information for a first polarization stage is determined as a function of the number of the information bits and a number of un-punctured bit locations in the codeword;
  encoding the information bit vector mapped to the set of bit locations using the polar code to obtain the codeword; and
  transmitting the codeword over a wireless channel, wherein the transmitting comprises puncturing the codeword at the set of punctured bit locations.

40. The method of claim 39, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

41. The method of claim 39, wherein the information bits assigned to the bit-channel partitions are assigned to bit-channels of the bit-channel partitions in a predetermined order.

42. The method of claim 41, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

43. The method of claim 41, wherein the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

44. The method of claim 41, wherein the information bits assigned to different bit-channel partitions are assigned to bit-channels of the different bit-channel partitions in a same order.

45. The method of claim 41, wherein the information bits assigned to different bit-channel partitions are assigned to bit-channels of the different bit-channel partitions in a different order.

46. The method of claim 45, wherein the information bits assigned to different bit-channel partitions are assigned to bit-channels of the different bit-channel partitions based on a reliability order of bit-channels in each of the bit-channel partitions.

47. The method of claim 46, wherein the reliability order of the bit-channels in each of the bit-channel partitions is derived from a reliability order of all bit-channels in the bit-channel partitions.

48. The method of claim 39, wherein the target mutual information is determined as the number of the information bits divided by the number of un-punctured bit locations in the received codeword.

49. The method of claim 48, wherein the set of punctured bit locations corresponds to non-shortening based puncturing of the received codeword.

50. The method of claim 49, wherein the non-shortening based puncturing comprises block puncturing.

51. The method of claim 48, wherein, for the first polarization stage, a capacity of each corresponding bit-channel of the set of punctured bit locations is set to zero.

52. The method of claim 39, wherein, for the at least one stage of polarization, a capacity of each bit-channel of each of the bit-channel partitions is determined based on bit-channel capacities of input bit-channels from the previous stage of polarization and the mutual information transfer function.

53. The method of claim 39, wherein the set of punctured bit locations corresponds to shortening-based puncturing of the received codeword, and wherein a number of the punctured bit locations is added to the number of information bits for assigning to the bit-channel partitions for a first recursive partitioning.

54. The method of claim 53, wherein, for the first polarization stage, a capacity of each corresponding bit-channel of the set of punctured bit locations is set to unity.

55. The method of claim 53, wherein the identifying the set of bit locations comprises shortening a preliminary set of bit locations determined as a result of the recursive partitioning of the bit-channels by the number of the punctured bit locations.

56. The method of claim 39, wherein the mutual information transfer function is based on a binary erasure channel (BEC) function and a correction term.

57. The method of claim 39, wherein the codeword comprises a first set of codeword bits and the set of bit locations comprises a first set of bit locations, the method further comprising:
  receiving an indication that decoding of the codeword was unsuccessful;
  identifying a second set of bit locations to be used for the information bits for encoding of a second set of codeword bits, wherein, for the encoding of the second set of codeword bits, at least one of the information bits is copied from a bit location of the second set of bit locations to a bit location of the first set of bit locations that is non-overlapping with the second set of bit locations; and
  transmitting the second set of codeword bits over the wireless channel in response to receiving the indication that the decoding of the codeword was unsuccessful.

58. A method for wireless communication, comprising:
  identifying an information bit vector for encoding using a polar code;
  identifying a set of bit locations of the polar code to be used for information bits of the information bit vector, wherein the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and wherein the mutual information transfer function is based on a binary erasure channel (BEC) function and a correction term;

encoding the information bit vector mapped to the set of bit locations using the polar code to obtain a codeword; and transmitting the codeword over a wireless channel.

59. The method of claim 58, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

60. The method of claim 58, wherein the information bits assigned to the bit-channel partitions are assigned to bit-channels of the bit-channel partitions in a predetermined order.

61. The method of claim 60, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

62. The method of claim 60, wherein the information bits assigned to the bit-channel partitions are assigned to the bit-channels of the bit-channel partitions in the predetermined order based on a table indicating the predetermined order for different numbers of coded bits, different numbers of information bits, different types of puncturing, or a combination thereof.

63. The method of claim 60, wherein the information bits assigned to different bit-channel partitions are assigned to bit-channels of the different bit-channel partitions in a same order.

64. The method of claim 60, wherein the information bits assigned to different bit-channel partitions are assigned to bit-channels of the different bit-channel partitions in a different order.

65. The method of claim 64, wherein the information bits assigned to different bit-channel partitions are assigned to bit-channels of the different bit-channel partitions based on a reliability order of bit-channels in each of the bit-channel partitions.

66. The method of claim 65, wherein the reliability order of the bit-channels in each of the bit-channel partitions is derived from a reliability order of all bit-channels in the bit-channel partitions.

67. The method of claim 58, wherein the correction term is based on a function of a bit-channel capacity of the at least one stage of polarization and a capacity imbalance factor.

68. The method of claim 67, wherein the correction term comprises an offset factor applied to the bit-channel capacity.

69. The method of claim 68, wherein the correction term comprises a scaling factor applied to the offset bit-channel capacity.

70. The method of claim 69, wherein the correction term comprises an offset applied to the scaled and offset bit-channel capacity.

71. The method of claim 58, wherein the codeword comprises a first set of codeword bits and the set of bit locations comprises a first set of bit locations, the method further comprising:

receiving an indication that decoding of the codeword was unsuccessful;

identifying a second set of bit locations to be used for the information bits for encoding of a second set of codeword bits, wherein, for the encoding of the second set of codeword bits, at least one of the information bits is copied from a bit location of the second set of bit locations to a bit location of the first set of bit locations that is non-overlapping with the second set of bit locations; and transmitting the second set of codeword bits over the wireless channel in response to receiving the indication that the decoding of the codeword was unsuccessful.

72. An apparatus for wireless communication, comprising:

means for identifying a set of punctured bit locations for transmission of a codeword, the codeword to be generated from an information bit vector using a polar code;

means for identifying a set of bit locations of the polar code to be used for information bits of the information bit vector, wherein the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and wherein a target mutual information for a first polarization stage is determined as a function of the number of the information bits and a number of un-punctured bit locations in the codeword;

means for encoding the information bit vector mapped to the set of bit locations using the polar code to obtain the codeword; and means for transmitting the codeword over a wireless channel, wherein the transmitting comprises puncturing the codeword at the set of punctured bit locations.

73. The apparatus of claim 72, wherein the set of bit locations of the polar code used for information bits for the encoding is identified based on a table that indicates information bit allocations for different numbers of coded bits, different numbers of information bits, different numbers of punctured bits, different types of puncturing, or a combination thereof.

74. The apparatus of claim 72, wherein the information bits assigned to the bit-channel partitions are assigned to bit-channels of the bit-channel partitions in a predetermined order.

75. The apparatus of claim 74, wherein the information bits assigned to the bit-channel partitions are assigned to the bit-channels of the bit-channel partitions based on a function of a number of coded bits generated using the polar code, the number of the information bits, a type of puncturing used to puncture the codeword, or a combination thereof.

76. An apparatus for wireless communication, comprising:

means for identifying an information bit vector for encoding using a polar code;

means for identifying a set of bit locations of the polar code to be used for information bits of the information bit vector, wherein the set of bit locations is determined based at least in part on an information bit allocation determined by a recursive partitioning of bit-channels of the polar code for at least one stage of polarization and an assignment of portions of a number of information bits of the at least one stage of polarization to bit-channel partitions based on a mutual information transfer function of respective aggregate capacities of the bit-channel partitions, and wherein the mutual information transfer function is based on a binary erasure channel (BEC) function and a correction term;
means for encoding the information bit vector mapped to the set of bit locations using the polar code to obtain a codeword; and
means for transmitting the codeword over a wireless channel.

\* \* \* \* \*